US012675222B2

(12) United States Patent
Yu et al.

(10) Patent No.: US 12,675,222 B2
(45) Date of Patent: Jul. 7, 2026

(54) MEMORY SYSTEM CAPABLE OF PATROL READ

(71) Applicant: Kioxia Corporation, Tokyo (JP)

(72) Inventors: Dongxiao Yu, Adachi Tokyo (JP); Masahiro Kiyooka, Yokohama Kanagawa (JP); Suguru Nishikawa, Kita Tokyo (JP); Yoshihisa Kojima, Kawasaki Kanagawa (JP)

(73) Assignee: Kioxia Corporation, Tokyo (JP)

( * ) Notice: Subject to any disclaimer, the term of this patent is extended or adjusted under 35 U.S.C. 154(b) by 150 days.

(21) Appl. No.: 18/177,685

(22) Filed: Mar. 2, 2023

(65) Prior Publication Data

US 2024/0096423 A1 Mar. 21, 2024

(30) Foreign Application Priority Data

Sep. 20, 2022 (JP) ................................. 2022-149189

(51) Int. Cl.
| | |
|---|---|
| *G06F 3/06* | (2006.01) |
| *G11C 11/56* | (2006.01) |
| *G11C 16/08* | (2006.01) |
| *G11C 16/26* | (2006.01) |
| *G11C 16/34* | (2006.01) |
| *G11C 29/52* | (2006.01) |

(52) U.S. Cl.
CPC ........ *G06F 3/0619* (2013.01); *G11C 11/5642* (2013.01); *G11C 16/08* (2013.01); *G11C 16/26* (2013.01); *G11C 16/3418* (2013.01); *G11C 16/3459* (2013.01); *G11C 29/52* (2013.01)

(58) Field of Classification Search
CPC ... G06F 3/0619; G11C 11/5642; G11C 16/08; G11C 16/26; G11C 16/3418; G11C 16/3459; G11C 29/52
See application file for complete search history.

(56) References Cited

U.S. PATENT DOCUMENTS

| | | | |
|---|---|---|---|
| 9,250,997 B2 | 2/2016 | Kim et al. | |
| 10,325,664 B2* | 6/2019 | Tokutomi | ........... G11C 16/3427 |
| 10,381,090 B2* | 8/2019 | Oh | .................... G11C 29/50004 |
| 10,649,844 B2* | 5/2020 | Ide | ......................... G11C 29/52 |
| 10,665,305 B2 | 5/2020 | Yao et al. | |
| 2018/0276073 A1 | 9/2018 | Ide et al. | |
| 2020/0243148 A1 | 7/2020 | Kannan et al. | |
| 2021/0026728 A1 | 1/2021 | Kim et al. | |

\* cited by examiner

*Primary Examiner* — Vanthu T Nguyen

(74) *Attorney, Agent, or Firm* — Kim & Stewart LLP

(57) ABSTRACT

A memory system includes a semiconductor memory that includes a cell unit having a plurality of memory cells, and a control circuit for controlling the plurality of memory cells, and a memory controller configured to control the semiconductor memory. The control circuit is configured to execute a data read operation on the cell unit by using one or more read voltages, acquire first data by the data read operation, generate second data with a data size smaller than the first data, based on the first data, and transmit the second data to the memory controller. The memory controller is configured to determine, based on the second data, whether or not to rewrite the page data written in the cell unit.

21 Claims, 35 Drawing Sheets

| BIT | DATA | | | | | | | |
|---|---|---|---|---|---|---|---|---|
| UPPER | 1 | 1 | 1 | 0 | 0 | 0 | 0 | 1 |
| MIDDLE | 1 | 1 | 0 | 0 | 1 | 1 | 0 | 0 |
| LOWER | 1 | 0 | 0 | 0 | 0 | 1 | 1 | 1 |

NUMBER OF MEMORY CELLS

"Er"  "A"  "B"  "C"  "D"  "E"  "F"  "G"

THRESHOLD VOLTAGE Vth

AV   BV   CV   DV   EV   FV   GV   VREAD

CR                          GR        READ UPPER PAGE

BR        DR        FR        READ MIDDLE PAGE

AR                  ER        READ LOWER PAGE

FIG. 7

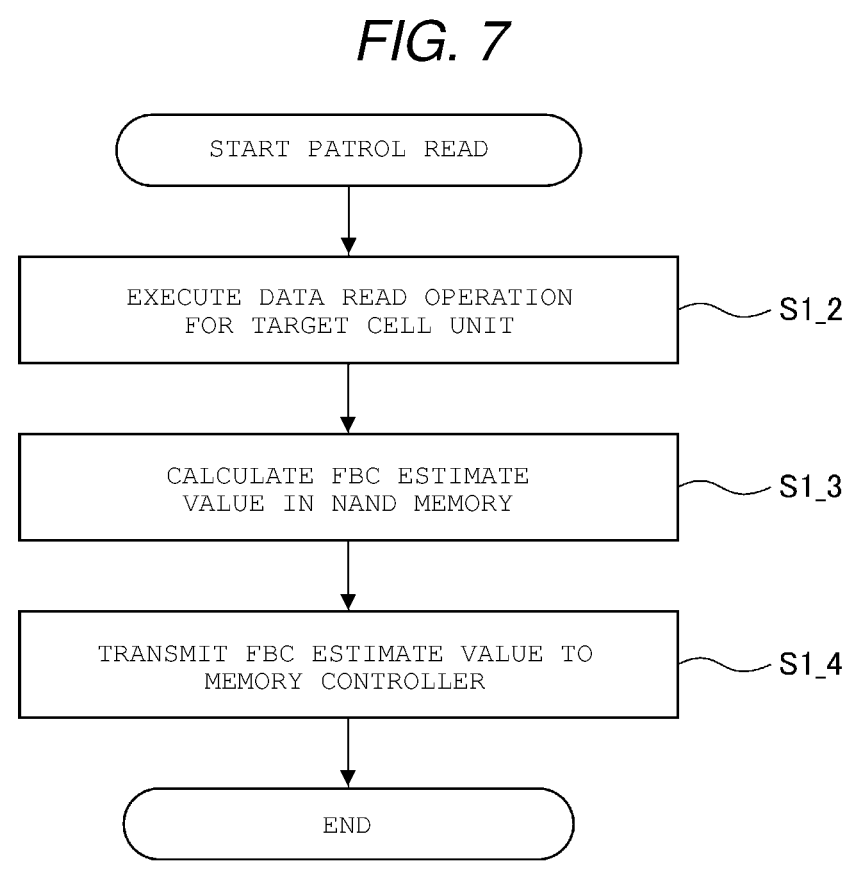

START PATROL READ

↓

EXECUTE DATA READ OPERATION
FOR TARGET CELL UNIT          S1_2

↓

CALCULATE FBC ESTIMATE
VALUE IN NAND MEMORY          S1_3

↓

TRANSMIT FBC ESTIMATE VALUE TO
MEMORY CONTROLLER             S1_4

↓

END

NUMBER OF MEMORY CELLS

Er

A

R1    R2    R3     THRESHOLD VOLTAGE
Vth

*FIG. 11B*

NUMBER OF ON-CELLS

O1    O2    O3

R1    R2    R3     THRESHOLD VOLTAGE
Vth

*FIG. 11C*

NUMBER OF MEMORY CELLS

P1    P2

Er

A

J

R1    R2    R3     THRESHOLD VOLTAGE
Vth $$\frac{R1+R2}{2} \qquad \frac{R2+R3}{2}$$

Figure 17:
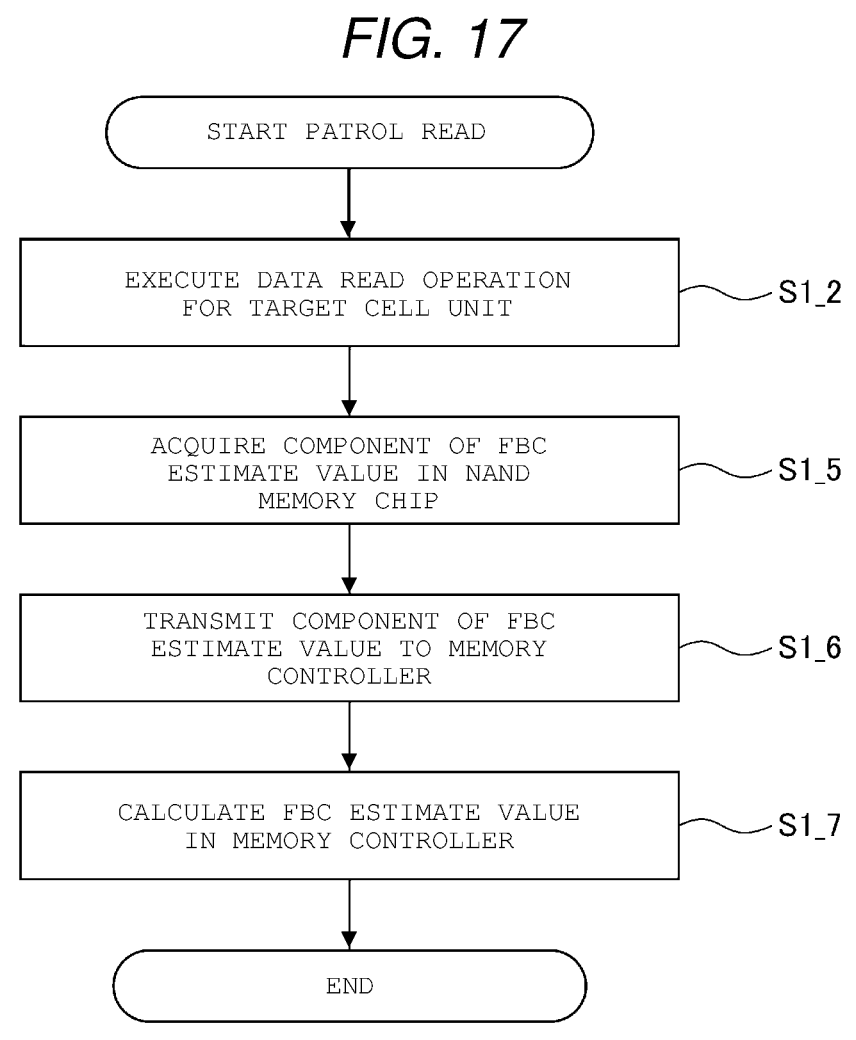

```
                    ┌─────────────────────────┐
                    │    START PATROL READ     │
                    └─────────────────────────┘
                                 │
                                 ▼
        ┌──────────────────────────────────────────┐
        │   EXECUTE DATA READ OPERATION            │────── S1_2
        │   FOR TARGET CELL UNIT                   │
        └──────────────────────────────────────────┘
                                 │
                                 ▼
        ┌──────────────────────────────────────────┐
        │   ACQUIRE COMPONENT OF FBC               │────── S1_5
        │   ESTIMATE VALUE IN NAND                 │
        │   MEMORY CHIP                            │
        └──────────────────────────────────────────┘
                                 │
                                 ▼
        ┌──────────────────────────────────────────┐
        │   TRANSMIT COMPONENT OF FBC              │────── S1_6
        │   ESTIMATE VALUE TO MEMORY              │
        │   CONTROLLER                            │
        └──────────────────────────────────────────┘
                                 │
                                 ▼
        ┌──────────────────────────────────────────┐
        │   CALCULATE FBC ESTIMATE VALUE          │────── S1_7
        │   IN MEMORY CONTROLLER                  │
        └──────────────────────────────────────────┘
                                 │
                                 ▼
                    ┌─────────────────────────┐
                    │           END           │
                    └─────────────────────────┘
```

FIG. 19

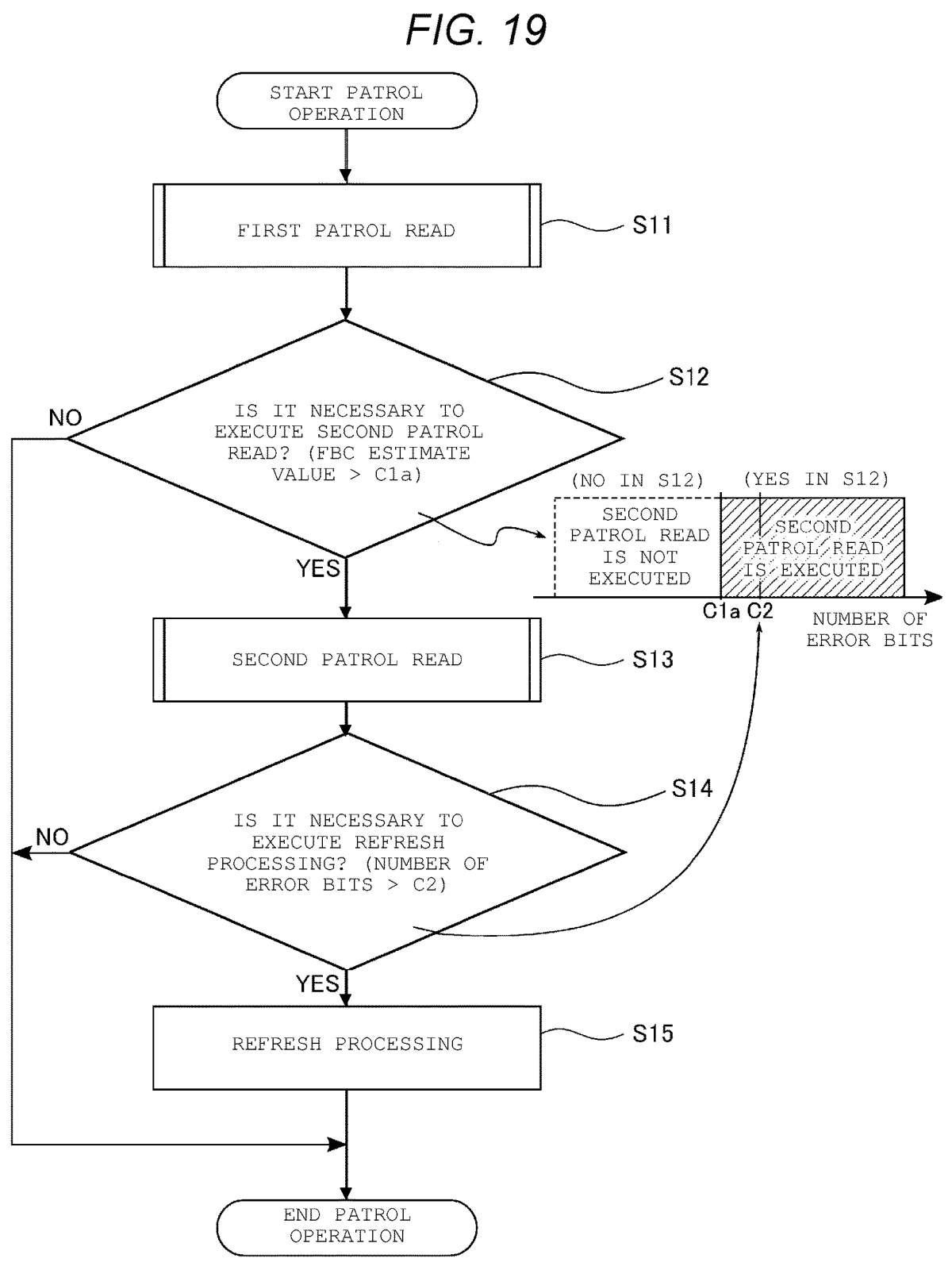

START PATROL
OPERATION

FIRST PATROL READ — S11

IS IT NECESSARY TO
EXECUTE SECOND PATROL
READ? (FBC ESTIMATE
VALUE > C1a) — S12

NO

YES (NO IN S12)    (YES IN S12)

SECOND
PATROL READ
IS NOT
EXECUTED

SECOND
PATROL READ
IS EXECUTED

C1a C2    NUMBER OF
ERROR BITS

SECOND PATROL READ — S13

IS IT NECESSARY TO
EXECUTE REFRESH
PROCESSING? (NUMBER OF
ERROR BITS > C2) — S14

NO

YES

REFRESH PROCESSING — S15

END PATROL
OPERATION

FIG. 20

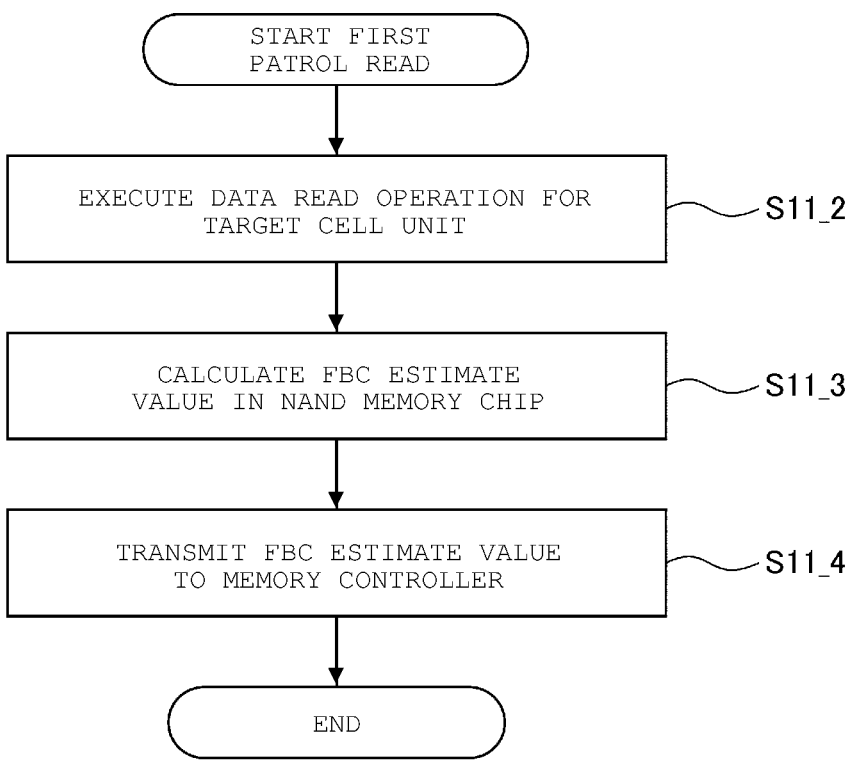

START FIRST
PATROL READ

↓

EXECUTE DATA READ OPERATION FOR
TARGET CELL UNIT — S11_2

↓

CALCULATE FBC ESTIMATE
VALUE IN NAND MEMORY CHIP — S11_3

↓

TRANSMIT FBC ESTIMATE VALUE
TO MEMORY CONTROLLER — S11_4

↓

END

FIG. 21

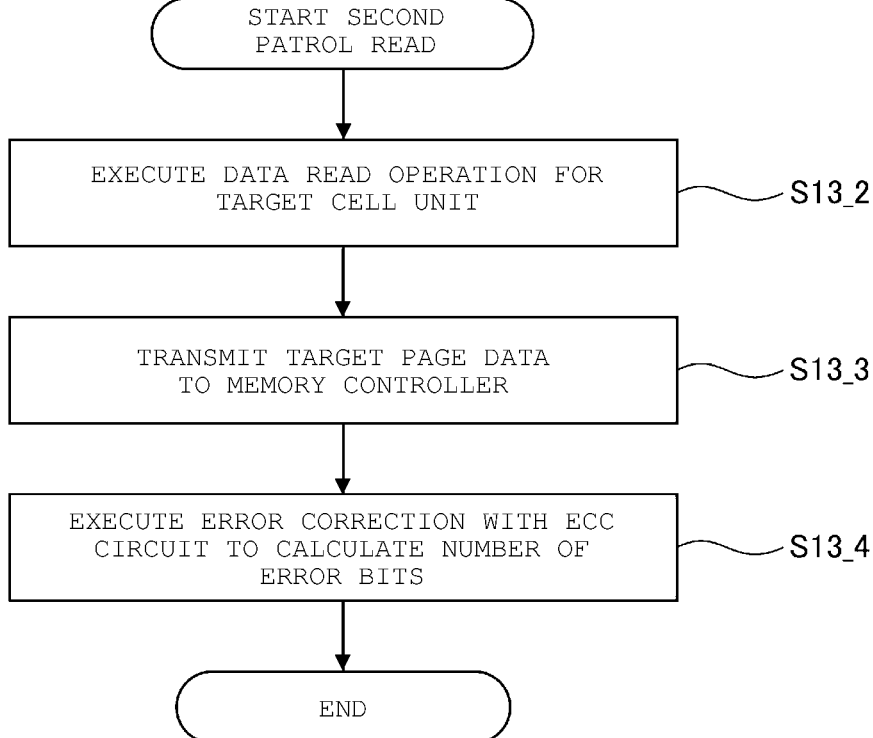

START SECOND
PATROL READ

↓

EXECUTE DATA READ OPERATION FOR
TARGET CELL UNIT — S13_2

↓

TRANSMIT TARGET PAGE DATA
TO MEMORY CONTROLLER — S13_3

↓

EXECUTE ERROR CORRECTION WITH ECC
CIRCUIT TO CALCULATE NUMBER OF
ERROR BITS — S13_4

↓

END

FIG. 22

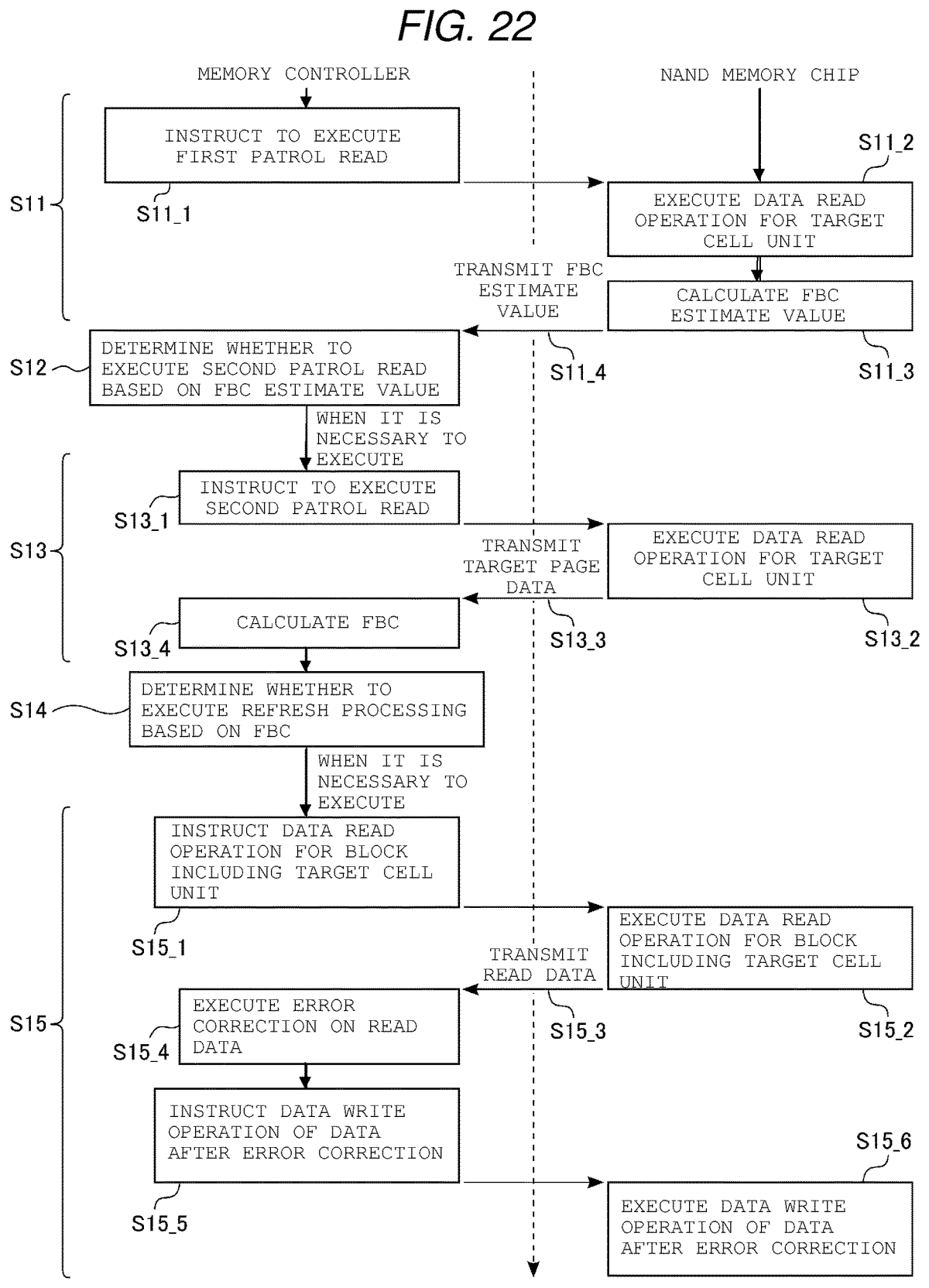

MEMORY CONTROLLER         NAND MEMORY CHIP

S11
- INSTRUCT TO EXECUTE FIRST PATROL READ

S11_1

S11_2
- EXECUTE DATA READ OPERATION FOR TARGET CELL UNIT

TRANSMIT FBC ESTIMATE VALUE

- CALCULATE FBC ESTIMATE VALUE

S11_4            S11_3

S12 — DETERMINE WHETHER TO EXECUTE SECOND PATROL READ BASED ON FBC ESTIMATE VALUE

WHEN IT IS NECESSARY TO EXECUTE

S13
- INSTRUCT TO EXECUTE SECOND PATROL READ

S13_1

TRANSMIT TARGET PAGE DATA

- EXECUTE DATA READ OPERATION FOR TARGET CELL UNIT

- CALCULATE FBC

S13_4          S13_3          S13_2

S14 — DETERMINE WHETHER TO EXECUTE REFRESH PROCESSING BASED ON FBC

WHEN IT IS NECESSARY TO EXECUTE

S15
- INSTRUCT DATA READ OPERATION FOR BLOCK INCLUDING TARGET CELL UNIT

S15_1

TRANSMIT READ DATA

- EXECUTE DATA READ OPERATION FOR BLOCK INCLUDING TARGET CELL UNIT

- EXECUTE ERROR CORRECTION ON READ DATA

S15_4        S15_3        S15_2

- INSTRUCT DATA WRITE OPERATION OF DATA AFTER ERROR CORRECTION

S15_5

S15_6
- EXECUTE DATA WRITE OPERATION OF DATA AFTER ERROR CORRECTION

FIG. 23

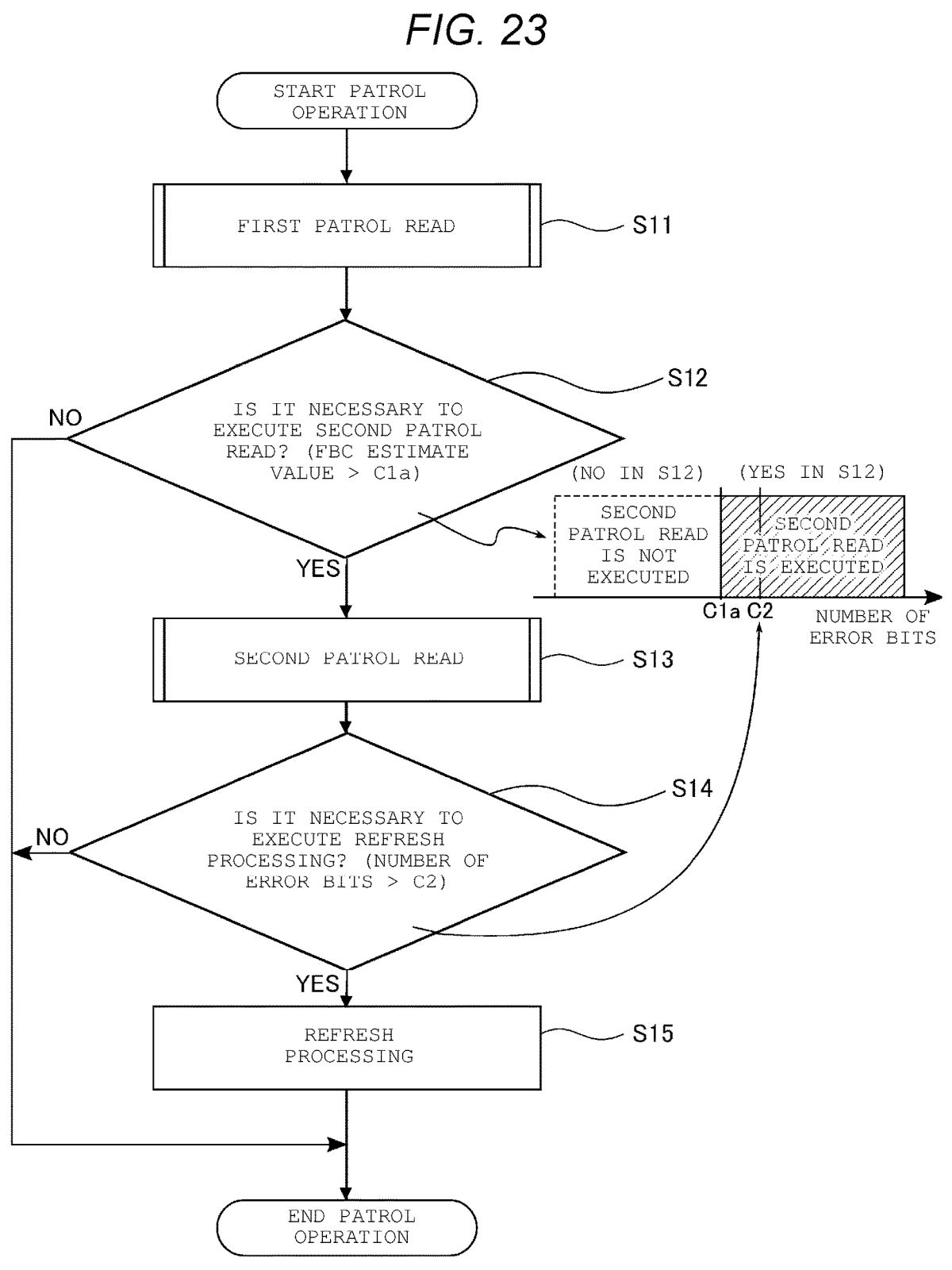

START PATROL
OPERATION

FIRST PATROL READ — S11

IS IT NECESSARY TO
EXECUTE SECOND PATROL
READ? (FBC ESTIMATE
VALUE > C1a) — S12

NO (NO IN S12)    (YES IN S12)

SECOND
PATROL READ
IS NOT
EXECUTED

SECOND
PATROL READ
IS EXECUTED

C1a C2    NUMBER OF
ERROR BITS

YES

SECOND PATROL READ — S13

IS IT NECESSARY TO
EXECUTE REFRESH
PROCESSING? (NUMBER OF
ERROR BITS > C2) — S14

NO

YES

REFRESH
PROCESSING — S15

END PATROL
OPERATION

FIG. 24

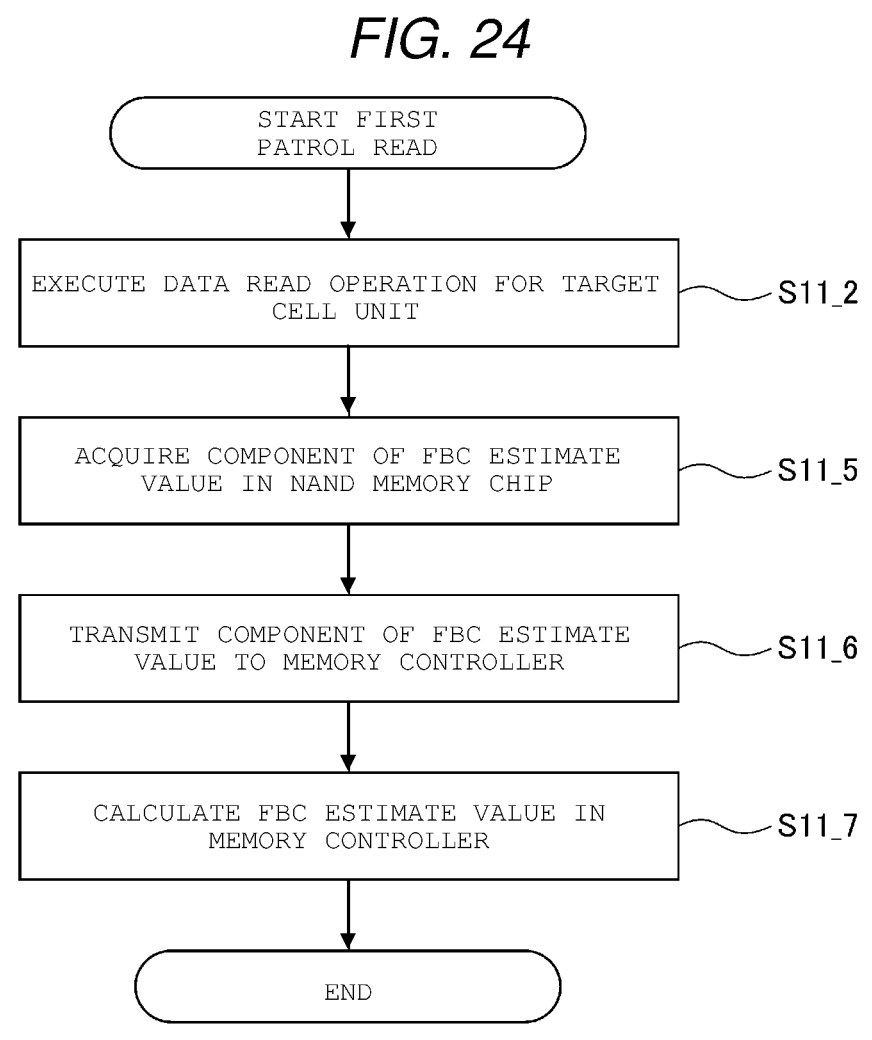

```
        ┌──────────────────────────┐
        │      START FIRST         │
        │      PATROL READ         │
        └──────────────────────────┘
                    │
                    ▼
┌─────────────────────────────────────────┐
│ EXECUTE DATA READ OPERATION FOR TARGET   │────── S11_2
│              CELL UNIT                    │
└─────────────────────────────────────────┘
                    │
                    ▼
┌─────────────────────────────────────────┐
│ ACQUIRE COMPONENT OF FBC ESTIMATE        │────── S11_5
│      VALUE IN NAND MEMORY CHIP           │
└─────────────────────────────────────────┘
                    │
                    ▼
┌─────────────────────────────────────────┐
│ TRANSMIT COMPONENT OF FBC ESTIMATE       │────── S11_6
│      VALUE TO MEMORY CONTROLLER          │
└─────────────────────────────────────────┘
                    │
                    ▼
┌─────────────────────────────────────────┐
│ CALCULATE FBC ESTIMATE VALUE IN          │────── S11_7
│          MEMORY CONTROLLER               │
└─────────────────────────────────────────┘
                    │
                    ▼
        ┌──────────────────────────┐
        │           END            │
        └──────────────────────────┘
```

Figure 28:
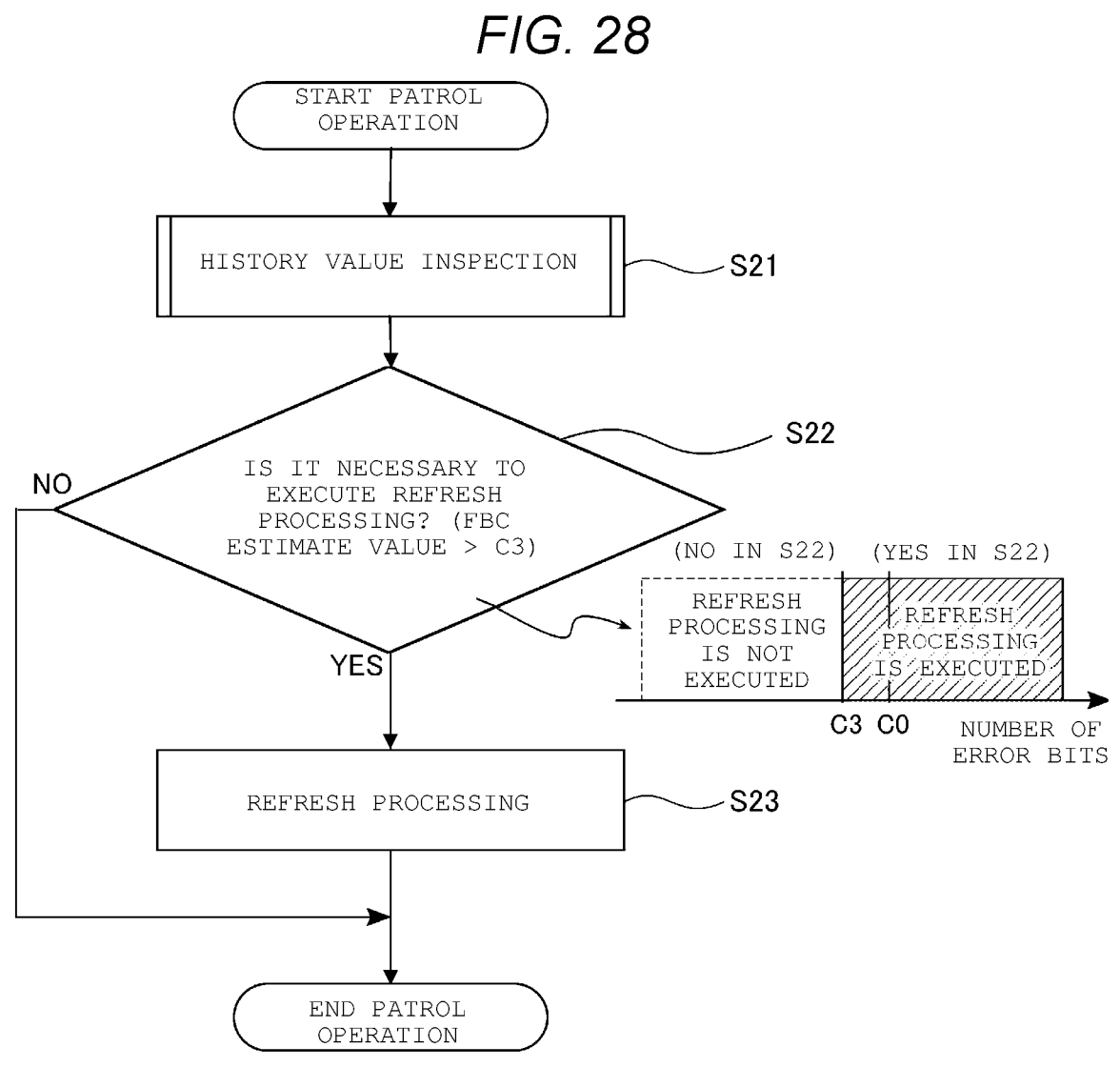

START PATROL
OPERATION

HISTORY VALUE INSPECTION — S21

IS IT NECESSARY TO
EXECUTE REFRESH
PROCESSING? (FBC
ESTIMATE VALUE > C3) — S22

NO

YES

REFRESH
PROCESSING
IS NOT
EXECUTED (NO IN S22)    (YES IN S22)

REFRESH
PROCESSING
IS EXECUTED

C3 C0    NUMBER OF
ERROR BITS

REFRESH PROCESSING — S23

END PATROL
OPERATION

| PHYSICAL ADDRESS | READ VOLTAGE | | | | | | | UPDATED TIME |
|---|---|---|---|---|---|---|---|---|
| | "A" STATE | "B" STATE | "C" STATE | "D" STATE | "E" STATE | "F" STATE | "G" STATE | |
| BA0 | Xa | Xb | Xc | Xd | Xe | Xf | Xg | TU0 |
| BA1 | Ya | Yb | Yc | Yd | Ye | Yf | Yg | TU1 |
| ... | ... | ... | ... | ... | ... | ... | ... | ... |
| BAm | Za | Zb | Zc | Zd | Ze | Zf | Zg | TUm |

22Ai

| PHYSICAL ADDRESS | READ VOLTAGE | | | | | | | GENERATED TIME |
|---|---|---|---|---|---|---|---|---|
| | "A" STATE | "B" STATE | "C" STATE | "D" STATE | "E" STATE | "F" STATE | "G" STATE | |
| BA0 | Na | Nb | Nc | Nd | Ne | Nf | Ng | TI0 |
| BA1 | Oa | Ob | Oc | Od | Oe | Of | Og | TI1 |
| ... | ... | ... | ... | ... | ... | ... | ... | ... |
| BAm | Pa | Pb | Pc | Pd | Pe | Pf | Pg | TIm |

FIG. 37

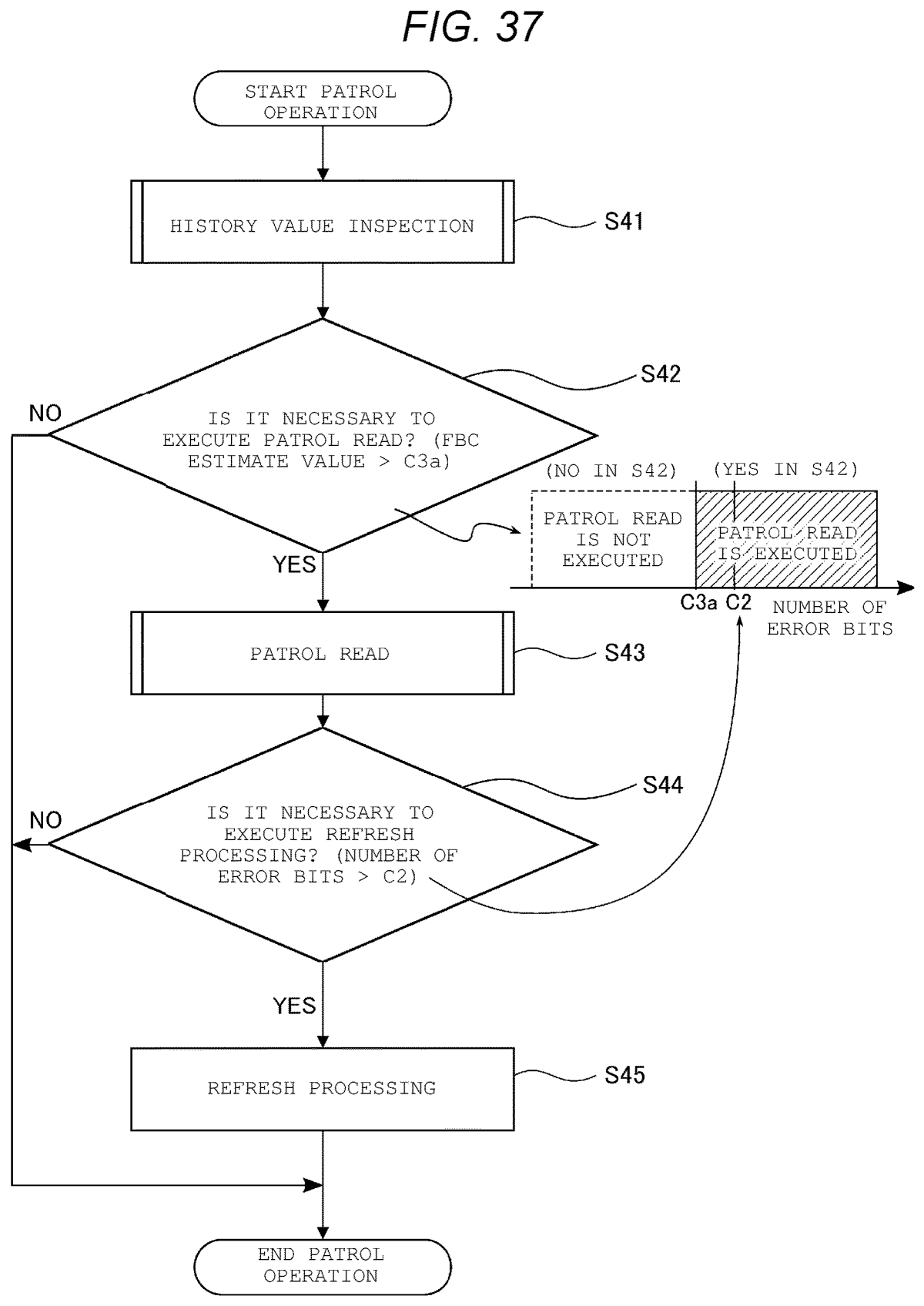

```
        ┌─────────────────────┐
        │   START PATROL      │
        │     OPERATION       │
        └─────────────────────┘
                   │
                   ▼
   ┌───────────────────────────────────┐
   │  HISTORY VALUE INSPECTION         │────── S41
   └───────────────────────────────────┘
                   │
                   ▼
```

S42

IS IT NECESSARY TO EXECUTE PATROL READ? (FBC ESTIMATE VALUE > C3a)

NO

YES (NO IN S42)    (YES IN S42)

PATROL READ IS NOT EXECUTED    PATROL READ IS EXECUTED

C3a C2    NUMBER OF ERROR BITS

PATROL READ ──── S43

S44

IS IT NECESSARY TO EXECUTE REFRESH PROCESSING? (NUMBER OF ERROR BITS > C2)

NO

YES

REFRESH PROCESSING ──── S45

```
        ┌─────────────────────┐
        │   END PATROL        │
        │     OPERATION       │
        └─────────────────────┘
```

FIG. 38

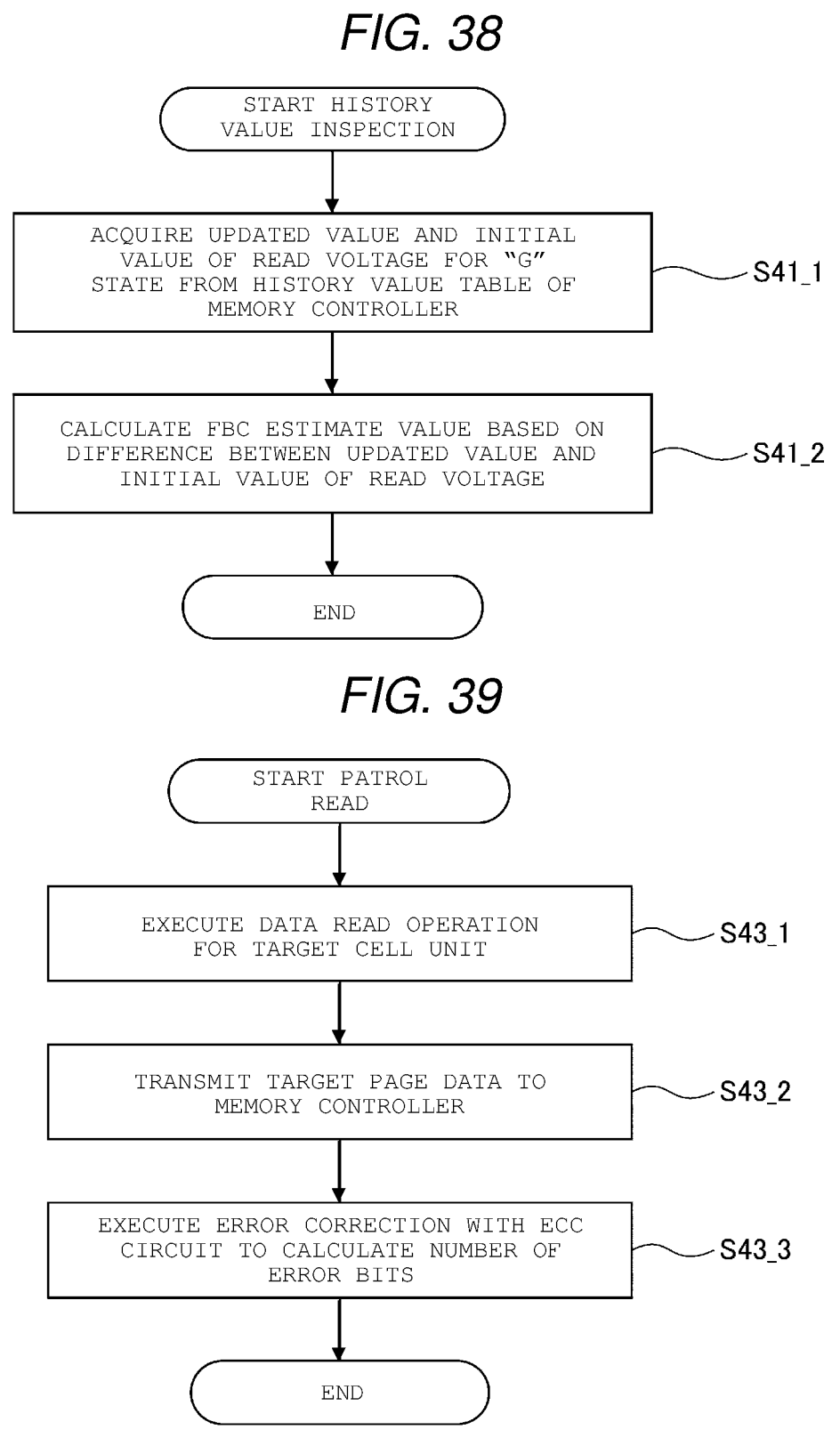

START HISTORY
VALUE INSPECTION

ACQUIRE UPDATED VALUE AND INITIAL
VALUE OF READ VOLTAGE FOR "G"
STATE FROM HISTORY VALUE TABLE OF
MEMORY CONTROLLER  — S41_1

CALCULATE FBC ESTIMATE VALUE BASED ON
DIFFERENCE BETWEEN UPDATED VALUE AND
INITIAL VALUE OF READ VOLTAGE  — S41_2

END

FIG. 39

START PATROL
READ

EXECUTE DATA READ OPERATION
FOR TARGET CELL UNIT  — S43_1

TRANSMIT TARGET PAGE DATA TO
MEMORY CONTROLLER  — S43_2

EXECUTE ERROR CORRECTION WITH ECC
CIRCUIT TO CALCULATE NUMBER OF
ERROR BITS  — S43_3

END

MEMORY SYSTEM CAPABLE OF PATROL READ

CROSS-REFERENCE TO RELATED APPLICATION

This application is based upon and claims the benefit of priority from Japanese Patent Application No. 2022-149189, filed Sep. 20, 2022, the entire contents of which are incorporated herein by reference.

FIELD

Embodiments described herein relate generally to a memory system.

BACKGROUND

A nonvolatile semiconductor memory, for example, a NAND flash memory, having memory cells that are arranged two-dimensionally or three-dimensionally is known. A memory system may be configured with a NAND type flash memory and a memory controller that controls the NAND type flash memory.

DESCRIPTION OF THE DRAWINGS

FIG. 2 is a diagram showing a configuration of a NAND flash memory chip according to the first embodiment.

FIG. 7 is a flowchart showing an operation of a patrol read according to the first embodiment.

FIG. 9 is a diagram illustrating the number of error bits according to the first embodiment.

FIGS. 11A, 11B, and 11C are diagrams showing a 3-point read method according to the first embodiment.

FIG. 15 is a diagram showing a configuration of a NAND flash memory chip according to the second embodiment.

FIG. 17 is a flowchart showing an operation of a patrol read according to the second embodiment.

FIG. 19 is a flowchart showing a patrol operation according to a third embodiment.

FIG. 20 is a flowchart showing an operation of a first patrol read according to the third embodiment.

FIG. 21 is a flowchart showing an operation of a second patrol read according to the third embodiment.

FIG. 22 is a sequence diagram showing the patrol operation according to the third embodiment.

FIG. 23 is a flowchart showing a patrol operation according to a fourth embodiment.

FIG. 24 is a flowchart showing an operation of a first patrol read according to the fourth embodiment.

FIG. 27 is a block diagram showing a configuration of a memory system according to a fifth embodiment.

FIG. 28 is a flowchart showing a patrol operation according to the fifth embodiment.

FIG. 31 is a diagram showing an example of a history value table according to the fifth embodiment.

FIG. 37 is a flowchart showing a patrol operation according to a sixth embodiment.

FIG. 38 is a flowchart showing an operation of a history value inspection according to the sixth embodiment.

FIG. 39 is a flowchart showing an operation of a patrol read according to the sixth embodiment.

DETAILED DESCRIPTION

Embodiments provide a memory system capable of shortening the time required for a patrol operation.

In general, according to one embodiment, a memory system includes a semiconductor memory that includes a cell unit having a plurality of memory cells, and a control circuit for controlling the plurality of memory cells, and a controller configured to control the semiconductor memory. The control circuit is configured to execute a data read operation on the cell unit by using one or more read voltages, acquire first data by the data read operation, generate second data having a smaller data size than the first data, based on the first data, and transmit the second data to the controller, and the controller is configured to determine, based on the second data, whether or not to rewrite page data written in the cell unit.

Hereinafter, embodiments will be described with reference to the drawings. In the following description, elements having the same function and configuration are denoted by the same reference signs. In addition, the embodiments described below are examples of devices and methods for embodying the technical idea of the embodiments, and the material, shape, structure, arrangement, and the like of the components are not limited to the following.

Functional blocks may be implemented by hardware, computer software, or a combination of both. The functional blocks do not need to be distinguished as in the example below. For example, some functions may be executed by a functional block different from the illustrated functional block. Further, the illustrated functional block may be divided into smaller functional sub-blocks. In the following, as a semiconductor memory, a three-dimensionally stacked NAND flash memory in which memory cell transistors are three-dimensionally stacked above a semiconductor substrate will be described as an example.

1. First Embodiment

A memory system of a first embodiment is described.

1.1 Configuration

1.1.1 Memory System

Figure 1:
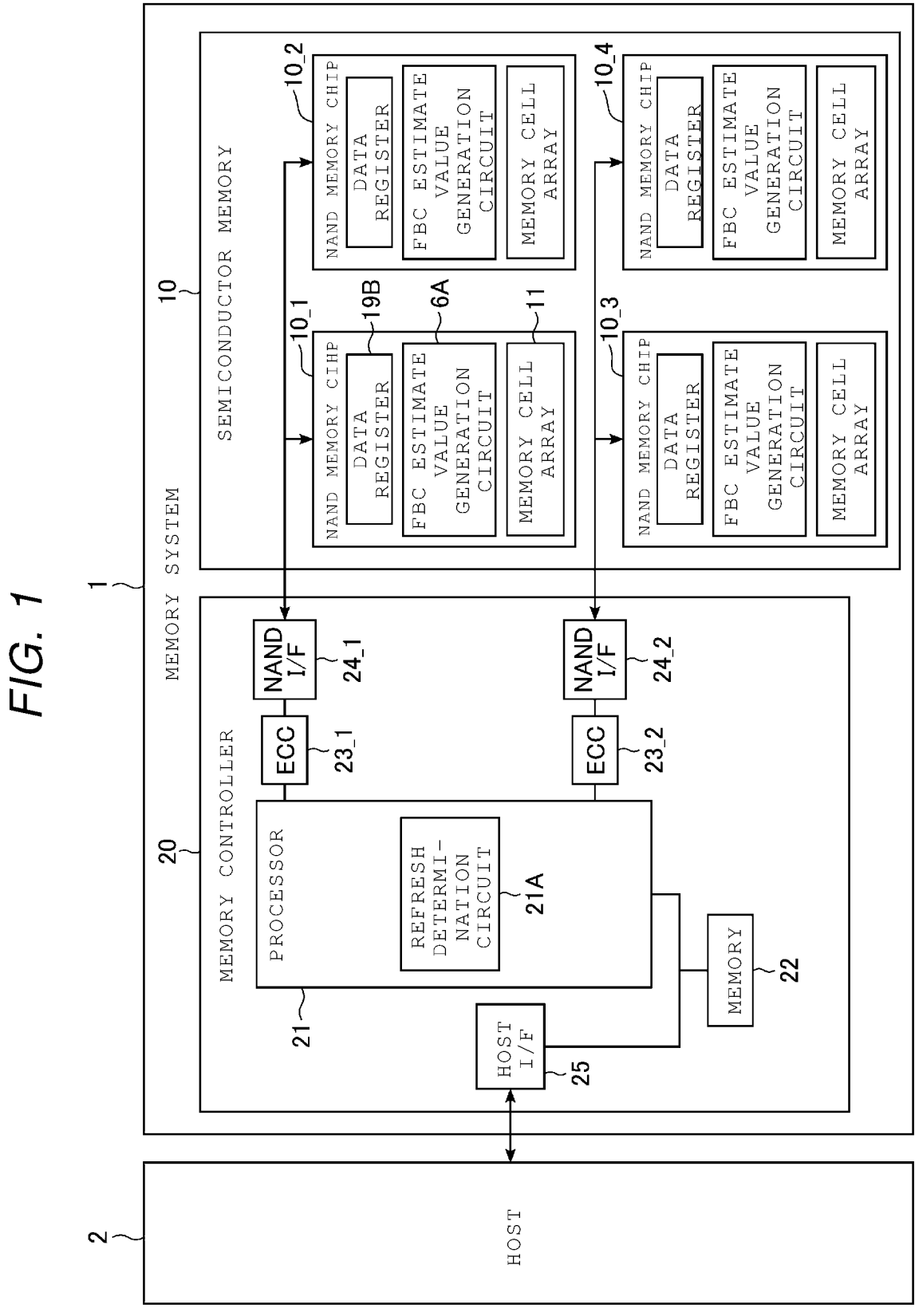
FIG. 1 is a block diagram showing a configuration of a memory system according to a first embodiment.

First, the configuration of a memory system of the first embodiment will be described. FIG. 1 is a block diagram showing the configuration of a memory system according to the first embodiment.

A memory system 1 includes a semiconductor memory 10 and a memory controller 20. The memory system 1 is connected to an external host 2 and can execute various operations in response to an instruction from the host 2.

The semiconductor memory 10 includes, for example, one or a plurality of NAND flash memory chips 10_1, 10_2, . . . , 10_n (n is a natural number equal to or larger than 1). In this exemplary configuration, the semiconductor memory 10 includes four NAND flash memory chips 10_1, 10_2, 10_3, and 10_4. Each of the NAND flash memory chips 10_1 to 10_4 includes a plurality of memory cells and stores data in a nonvolatile manner. The details of the NAND flash memory chips 10_1 to 10_4 provided in the semiconductor memory 10 are described below. Hereafter, the NAND flash memory chips 10_1 to 10_4 are also referred to as NAND memory chips.

The memory controller 20 is connected to the semiconductor memory 10 via a NAND bus. The NAND bus is used for transmitting and receiving signals according to a NAND interface standard. The memory controller 20 is also connected to the host 2 via a host bus. The memory controller 20 controls the semiconductor memory 10. The memory controller 20 accesses the semiconductor memory 10 in response to an instruction received from the host 2.

The memory system 1 including the semiconductor memory 10 and the memory controller 20 may constitute, for example, one semiconductor device. Examples of the memory system 1 include a solid state drive (SSD), a memory card including an SD® card, and the like. The memory controller 20 is configured with a circuit such as a system-on-a-chip (SoC), for example.

The host 2 is, for example, a server in a data center or a personal computer.

1.1.2 Memory Controller

Next, the configuration of the memory controller 20 is described with reference to FIG. 1. The memory controller 20 includes a processor (e.g., central processing unit (CPU)) 21, a memory 22, an error checking and correcting (ECC) circuits 23_1 and 23_2, NAND interface circuits (NAND I/F) 24_1 and 24_2, and a host interface circuit (host I/F) 25.

The processor 21 controls the operation of the entire memory controller 20. For example, when the processor 21 receives a write instruction from the host 2, the processor 21 issues a write command to the NAND interface circuit 24_1 or 24_2 according to the received write instruction. When the processor 21 receives a read instruction from the host 2, the processor 21 issues a read command to the NAND interface circuit 24_1 or 24_2 according to the received read instruction. The processor 21 issues an erase command to the NAND interface circuit 24_1 or 24_2 when executing a data erase operation. The processor 21 includes a refresh determination circuit 21A. The refresh determination circuit 21A determines whether or not to execute refresh processing based on an estimate of the number of error bits (referred to herein as "fail bit count" or "FBC") or the FBC itself. The refresh determination circuit 21A is described later. The processor 21 executes various processing for managing the semiconductor memory 10 such as wear leveling and the like. Functions of the processor 21 (and the refresh determination circuit 21A) described in the present specification may be implemented by executing software (or firmware) by the processor 21 or may be implemented by hardware (or a dedicated circuit).

The memory 22 is, for example, a semiconductor memory such as dynamic random access memory (DRAM) and static random access memory (SRAM), and is used as a work area of the processor 21. The memory 22 is used as a buffer for storing various kinds of information, such as firmware for managing the semiconductor memory 10, various kinds of management tables, and the like. One example of the management tables includes a history value table relating to read voltages described below.

The ECC circuits 23_1 and 23_2 execute error correction processing of data. At the time of a data write operation, the ECC circuits 23_1 and 23_2 generate parity based on write data received from the host 2 and add the generated parity to the write data. At the time of a data read operation, the ECC circuits 23_1 and 23_2 generate syndrome based on read data received from the semiconductor memory 10 and detect and correct errors of the read data based on the generated syndrome.

The NAND interface circuit 24_1 is connected to the NAND memory chips 10_1 and 10_2 via a NAND bus and manages communication with the NAND memory chips 10_1 and 10_2. The NAND interface circuit 24_1 transmits various signals to the NAND memory chips 10_1 and 10_2 and also receives various signals from the NAND memory chips 10_1 and 10_2 based on instructions received from the processor 21.

Similarly, the NAND interface circuit 24_2 is connected to the NAND memory chips 10_3 and 10_4 via a NAND bus, and manages communication with the NAND memory chips 10_3 and 10_4. The NAND interface circuit 24_2 transmits various signals to the NAND memory chips 10_3 and 10_4 and also receives various signals from the NAND memory chips 10_3 and 10_4 based on instructions received from the processor 21.

The host interface circuit 25 is connected to the host 2 via a host bus and manages communication with the host 2. The host interface 25 transfers instructions and data received from the host 2 to the processor 21 and the memory 22, respectively.

1.1.3 Semiconductor Memory

Next, the configuration of the NAND memory chips 10_1 to 10_4 provided in the semiconductor memory 10 is described. The configuration of the NAND memory chip 10_1 is described below. The configuration of each of the other NAND memory chips 10_2 to 10_4 is the same as that of the NAND memory chip 10_1.

Figure 2:
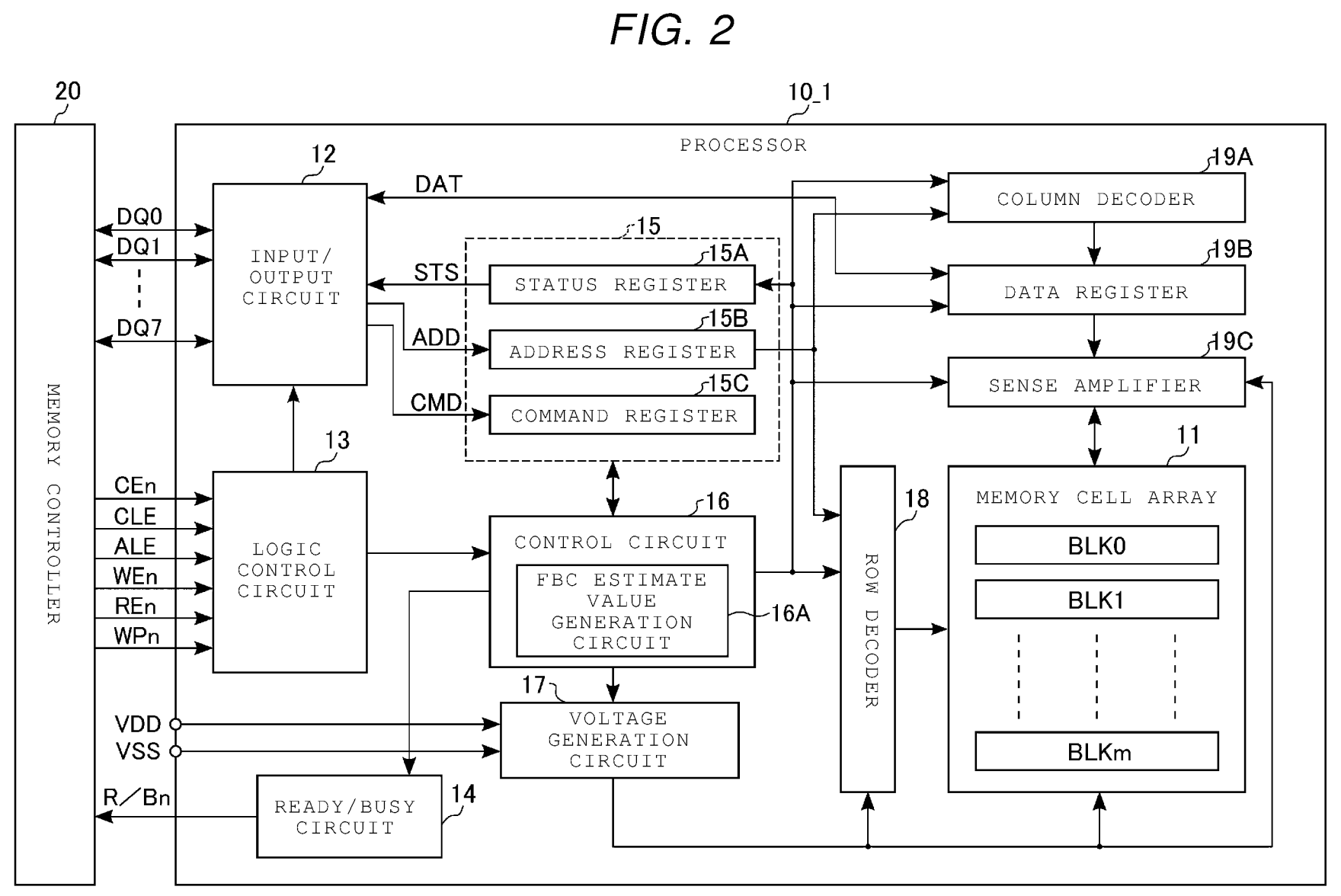

FIG. 2 shows the configuration of the NAND memory chip 10_1 according to the first embodiment.

The NAND memory chip 10_1 includes a memory cell array 11, an input/output circuit 12, a logic control circuit 13, a ready/busy circuit 14, a register group 15, a control circuit 16, a voltage generation circuit 17, a row decoder 18, a column decoder 19A, a data register 19B, and a sense amplifier 19C. The register group 15 includes a status register 15A, an address register 15B, and a command register 15C.

The memory cell array 11 includes one or a plurality of blocks BLK0, BLK1, BLK2, . . . , BLKm (m is an integer equal to or larger than 0). Each of the plurality of blocks BLK0 to BLKm includes a plurality of memory cell transistors (also referred to as memory cells) associated with rows and columns. The memory cell transistor is a nonvolatile memory cell which can be electrically erased and programmed. The memory cell array 11 includes a plurality of word lines, a plurality of bit lines, and a source line for applying a voltage to a memory cell transistor. A specific configuration of the block BLKm is described below.

The input/output circuit 12 and the logic control circuit 13 are connected to the memory controller 20 via input/output terminals (e.g., via a NAND bus). The input/output circuit 12 transmits and receives input/output signals (I/O signals) DQ (for example, DQ0, DQ1, DQ2, . . . , DQ7) to and from the memory controller 20 via the input/output terminals. The I/O signals DQ communicate commands, addresses, data, and the like.

The logic control circuit 13 receives a control signal from the memory controller 20 via an input/output terminal. The control signal includes, for example, a chip enable signal CEn, a command latch enable signal CLE, an address latch enable signal ALE, a write enable signal WEn, a read enable signal REn, and a write protect signal WPn. The "n" added to the signal name indicates that the signal is an active low signal.

When a plurality of NAND memory chips are mounted on the semiconductor memory 10, the chip enable signal CEn is asserted when one NAND memory chip is selected. The command latch enable signal CLE allows a command transmitted as a signal DQ to be latched into the command register 15C. The address latch enable signal ALE allows an address transmitted as a signal DQ to be latched into the address register 15B. A write enable signal WEn allows data transmitted as a signal DQ to be stored in the data register 19B. A read enable signal REn allows data read from the memory cell array 11 to be output as a signal DQ. A write protect signal WPn is asserted when a data write operation and a data erase operation on the NAND memory chip are prohibited.

The ready/busy circuit 14 generates a ready/busy signal R/Bn in response to control from the control circuit 16. The ready/busy signal R/Bn indicates whether the NAND memory chip 10_1 is in a ready state or a busy state. The ready state indicates that the NAND memory chip 10_1 is in a state where an instruction can be received from the memory controller 20. The busy state indicates that the NAND memory chip 10_1 is in a state where an instruction cannot be received from the memory controller 20. The memory controller 20 can know whether the NAND memory chip 10_1 is in the ready state or the busy state by receiving the ready/busy signal R/Bn from the NAND memory chip 10_1.

The status register 15A stores status information STS required for the operation of the NAND memory chip 10_1. The status register 15A transfers the status information STS to the input/output circuit 12 according to an instruction of the control circuit 16.

The address register 15B stores an address ADD transferred from the input/output circuit 12. The address ADD includes a row address and a column address. The row address includes, for example, a block address specifying the block BLKm to be operated, and a page address specifying a word line WL to be operated in a specified block.

The command register 15C stores a command CMD transferred from the input/output circuit 12. The command CMD includes, for example, a write command instructing the control circuit 16 to perform a data write operation, a read command instructing a data read operation, and an erase command instructing a data erase operation.

For example, a static random access memory (SRAM) is used for the status register 15A, the address register 15B, and the command register 15C.

The control circuit 16 receives a command from the command register 15C and integrally controls the NAND memory chip 10_1 according to a sequence based on the command.

The control circuit 16 controls the voltage generation circuit 17, the row decoder 18, the column decoder 19A, the data register 19B, the sense amplifier 19C, and the like to execute a data write operation, a data read operation, and a data erase operation. Specifically, the control circuit 16 writes data in the plurality of memory cell transistors specified by the address ADD based on a write command received from the command register 15C. The control circuit 16 also reads data from the plurality of memory cell transistors specified by the address ADD based on a read command received from the command register 15C. The control circuit 16 also erases data stored in the block specified by the address ADD based on an erase command received from the command register 15C.

The control circuit 16 also includes an FBC estimate value generation circuit 16A. The FBC estimate value generation circuit 16A calculates an FBC estimate value. The FBC estimate value and the FBC estimate value generation circuit 16A are described later. The function of the control circuit (and the FBC estimate value generation circuit 16A) described in the present specification may be implemented by the control circuit 16 executing software (or firmware) or may be implemented by hardware (or a dedicated circuit).

The voltage generation circuit 17 receives a power supply voltage VDD and a ground voltage VSS from the outside of the NAND memory chip 10_1 via a power supply terminal (not shown). The power supply voltage VDD is an external voltage supplied from the outside of the semiconductor memory 10, and is for example, 3.3 V. The ground voltage VSS is an external voltage supplied from the outside of the semiconductor memory 10, and is for example, 0 V.

The voltage generation circuit 17 uses the power supply voltage VDD to generate a plurality of voltages necessary for a data write operation, a data read operation, and a data erase operation. The voltage generation circuit 17 supplies the generated voltages to the memory cell array 11, the row decoder 18, a sense amplifier 19C, and the like.

The row decoder 18 receives a row address from the address register 15B and decodes this row address. The row decoder 18 selects one of the plurality of blocks based on the decoding result of the row address, and further selects a word line WL in a selected block BLKm. Further, the row decoder 18 transfers the plurality of voltages supplied from the voltage generation circuit 17 to the selected block BLKm.

The column decoder 19A receives a column address from the address register 15B and decodes this column address. The column decoder 19A selects a latch circuit in the data register 19B based on the decoding result of the column address.

The data register 19B includes a plurality of latch circuits. The latch circuit temporarily stores write data or read data.

The sense amplifier 19C senses and amplifies data read from the memory cell transistor into a bit line in a data read operation. Further, the sense amplifier 19C temporarily stores read data DAT read from the memory cell transistor and transfers the stored read data DAT to the data register 19B. The sense amplifier 19C temporarily stores write data DAT transferred from the input/output circuit 12 via the data register 19B in a data write operation. Further, the sense amplifier 19C transfers the write data DAT to a bit line.

1.1.4 Memory Cell Array 1.1.4.1 Circuit Configuration of Memory Cell Array

Next, the circuit configuration of the memory cell array 11 of the NAND memory chip 10_1 is described. As described above, the memory cell array 11 includes the plurality of blocks BLK0 to BLKm. The circuit configuration of the block BLKm is described below.

Figure 3:
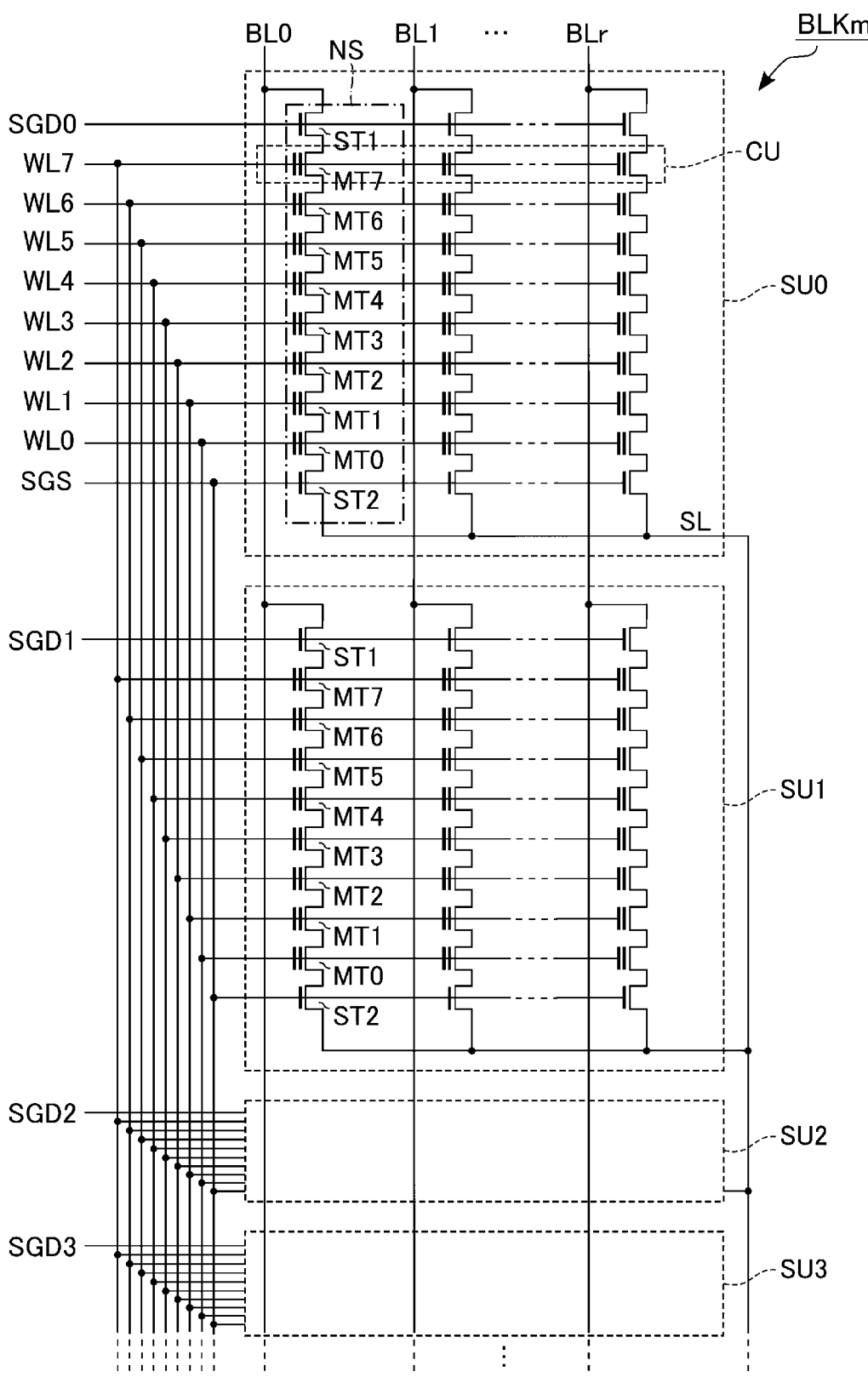
FIG. 3 is a circuit diagram of a block in a memory cell array according to the first embodiment.

FIG. 3 is a circuit diagram of the block BLKm in the memory cell array 11. The block BLKm includes, for example, a plurality of string units SU0, SU1, SU2, and SU3. Hereafter, when a string unit SU is described, any one of the string units SU0 to SU3 is indicated. The string unit SU includes a plurality of NAND strings (or memory strings) NS.

Here, for the sake of simplicity, an example is illustrated in which the NAND string NS includes, for example, eight memory cell transistors MT0, MT1, MT2, . . . , MT7, and two select transistors ST1 and ST2. Hereafter, when a memory cell transistor MT is described, any one of the memory cell transistors MT0 to MT7 is indicated.

The memory cell transistor MT includes a control gate and a charge storage layer, and stores data in a nonvolatile manner. The memory cell transistors MT0 to MT7 are connected in series between the source of the select transistor ST1 and the drain of the select transistor ST2. The memory cell transistor MT can store 1-bit data or 2 or more bits of data.

The gates of a plurality of select transistors ST1 provided in the string unit SU0 are connected to a select gate line SGD0. Similarly, the gates of the select transistors ST1 of the string units SU1 to SU3 are connected to select gate lines SGD1 to SGD3, respectively. Each of the select gate lines SGD0 to SGD3 is independently controlled by the row decoder 18.

The gates of a plurality of select transistors ST2 provided in the string unit SU0 are connected to a select gate line SGS. Similarly, the gates a plurality of select transistors ST2 of each of the string units SU1 to SU3 are connected to the select gate line SGS. Different select gate lines SGS may be connected to the gates of select transistors ST2 of the string units SU0 to SU3, respectively. The select transistors ST1 and ST2 are used to select a string unit SU in various operations.

The control gates of the memory cell transistors MT0 to MT7 provided in the block BLKm are connected to word lines WL0 to WL7, respectively. Each of the word lines WL0 to WL7 is independently controlled by the row decoder 18.

Each of the bit lines BL0 to BLr (r is an integer equal to or larger than 0) is connected to the plurality of blocks BLK0 to BLKm, and is connected to one NAND string NS in a string unit SU provided in the block BLKm. That is, each of the bit lines BL0 to BLr is connected to the drains of the select transistors ST1 of a plurality of NAND strings NS in the same row among the NAND strings NS located in a matrix in the block BLKm. A source line SL is connected to the plurality of blocks BLK0 to BLKm. That is, the source line SL is connected to the sources of the plurality of select transistors ST2 provided in the block BLKm.

In short, the string unit SU includes a plurality of NAND strings NS connected to different bit lines BL and connected to the same select gate line SGD. The block BLKm includes a plurality of string units SU that share the word line WL. Further, the memory cell array 11 includes a plurality of blocks BLK0 to BLKm that share the bit line BL.

The block BLKm is, for example, a unit of erasing data. That is, the data stored in the memory cell transistors MT provided in the block BLKm is erased all at once. The data in a plurality of blocks are sequentially erased for each block. In some embodiments, the data in a plurality of blocks may be erased in parallel. Note that data may be erased in units of the string unit SU, or may be erased in units of smaller than the string unit SU.

The plurality of memory cell transistors MT sharing a word line WL in one string unit SU are called a cell unit CU. A collection of 1-bit data stored in each of the plurality of memory cell transistors MT provided in the cell unit CU is called page data. The storage capacity of the cell unit CU changes according to the number of bits of data stored in the memory cell transistor MT. For example, the cell unit CU stores one-page data when each memory cell transistor MT stores 1-bit data. The cell unit CU stores two-page data when each memory cell transistor MT stores 2-bit data. The cell unit CU stores three-page data when each memory cell transistor MT stores 3-bit data.

A data write operation and a data read operation are performed for the cell unit CU with page data as a unit. In other words, a data read operation and a data write operation are performed collectively for the plurality of memory cell transistors MT connected to one word line WL of one string unit SU.

The number of string units provided in the block (BLKm) is not limited to 4 (SU0 to SU3), and can be freely set. The number of NAND strings NS provided in the string unit SU, and the number of memory cell transistors and select transistors provided in the NAND string NS can also be freely set. Further, the memory cell transistor MT may be a metal-oxide-nitride-oxide-silicon (MONOS) type using an insulating film as a charge storage layer, or may be a floating gate (FG) type using a conductive layer as a charge storage layer.

1.1.4.2 Structure of Memory Cell Array

Figure 4A:
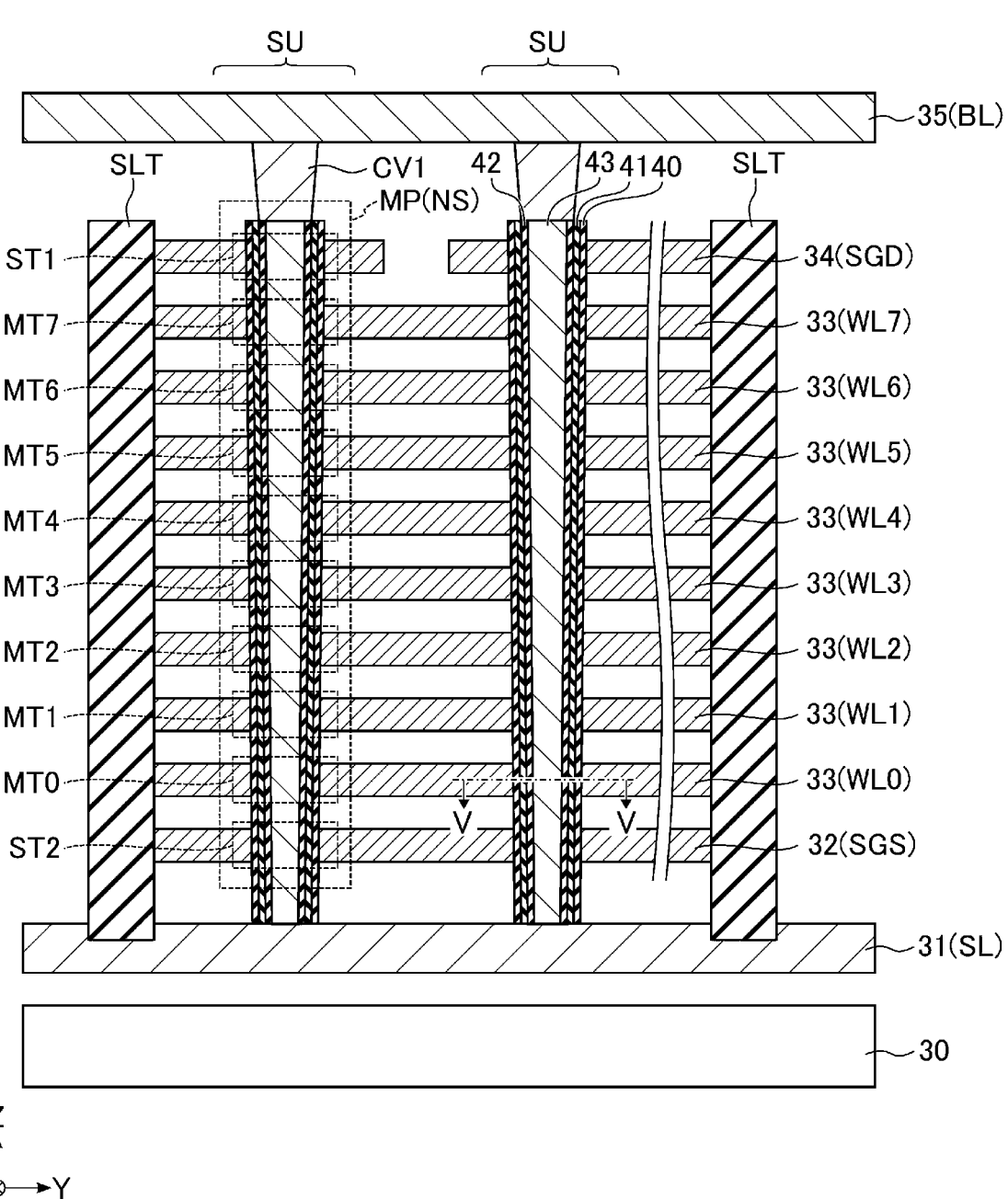
FIG. 4A is a cross-sectional diagram of the memory cell array according to the first embodiment.

Next, one example of the structure of the memory cell array 11 in the NAND memory chip 10_1 of the first embodiment is described. FIG. 4A is a diagram showing a cross-sectional structure of the memory cell array 11 in the NAND memory chip 10_1 according to the first embodiment. In FIG. 4A, two directions parallel to a plane of a semiconductor substrate 30 and orthogonal to each other are defined as an X direction and a Y direction, and a direction orthogonal to the plane (XY plane) including the X direction and Y direction is defined as a Z direction. The X direction corresponds to the extending direction of the word line WL, the Y direction corresponds to the extending direction of the bit line BL, and the Z direction corresponds to the direction in which the word lines WL are stacked. In FIG. 4A, components such as wiring, contacts, and insulating layers are omitted as needed to make the drawing easy to view.

As shown in FIG. 4A, the memory cell array 11 includes conductive layers 31 to 35 provided above the semiconductor substrate 30, a memory pillar MP, a contact plug CV1, and a slit SLT.

The conductive layer 31 is provided above the semiconductor substrate 30. The conductive layer 31 is formed in a flat plate shape parallel to the main surface (or XY plane) of the semiconductor substrate 30. The conductive layer 31 functions as a source line SL. The conductive layer 31 contains, for example, polysilicon doped with impurities, or tungsten (W).

On the conductive layer 31, a plurality of slits SLT along the XZ plane are located in the Y direction. The structure (or stacked body) between adjacent slits SLT on the conductive layer 31 corresponds to, for example, a plurality of string units SU.

A conductive layer 32, a plurality of conductive layers 33, and a conductive layer 34 are provided in this order from the lower layer between adjacent slits SLT on the conductive layer 31. Among these conductive layers, conductive layers adjacent to each other in the Z direction are stacked with an interlayer insulating film (not shown) interposed therebetween. The conductive layers 32 to 34 are formed in a flat plate shape parallel to the XY plane. The conductive layer 32 functions as the select gate line SGS. The plurality of conductive layers 33 function as the word lines WL0 to WL7 in this order from the lower layer. The conductive layer 34 functions as the select gate line SGD. The conductive layers 32 to 34 contain, for example, tungsten (W) or polysilicon.

A plurality of memory pillars MP are located in a staggered pattern, for example, in the X direction and the Y direction. Each of the plurality of memory pillars MP extends (or penetrates) in the Z direction in the stacked body between the slits SLT. Each memory pillar MP passes through the conductive layers 34, 33, and 32 so as to reach the upper surface of the conductive layer 31 from above the conductive layer 34. Each memory pillar MP includes, for example, a block insulating layer 40, a charge storage layer 41, a tunnel insulating layer (also referred to as a tunnel insulating film) 42, and a semiconductor layer 43. Each of the memory pillars MP functions as one NAND string NS.

A plurality of conductive layers 35 are provided above the memory pillar MP via an interlayer insulating film. The plurality of conductive layers 35 are located in the X direction. Each conductive layer 35 is a line-shaped wiring layer extending in the Y direction, and functions as the bit line BL. Each conductive layer 35 is electrically connected to one corresponding memory pillar MP for each string unit SU. Specifically, in each string unit SU, the contact plug CV1 is provided on the semiconductor layer 43 of each memory pillar MP, and one conductive layer 35 is provided on the contact plug CV1. The conductive layer 35 contains, for example, aluminum (Al) or tungsten (W). The contact plug CV1 includes a conductive layer, for example, tungsten (W).

A plurality of the structures described above are located in a direction orthogonal to the paper surface (depth direction) on which FIG. 4A is described, and a string unit SU is configured with a collection of the plurality of memory pillars MP (that is, NAND strings NS) located in the depth direction.

The number of the word lines WL and the select gate lines SGD and SGS is changed according to the number of the memory cell transistors MT and the select transistors ST1 and ST2, respectively.

Figures 4B, 5:
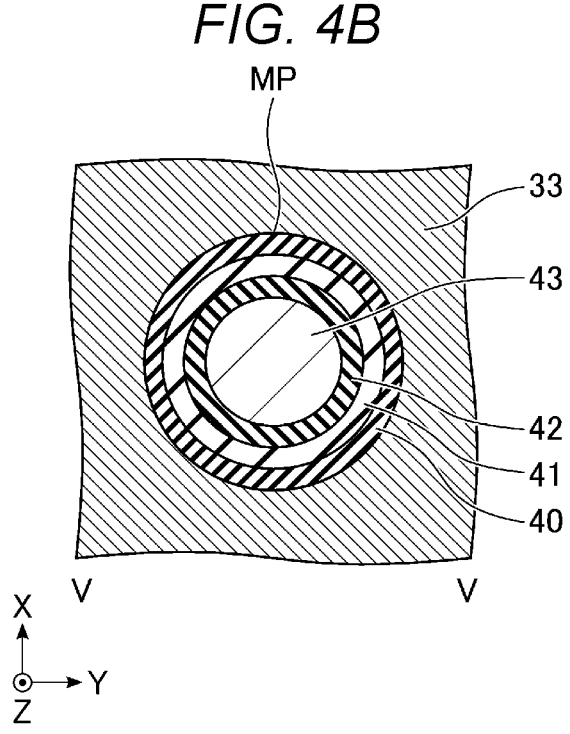
FIG. 4B is a cross-sectional diagram along the V-V line of FIG. 4A.
FIG. 5 is a diagram showing a relationship between a threshold voltage distribution and data that can be stored by a memory cell transistor according to the first embodiment.

FIG. 4B is a cross-sectional diagram along the V-V line of FIG. 4A, and shows a cross-sectional structure of the memory pillar MP in the memory cell array 11. FIG. 4B shows the cross section of the memory pillar MP in a layer parallel to the surface of the semiconductor substrate 30 and including the conductive layer 33.

As described above, the memory pillar MP includes, for example, the block insulating layer 40, the charge storage layer 41, the tunnel insulating layer (also referred to as a tunnel insulating film) 42, and the semiconductor layer 43. Specifically, the block insulating layer 40 is provided on the inner wall of a memory hole for forming the memory pillar MP. The charge storage layer 41 is provided on the inner wall of the block insulating layer 40. The tunnel insulating layer 42 is provided on the inner wall of the charge storage layer 41. Further, the semiconductor layer 43 is provided on the inner wall of the tunnel insulating layer 42. In other words, the semiconductor layer 43 is provided in the central part of the memory pillar MP, for example. The tunnel insulating layer 42 surrounds the side surface of the semiconductor layer 43. The charge storage layer 41 surrounds the side surface of the tunnel insulating layer 42. The block insulating layer 40 surrounds the side surface of the charge storage layer 41. The conductive layer 33 surrounds the side surface of the block insulating layer 40. The memory pillar MP may have a structure in which a core insulating layer is provided in the semiconductor layer 43.

In the structure of the memory pillar MP described above, the portion where the memory pillar MP and the conductive layer 32 intersect functions as the select transistor ST2. The portions where the memory pillar MP and the plurality of conductive layers 33 intersect function as the memory cell transistors MT0 to MT7, respectively. Further, the portion where the memory pillar MP and the conductive layer 34 intersect functions as the select transistor ST1.

The semiconductor layer 43 functions as a channel layer of the memory cell transistors MT0 to MT7 and the select transistors ST1 and ST2. A current path of the NAND string NS is formed in the semiconductor layer 43.

The tunnel insulating layer 42 functions as a potential barrier when charges are injected from the semiconductor layer 43 into the charge storage layer 41 or when the charges stored in the charge storage layer 41 diffuse to the semiconductor layer 43. The tunnel insulating layer 42 includes, for example, a silicon oxide film.

The charge storage layer 41 has a function of storing the charges injected from the semiconductor layer 43 into the memory cell transistors MT0 to MT7. The charge storage layer 41 is, for example, an insulating layer and contains a silicon nitride film.

The block insulating layer 40 prevents the charges stored in the charge storage layer 41 from diffusing to the conductive layer 33 (word line WL). The block insulating layer 40 includes, for example, an aluminum oxide layer, a silicon oxide layer, and a silicon nitride layer.

1.1.5 Threshold Voltage Distribution of Memory Cell Transistor

Next, the relationship between the threshold voltage distribution and the data that the memory cell transistor MT can store will be described.

FIG. 5 is a diagram showing a relationship between data and the threshold voltage distribution of the memory cell transistor MT. Here, as an example of a storage method, a triple-level cell (TLC) method of storing 3-bit data to one memory cell transistor MT is illustrated. In the present embodiment, a single-level cell (SLC) method of storing 1-bit data in one memory cell transistor MT, a multi-level cell (MLC) method of storing 2-bit data in one memory cell transistor MT, a quad-level cell (QLC) method of storing 4-bit data in one memory cell transistor MT, or the like can also be applied.

In the TLC method, the memory cell transistor MT stores 3-bit data that includes a lower bit, a middle bit, and an upper bit. When the memory cell transistor MT stores three bits, the memory cell transistor MT may be in any state out of eight states in accordance with a plurality of threshold voltages. The eight states are called states "Er", "A", "B", "C", "D", "E", "F", and "G" in this order from the lowest. The plurality of memory cell transistors MT belonging to each of the states "Er", "A", "B", "C", "D", "E", "F", and "G" form a distribution of threshold voltages as shown in FIG. 5.

Data "111", "110", "100", "000", "010", "011", "001", and "101" are assigned to the states "Er", "A", "B", "C", "D", "E", "F", and "G", respectively. The arrangement of the bits is "Z, Y, X" wherein the lower bit is "X", the middle bit is "Y", and the upper bit is "Z". The assignment of each state and the data can be freely changed.

In order to read data stored in a memory cell transistor MT to be read, a state to which the threshold voltage of the memory cell transistor MT belongs is determined. Read voltages AR, BR, CR, DR, ER, FR, and GR are used for determining the state. A voltage applied to a word line WL, to which the memory cell transistor MT to be read is connected, for the purpose of determining the threshold voltage may be referred to as a read voltage VCGRV, which includes the read voltages AR, BR, CR, DR, ER, FR, and GR.

The state "Er" corresponds to, for example, a state in which data is erased (erased state). The threshold voltage of a memory cell transistor MT belonging to the state "Er" is lower than the voltage AR and has, for example, a negative value.

The states "A" to "G" correspond to a state in which charges are injected into the charge storage layer and data is written into a memory cell transistor MT. The threshold voltage of a memory cell transistor MT belonging to the states "A" to "G" has, for example, a positive value. The threshold voltage of a memory cell transistor MT belonging to the states "A" to "F" is higher than the read voltages AR to FR and equal to or lower than the read voltages BR to GR, respectively. The threshold voltage of a memory cell transistor MT belonging to the state "G" is higher than the read voltage GR and lower than the voltage VREAD.

The voltage VREAD is a voltage applied to the word line WL connected to the memory cell transistor MT of the cell unit CU not to be read, and is higher than the threshold voltage of the memory cell transistor MT in any state. Thus, the memory cell transistor MT to which the voltage VREAD is applied to the connected word line WL (that is, a control gate) is turned on regardless of data stored therein.

A verify voltage used in a data write operation is set between adjacent threshold voltage distributions. Specifically, verify voltages AV, BV, CV, DV, EV, FV, and GV are set corresponding to the states "A", "B", "C", "D", "E", "F", and "G", respectively. For example, the verify voltages AV, BV, CV, DV, EV, FV, and GV are set slightly higher than the read voltages AR, BR, CR, DR, ER, FR, and GR, respectively.

As described above, each memory cell transistor MT is set to one of the eight states and can store 3-bit data. Writing and reading are performed in a page data unit to be stored in one cell unit CU. When each memory cell transistor MT stores 3-bit data (lower bit, middle bit, and upper bit), a set of lower bits, a set of middle bits, and a set of upper bits stored by the cell unit CU are called lower page data, middle page data, and upper page data, respectively.

When the above data assignment is applied, the lower page data is determined by a data read operation using the read voltages AR and ER. The middle page data is determined by a data read operation using the read voltages BR, DR, and FR. The upper page data is determined by a data read operation using the read voltages CR and GR.

1.2 Operation

An operation in the memory system 1 of the first embodiment is described. In the memory system 1, in order to enhance the reliability of data stored in the NAND memory chip of the semiconductor memory 10, a data storing quality in the NAND memory chip is checked periodically (or irregularly), and refresh processing is executed based on the data storing quality. Such an operation for periodically checking the data storing quality in the semiconductor memory 10 and executing refresh processing based on the data storing quality is referred to as a patrol operation. The refresh processing is performed to reduce the number of error bits contained in data by rewriting data written in a certain block in the NAND memory chip of the semiconductor memory 10 to another block (or to the certain block) after executing error correction.

1.2.1 Patrol Operation

A patrol operation in the memory system 1 of the first embodiment is described. As an operation between the memory controller 20 and the semiconductor memory 10, in the first embodiment and the following embodiments, the operation between the memory controller 20 and the NAND memory chip 10_1 is illustrated by an example.

Figure 6:
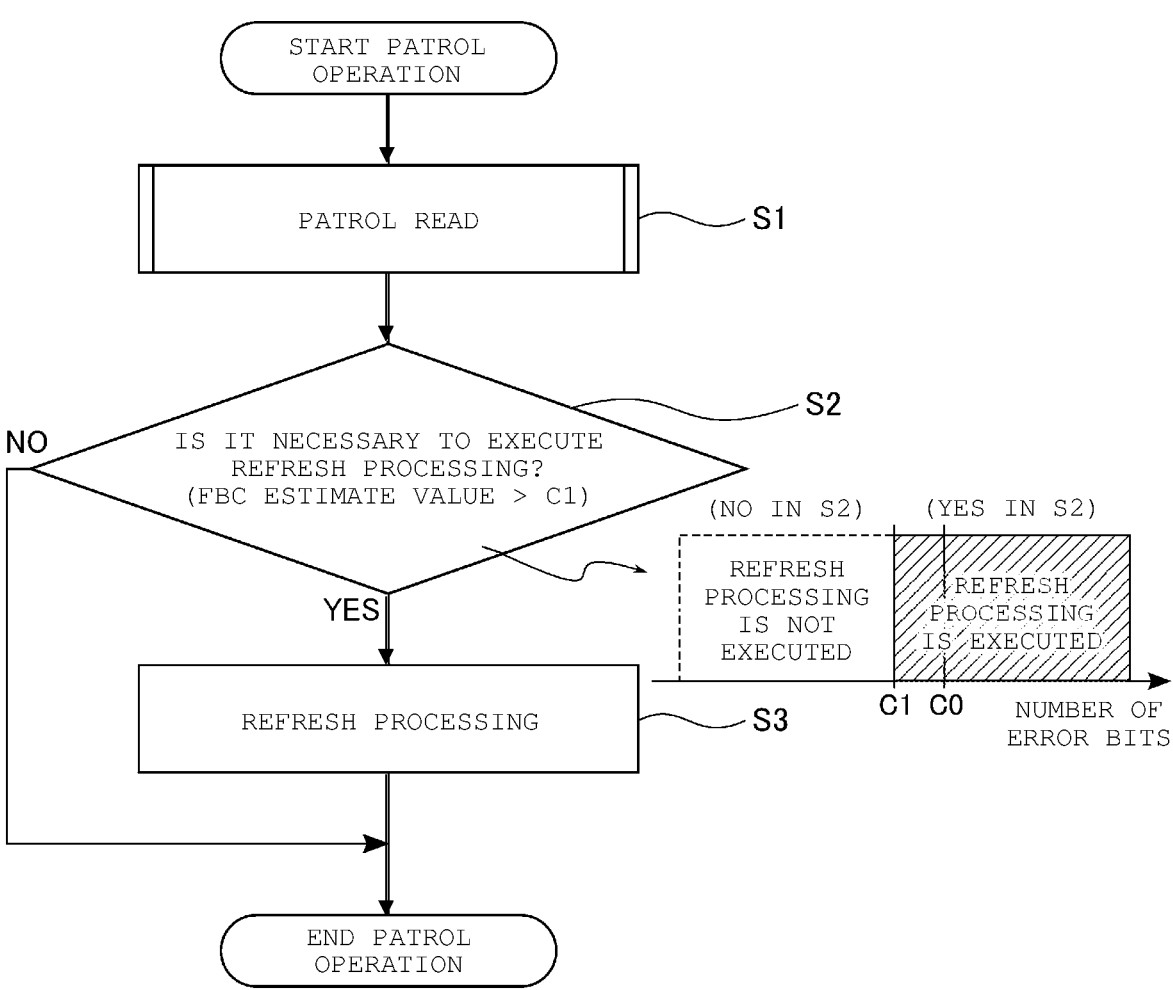
FIG. 6 is a flowchart showing a patrol operation according to the first embodiment.
Figure 8:
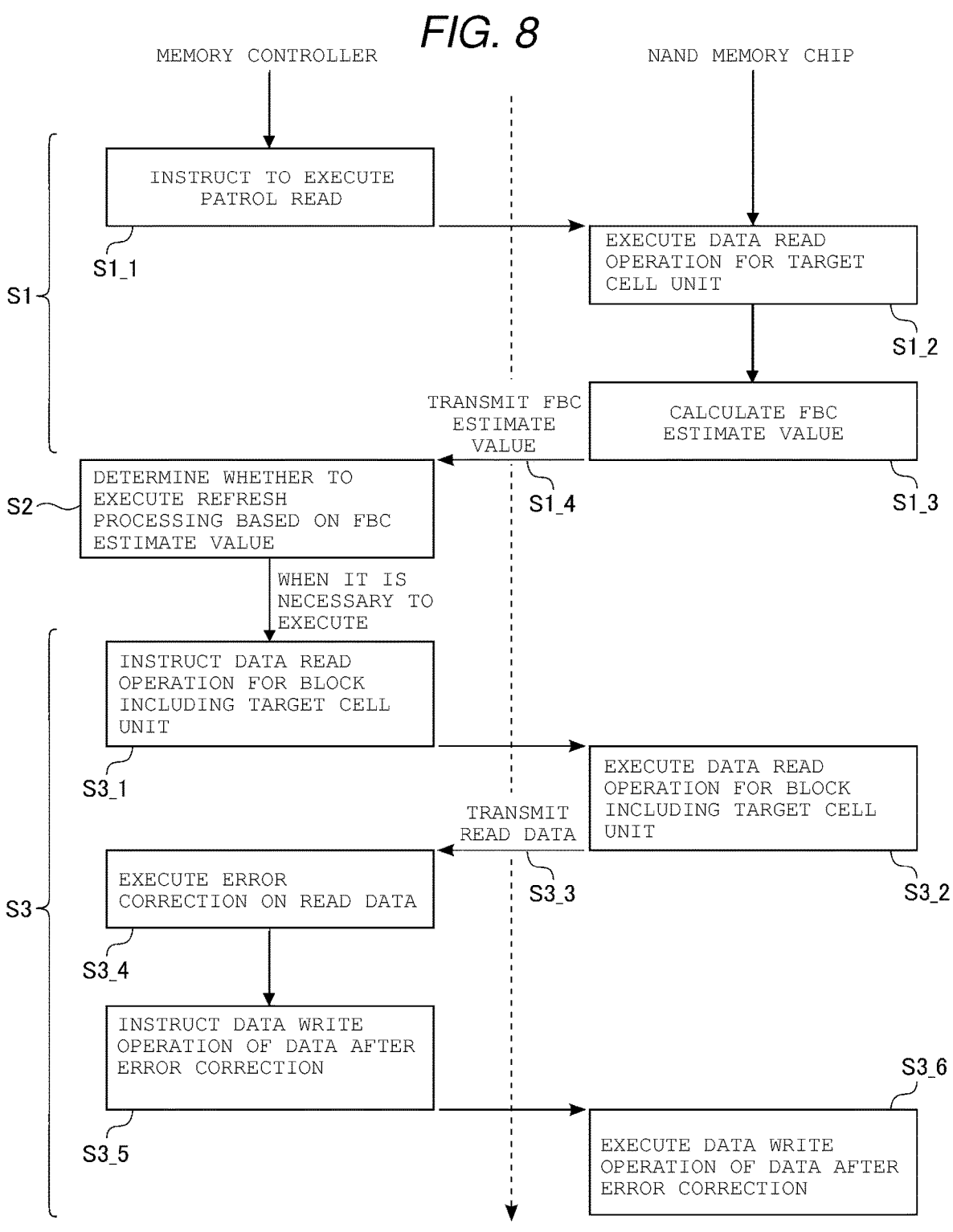
FIG. 8 is a sequence diagram showing the patrol operation according to the first embodiment.

FIG. 6 is a flowchart showing a patrol operation according to the first embodiment. FIG. 7 is a flowchart showing the operation of a patrol read in a patrol operation. The operation by the procedure shown in these flowcharts is instructed or executed by the memory controller 20 or the control circuit 16. FIG. 8 shows the operations of the memory controller 20 and the NAND memory chip 10_1 in the patrol operation, and transmission and reception of instructions and data.

The memory controller 20 starts a patrol operation as shown in FIG. 6. The patrol operation is started periodically (or irregularly).

When a patrol operation is started, a patrol read is executed (S1). That is, as shown in FIG. 8, the memory controller 20 instructs the NAND memory chip 10_1 to execute a patrol read (S1_1). When receiving an instruction to execute a patrol read, the NAND memory chip 10_1 starts a patrol read.

The operation of the patrol read is described with reference to FIGS. 7 and 8. The patrol read of the first embodiment is an operation in which a data read operation is executed for one cell unit CU (hereinafter, referred to as a target cell unit) among a plurality of cell units CU provided in the blocks BLK0 to BLKm of the NAND memory chip 10_1, and the NAND memory chip 10_1 calculates an estimate of the number of error bits in page data (hereinafter, referred to as target page data) stored in a target cell unit based on the read data. Hereafter, an estimate value of the number of error bits is referred to as an FBC estimate value.

When the patrol read is started, the control circuit 16 of the NAND memory chip 10_1 executes a data read operation for a target cell unit (S1_2).

Next, the FBC estimate value generation circuit 16A provided in the control circuit 16 of the NAND memory chip 10_1 calculates an FBC estimate value for target page data based on a read result obtained by the data read operation (S1_3). In the calculation of the FBC estimate value, the FBC estimate value is calculated by the FBC estimate value generation circuit 16A provided in the NAND memory chip 10_1 without the NAND memory chip 10_1 transferring the read target page data to the memory controller 20, that is, without correcting the error of the target page data by the ECC circuit 23_1 provided in the memory controller 20. The operation of calculating the FBC estimate value is described in detail later.

Next, the control circuit 16 transmits the FBC estimate value to the memory controller 20 (S1_4). Thus, the patrol read is finished.

Next, as shown in FIGS. 6 and 8, the refresh determination circuit 21A provided in the processor 21 of the memory controller 20 determines whether or not it is necessary to execute refresh processing based on the FBC estimate value (S2). That is, the refresh determination circuit 21A determines whether or not to rewrite the target page data based on the FBC estimate value.

Specifically, when the FBC estimate value is larger than a reference value (or threshold value) C1, the memory controller 20 determines that it is necessary to execute refresh processing. When it is necessary to execute refresh processing (YES in S2 of FIG. 6), the refresh processing is executed (S3). That is, the memory controller 20 instructs the NAND memory chip 10_1 to execute a data read operation on a block including the target cell unit (S3_1). When an instruction of the data read operation is received, the control circuit 16 executes the data read operation for the block including the target cell unit (S3_2). Then, the control circuit 16 transmits the read data to the memory controller 20 (S3_3).

Next, the memory controller 20 corrects an error of the read data with the ECC circuit 23_1 (S3_4). Then, the memory controller 20 instructs the NAND memory chip 10_1 to execute a data write operation of the data after error correction (S3_5). When receiving an instruction of the data write operation, the control circuit 16 executes the data write operation of the data after error correction (S3_6). That is, the control circuit 16 writes the data after error correction into a block provided in the NAND memory chip 10_1.

On the other hand, when the FBC estimate value is equal to or smaller than the reference value C1, the memory controller 20 determines that it is not necessary to execute refresh processing. When it is not necessary to execute refresh processing (NO in S2 of FIG. 6), the memory controller 20 ends the patrol operation.

The patrol operation is executed for each of a plurality of cell units provided in each of the blocks BLK0 to BLKm of the NAND memory chip 10_1. Similarly, the patrol operation is executed for each of the plurality of cell units provided in each of the blocks BLK0 to BLKm for the NAND memory chips 10_2 to 10_4. The patrol operation may be executed for only one cell unit among the plurality of cell units provided in each of the blocks BLK0 to BLKm of the NAND memory chips 10_1 to 10_4.

The refresh processing is executed for each block. When it is determined to execute the refresh processing on one piece of target page data in a certain block, the patrol operation is no longer executed for the remaining cell units in the block. After the patrol operation for the block is finished, the refresh processing is executed for the block.

Here, the reference value C1 used for determining the execution of refresh processing is described in detail. FIG. 6 shows a magnitude relationship between the reference value C1 and a reference value C0. The reference value C1 is a reference value to be compared with an FBC estimate value. The FBC estimate value is an estimate value of the number of error bits in target page data as described above. Therefore, the number of error bits calculated as an FBC estimate value may have an error. The reference value C0 is a reference value to be compared with the number of error bits, which is used for determining the execution of refresh processing, in a comparative example. That is, in the comparative example, a data read operation is executed for a target cell unit, and target page data is read. An ECC circuit corrects the error of the read target page data to obtain the exact number of error bits in the target page data. In order to determine whether or not a block is to be refreshed, the reference value C0 is used as a reference value to be compared with the exact number of error bits obtained in this way. In the present embodiment, the reference value C1 of an estimate value with an error is set to a value smaller than the reference value C0 to prevent a problem that refresh processing is not executed on a block that should be refreshed.

1.2.2 Calculation of FBC Estimate Value

Figure 9:
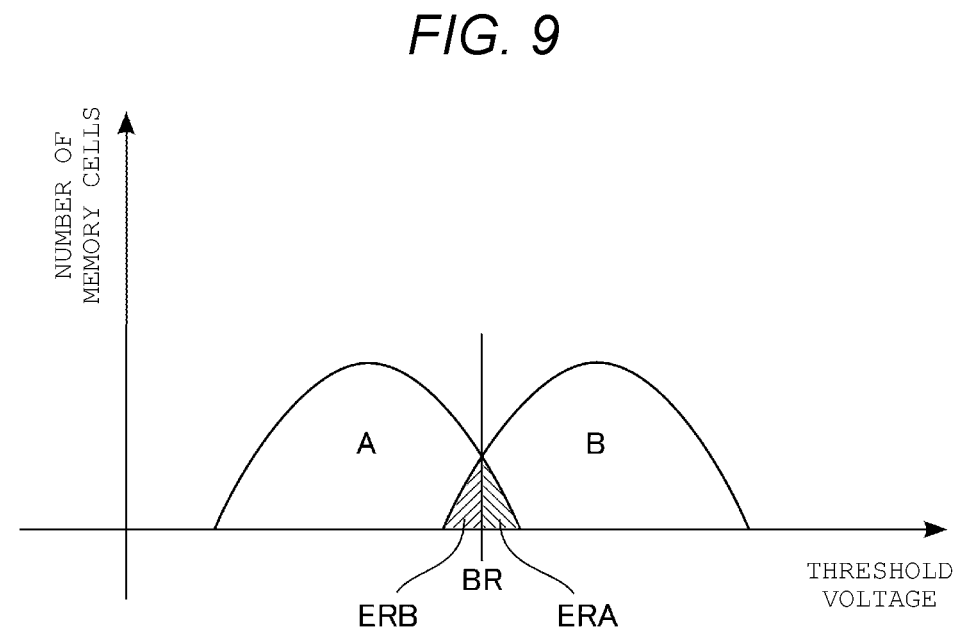

Next, the calculation of an FBC estimate value in a patrol read is described. First, the number of error bits is described. FIG. 9 is a diagram illustrating the number of error bits. FIG. 9 shows an example of executing a data read operation by using the read voltage BR for a memory cell assumed to be in the "A" state and the "B" state.

When memory cells belonging to the "A" state (that is, memory cells having data written so as to have the threshold voltage corresponding to the "A" state) are read by using the read voltage BR, memory cells having the threshold voltage equal to or lower than the read voltage BR are turned on, and memory cells having the threshold voltage higher than the read voltage BR are turned off. Here, a memory cell which is turned off is counted as an error bit (ERA in FIG. 9) because such a memory cell should be turned on as having written to the "A" state. Also, when memory cells belonging to the "B" state (that is, memory cells having data written so as to have the threshold voltage corresponding to the "B" state) are read by using the read voltage BR, memory cells having the threshold voltage equal to or lower than the read voltage BR are turned on, and memory cells having the threshold voltage equal to or higher than the read voltage BR are turned off. Here, a memory cell which is turned on is counted as an error bit (ERB in FIG. 9) because such a memory cell should be turned off as having written to the "B" state. The number of error bits is the sum of the number of memory cells in an area ERA shown in FIG. 9 and the number of memory cells in an area ERB.

As described above, in the memory system 1 of the first embodiment, the NAND memory chip 10_1 calculates an FBC estimate value. In the calculation of the FBC estimate value, the FBC estimate value is calculated without the NAND memory chip 10_1 transferring read target page data to the memory controller 20, that is, without correcting the error of the target page data by the ECC circuit 23_1 provided in the memory controller 20. Three methods are described below as an operation for calculating the FBC estimate value by the NAND memory chip 10_1.

1.2.2.1 Calculation Operation of FBC Estimate Value (4-Point Read Method)

First, a method for calculating an FBC estimate value from the number of turned-on memory cells obtained by a data read operation using four read voltages is described. Hereafter, a method for calculating an FBC estimate value by using four read voltages is referred to as a 4-point read method. The number of memory cells turned on by a data read operation using a certain read voltage is referred to as the number of on-cells in the read voltage.

In a 4-point read method, the FBC estimate value generation circuit 16A provided in the control circuit 16 obtains an approximate curve by a quadratic function based on the number of on-cells obtained from a target cell unit. Then, the FBC estimate value generation circuit 16A calculates a minimum value in the approximate curve by a quadratic function as the FBC estimate value. Here, an example of obtaining an approximate curve by a quadratic function is shown. Alternatively, an approximate curve may be obtained by a linear function or a cubic function, a spline curve, or a Bezier curve.

The operation of a 4-point read method is described with reference to FIG. 10. FIG. 10 shows the 4-point read method according to the first embodiment.

Figures 10A, 10B, 10C:
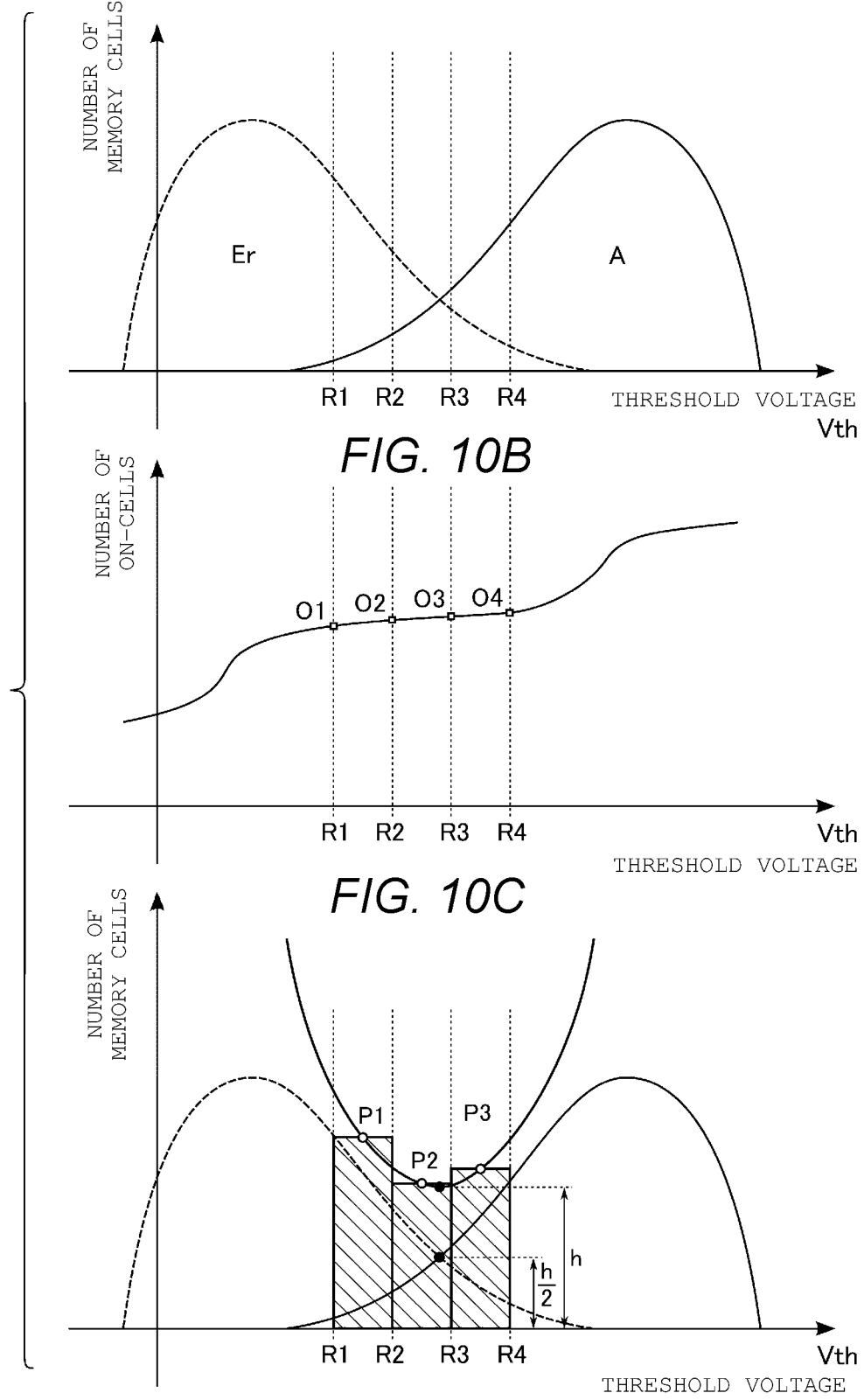
FIGS. 10A, 10B, and 10C are diagrams showing a 4-point read method according to the first embodiment.

First, as shown in FIG. 10A, the FBC estimate value generation circuit 16A sets four read voltages R1, R2, R3, and R4, for example, in a voltage between the threshold voltages of the "Er" state and the "A" state. The read voltages R1 to R4 are different from each other, and a difference between the read voltages R1 and R2, a difference between the read voltages R2 and R3, and a difference between the read voltages R3 and R4 are set to the same constant voltage difference. Here, a case is described in which these voltage differences are set to the same voltage difference, but these voltage differences may not be the same.

Next, the FBC estimate value generation circuit 16A executes data read operations by using the read voltages R1, R2, R3, and R4 for a target cell unit in the NAND memory chip 10_1, respectively, to acquire target tracking data. The target tracking data has the same size as, for example, page data. By these data read operations, the FBC estimate value generation circuit 16A obtains the numbers of on-cells O1, O2, O3, and O4 in the read voltages R1, R2, R3, and R4, respectively, as shown in FIG. 10B.

The numbers of on-cells O1, O2, O3, and O4 are the numbers of memory cells that are turned on by data read operations using the read voltages R1, R2, R3, and R4, respectively.

Next, as shown in FIG. 10C, the FBC estimate value generation circuit 16A obtains the difference between the two numbers of adjacent on-cells and the arithmetic mean of adjacent read voltages in the numbers of on-cells O1, O2, O3, and O4, respectively, to obtain difference points P1, P2, and P3.

The Y coordinate of the difference point P1 (that is, the number of memory cells) is obtained by the difference between the numbers of on-cells O2 and O1, and is expressed by "O2−O1". The Y-coordinate of the difference point P1 is the number of memory cells that are newly turned on as the read voltage rises from R1 to R2, and the number of memory cells of which the threshold voltage is present between the read voltages R1 and R2. The X-coordinate (that is, threshold voltage) of the difference point P1 is the arithmetic mean of the read voltages R1 and R2, and is expressed by "(R1+R2)/2". Therefore, the difference point P1($x$, $y$) is expressed by P1((R1+R2)/2, O2−O1).

Similarly, the difference point P2($x$, $y$) is expressed by P2((R2+R3)/2, O3−O2), and the difference point P3($x$, $y$) is expressed by P3((R3+R4)/2, O4−O3). As shown by the diagonal lines in FIG. 10C, histograms are obtained from the difference points P1, P2, and P3.

Next, as shown in FIG. 10C, the FBC estimate value generation circuit 16A calculates an approximate curve by a quadratic function passing through the difference points P1, P2, and P3. When the threshold voltage is V and the number of memory cells is C, the quadratic function can be expressed by $C=aV^2+bV+d$. Here, a, b, and d are constants, and a is a non-zero value. Next, the FBC estimate value generation circuit 16A calculates a minimum value h of the quadratic function $C=aV^2+bV+d$.

Here, it can be assumed that the height of the "intersection" of the distribution where the threshold voltage distributions of the "Er" state and the "A" state overlap corresponds to the minimum value h of the approximate curve by the quadratic function. For example, it can be assumed that the height (i.e., the number of memory cells) of the "intersection" is h/2 as shown in FIG. 10C. Further, the number of error bits in target page data is considered to be proportional to the height of the "intersection" of the distribution. As a result, the minimum value h is set as the FBC estimate value.

As described above, the FBC estimate value calculated by the FBC estimate value generation circuit 16A is the minimum value h of the quadratic function. The minimum value h can be expressed with about 2 bytes of data. The data size of the minimum value h is very small compared with the size of the target tracking data (for example, 16K bytes equal to the size of the page data). Consequently, when the minimum value h is transferred from the NAND memory chip to the memory controller 20, it is possible to reduce the amount of transferred data as compared with the case when the target tracking data is transferred from the NAND memory chip to the memory controller 20. As a result, the data transfer time from the NAND memory chip to the memory controller 20 can be shortened.

1.2.2.2 Calculation Operation of FBC Estimate Value (3-Point Read Method)

Next, a method for calculating an FBC estimate value from the number of on-cells obtained by a data read operation using three read voltages is described. Hereafter, a method for calculating an FBC estimate value by using three read voltages is referred to as a 3-point read method.

In a 3-point read method, the FBC estimate value generation circuit 16A obtains two linear functions based on the number of on-cells obtained from a target cell unit. Then, the FBC estimate value generation circuit 16A calculates the intersection of the two linear functions as the FBC estimate value.

The operation of a 3-point read method is described with reference to FIG. 11. FIG. 11 shows the 3-point read method according to the first embodiment.

First, as shown in FIG. 11A, the FBC estimate value generation circuit 16A of the control circuit 16 sets three read voltages R1, R2, and R3, for example, in a voltage between the threshold voltages of the "Er" state and the "A" state. The read voltages R1 to R3 are different from each other, and the difference between the read voltages R1 and R2 and the difference between the read voltages R2 and R3 are set to the same constant voltage difference. Here, a case is described in which these voltage differences are set to the same voltage difference. It is noted that these voltage differences may not be the same.

Next, the FBC estimate value generation circuit 16A executes data read operations by using the read voltages R1, R2, and R3 for a target cell unit in the NAND memory chip 10_1, respectively, to acquire target tracking data. By these data read operations, the FBC estimate value generation circuit 16A obtains the numbers of on-cells O1, O2, and O3 in the read voltages R1, R2, and R3, respectively, as shown in FIG. 11B.

The numbers of on-cells O1, O2, and O3 are the numbers of memory cells that are turned on by data read operations using the read voltages R1, R2, and R3, respectively.

Next, as shown in FIG. 11C, the FBC estimate value generation circuit 16A obtains the difference between the two numbers of adjacent on-cells and the arithmetic mean of adjacent read voltages in the numbers of on-cells O1, O2, and O3, respectively, to obtain the difference points P1 and P2.

Similarly to the 4-point read method, the difference point P1($x$, $y$) is expressed by P1((R1+R2)/2, O2−O1), and the difference point P2($x$, $y$) is expressed by P2((R2+R3)/2, O3−O2). As shown by the diagonal lines in FIG. 11C, histograms are obtained from the difference points P1 and P2.

Next, as shown in FIG. 11C, the FBC estimate value generation circuit 16A obtains a rectangle connecting four points: the difference points P1 and P2, orthogonal projection of the difference point P1 to the X axis (that is, ((R1+R2)/2, 0), and orthogonal projection of the difference point P2 to the X axis (that is, ((R2+R3)/2, 0)). Further, the FBC estimate value generation circuit 16A regards the diagonal line of the rectangle as a linear function. Next, the FBC estimate value generation circuit 16A calculates an intersection of two diagonal lines, that is, two linear functions.

Here, it can be assumed that the height of the "intersection" of the distribution where the threshold voltage distributions of the "Er" state and the "A" state overlap corresponds to the intersection of the two linear functions, of which Y coordinate is a value of J as shown in FIG. 11C. Further, the number of error bits in target page data is considered to be proportional to the height of the "intersection" of the distribution. As a result, the value J of the Y coordinate at the intersection of the two linear functions is set as the FBC estimate value.

As described above, the FBC estimate value calculated by the FBC estimate value generation circuit 16A is the value J of the Y coordinate at the intersection of the two linear functions. The value J can be expressed with about 2 bytes of data. The data size of the value J is very small as compared with the size of the target tracking data. Consequently, when the value J is transferred from the NAND memory chip to the memory controller 20, it is possible to reduce the amount of transferred data as compared with the case when the target tracking data is transferred from the NAND memory chip to the memory controller 20. As a result, the data transfer time from the NAND memory chip to the memory controller 20 can be shortened.

1.2.2.3 Calculation Operation of FBC Estimate Value (1-Point Read Method)

Next, a method for calculating an FBC estimate value from the number of turned-off memory cells obtained by a data read operation using one read voltage is described. Hereafter, a method for calculating an FBC estimate value by using one read voltage is referred to as a 1-point read method. The number of memory cells turned off by a data read operation using a certain read voltage is referred to as the number of off-cells in the read voltage.

In a 1-point read method, the ratio of the number of off-cells to the number of memory cells in a target cell unit is obtained. Then, the FBC estimate value is calculated based on the ratio of the number of off-cells.

Figures 12, 13:
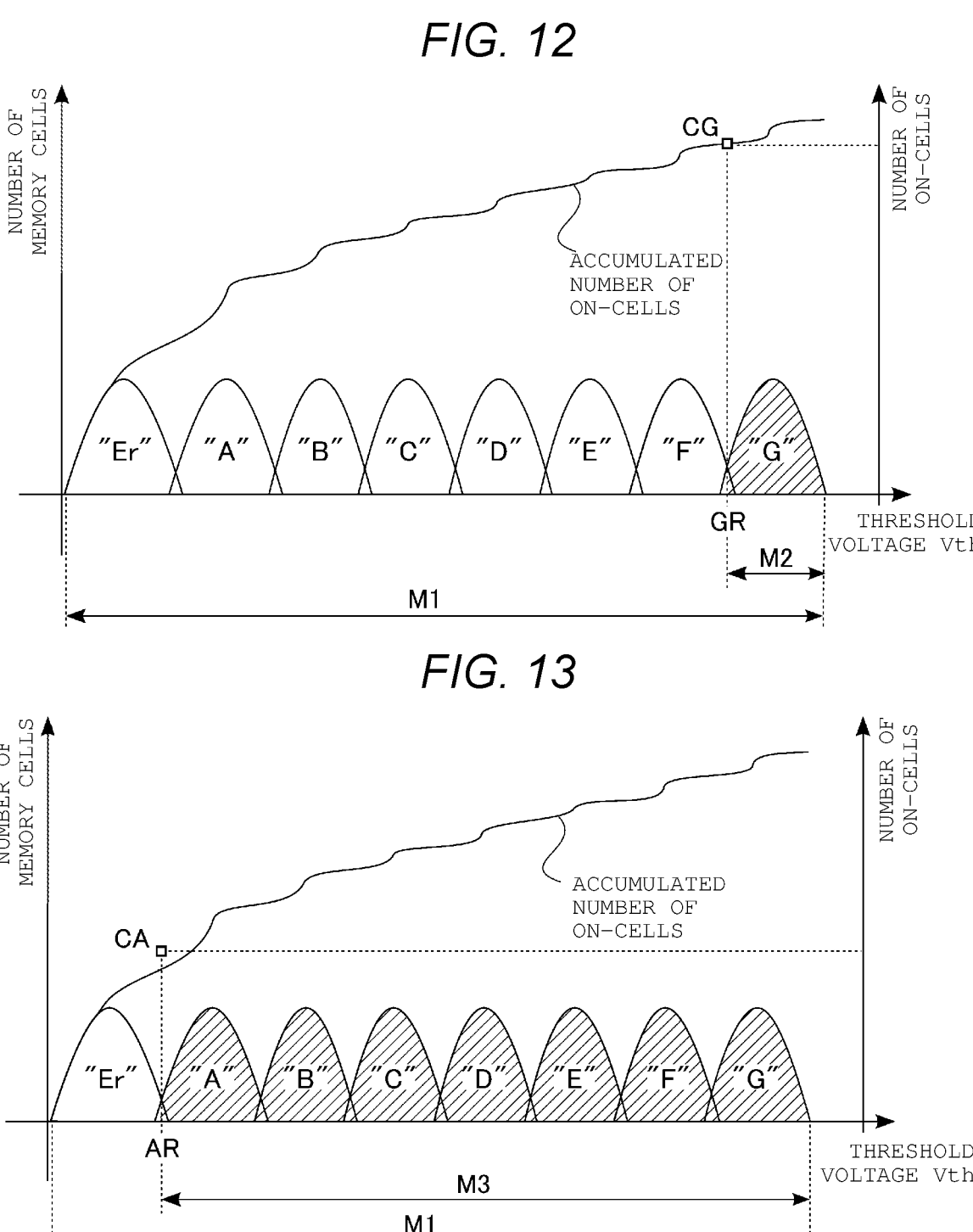
FIG. 12 is a diagram showing a 1-point read method according to the first embodiment.
FIG. 13 is a diagram showing another example of the 1-point read method according to the first embodiment.

The operation of a 1-point read method is described with reference to FIG. 12. FIG. 12 shows the 1-point read method according to the first embodiment.

First, as shown in FIG. 12, the FBC estimate value generation circuit 16A in the control circuit 16 sets, for example, the read voltage GR for the "G" state. The read voltage GR is a read voltage for determining between the "G" state having the highest threshold voltage distribution and the other "Er" to "F" states. Specifically, the read voltage GR is a read voltage suitable for a data read operation when less time has passed after a data write operation, that is, when a data retention error is not much of a concern. This read voltage is referred to as a normal read voltage, and this read voltage is set, for example, at the time of manufacture of the NAND memory chip. For the normal read voltage, for example, when the tracking operation described in the fifth embodiment described below is executed, an appropriate read voltage determined by the tracking operation may be used.

Next, the FBC estimate value generation circuit 16A executes a data read operation for a target cell unit in the NAND memory chip 10_1 by using the read voltage GR. By this data read operation, the FBC estimate value generation circuit 16A obtains the number of on-cells CG in the read voltage GR as shown in FIG. 12. In an example shown in FIG. 12, the number of on-cells CG is the number obtained by accumulating the number of on-cells in the "Er" state to a part of the "G" state.

Next, the FBC estimate value generation circuit 16A subtracts the number of on-cells CG from the number of memory cells M1 provided in the target cell unit to obtain the number of off-cells M2 in the target cell unit. Further, the FBC estimate value generation circuit 16A calculates a ratio K1 of the number of off-cells M2 to the number of memory cells M1 in the target cell unit.

Here, it is considered that the number of error bits in the target page data has a correlation with the ratio K1 of the number of off-cells. The "G" state is one of the eight states from the "Er" state to the "G" state. Therefore, when randomized data is written into the target cell unit, the expected value of the ratio of the number of memory cells in the "G" state to the number of memory cells in the target cell unit is ⅛ (=12.5%). When the difference between the ratio K1 of the number of off-cells and the expected value is large, it is highly likely that the threshold voltage distribution of the target cell unit deviates from an ideal state (that is, a state in which the ratio of the number of memory cells in each state to the number of memory cells in the target cell unit is 12.5%). When the threshold voltage distribution of the target cell unit deviates from the ideal state, the ratio K1 of the number of off-cells may be larger or smaller than the expected value. As a result, in the 1-point read method, the difference between the ratio (K1) of the number of off-cells and the expected value (12.5%) is set as the FBC estimate value.

As described above, the FBC estimate value calculated by the FBC estimate value generation circuit 16A is the difference between the ratio K1 of the number of off-cells and the expected value. The difference between the ratio K1 and the expected value can be expressed with about 2 bytes of data. For example, the data size of the difference between the ratio K1 and the expected value is very small compared with the size of the target tracking data. Consequently, when the difference between the ratio K1 and the expected value is transferred from the NAND memory chip to the memory controller 20, it is possible to reduce the amount of transferred data as compared with the case when the target tracking data is transferred from the NAND memory chip to the memory controller 20. As a result, the data transfer time from the NAND memory chip to the memory controller 20 can be shortened.

Next, another operation example of the 1-point read method is described with reference to FIG. 13. FIG. 13 is a diagram showing another example of the 1-point read method according to the first embodiment.

In the 1-point read method, an FBC estimate value is calculated by a data read operation using the read voltage GR for the "G" state. Alternatively, the FBC estimate value may be calculated by a data read operation using the read voltage AR for the "A" state.

As shown in FIG. 13, the FBC estimate value generation circuit 16A in the control circuit 16 sets the read voltage AR for the "A" state. The read voltage AR is a read voltage for determining between the "Er" state having the lowest threshold voltage distribution and the other "A" to "G" states.

Next, the FBC estimate value generation circuit 16A executes a data read operation for the target cell unit in the NAND memory chip 10_1 by using the read voltage AR. According to the data read operation, the FBC estimate value generation circuit 16A obtains the number of on-cells CA in the read voltage AR as shown in FIG. 13. In an example shown in FIG. 13, the number of on-cells CA is the number obtained by adding the number of on-cells in the "Er" state and a part of the "A" state.

Next, the FBC estimate value generation circuit 16A subtracts the number of on-cells CA from the number of memory cells M1 provided in the target cell unit to obtain the number of off-cells M3 in the target cell unit. Further, the FBC estimate value generation circuit 16A calculates a ratio K2 of the number of off-cells M3 to the number of memory cells M1 in the target cell unit.

Here, it is considered that the number of error bits in the target page data has a correlation with the ratio K2 of the number of off-cells. The "Er" state is one of the eight states from the "Er" state to the "G" state. Therefore, when randomized data is written into the target cell unit, the expected value of the ratio of the number of memory cells in the states other than the "Er" state, that is, the number of memory cells in the "A" to "G" states to the number of memory cells in the target cell unit is ⅞ (=87.5%). In this 1-point read method, the difference between the ratio K2 of the number of off-cells and the expected value (87.5%) is set as the FBC estimate value.

As in the example above, when obtaining the number of on-cells CA in the read voltage AR, the expected value of a ratio K3 of the number of memory cells in the "Er" state to the number of memory cells M1 in the target cell unit is ⅛ (=12.5%). The FBC estimate value generation circuit 16A may set the difference between the ratio K3 of the number of on-cells CA and the expected value (12.5%) as the FBC estimate value.

1.3. Effects of First Embodiment

According to the first embodiment, it is possible to provide a memory system capable of reducing the time required for a patrol operation.

In the configuration of the first embodiment, a NAND memory chip includes the FBC estimate value generation circuit 16A for calculating an FBC estimate value. The FBC estimate value generation circuit 16A executes a data read operation by using one or a plurality of read voltages for a target cell unit to calculate the FBC estimate value based on the obtained number of on-cells or the number of off-cells. The FBC estimate value is a value for estimating the number of error bits in the target page data. The calculated FBC estimate value is transferred from the NAND memory chip to the memory controller 20. The memory controller 20 compares the FBC estimate value with the reference value C1 and determines whether or not to execute refresh processing according to the comparison result. The NAND memory chip needs to transmit only the FBC estimate value without transmitting the target tracking data. Thus, it is possible to reduce the size of data transferred from the NAND memory chip to the memory controller 20. As a result, it is possible to reduce the time required from a data read operation of a target cell unit to obtain data (that is, an FBC estimate value) for determining the execution of refresh processing in a patrol operation.

2. Second Embodiment

A memory system of a second embodiment is described. In the second embodiment, the NAND memory chip 10_1 does not calculate an FBC estimate value, and the NAND memory chip 10_1 outputs components for calculating the FBC estimate value to the memory controller 20. The memory controller 20 calculates the FBC estimate value based on the received components. In the second embodiment, the points different from the first embodiment are mainly described.

2.1 Configuration

2.1.1 Memory System

Figure 14:
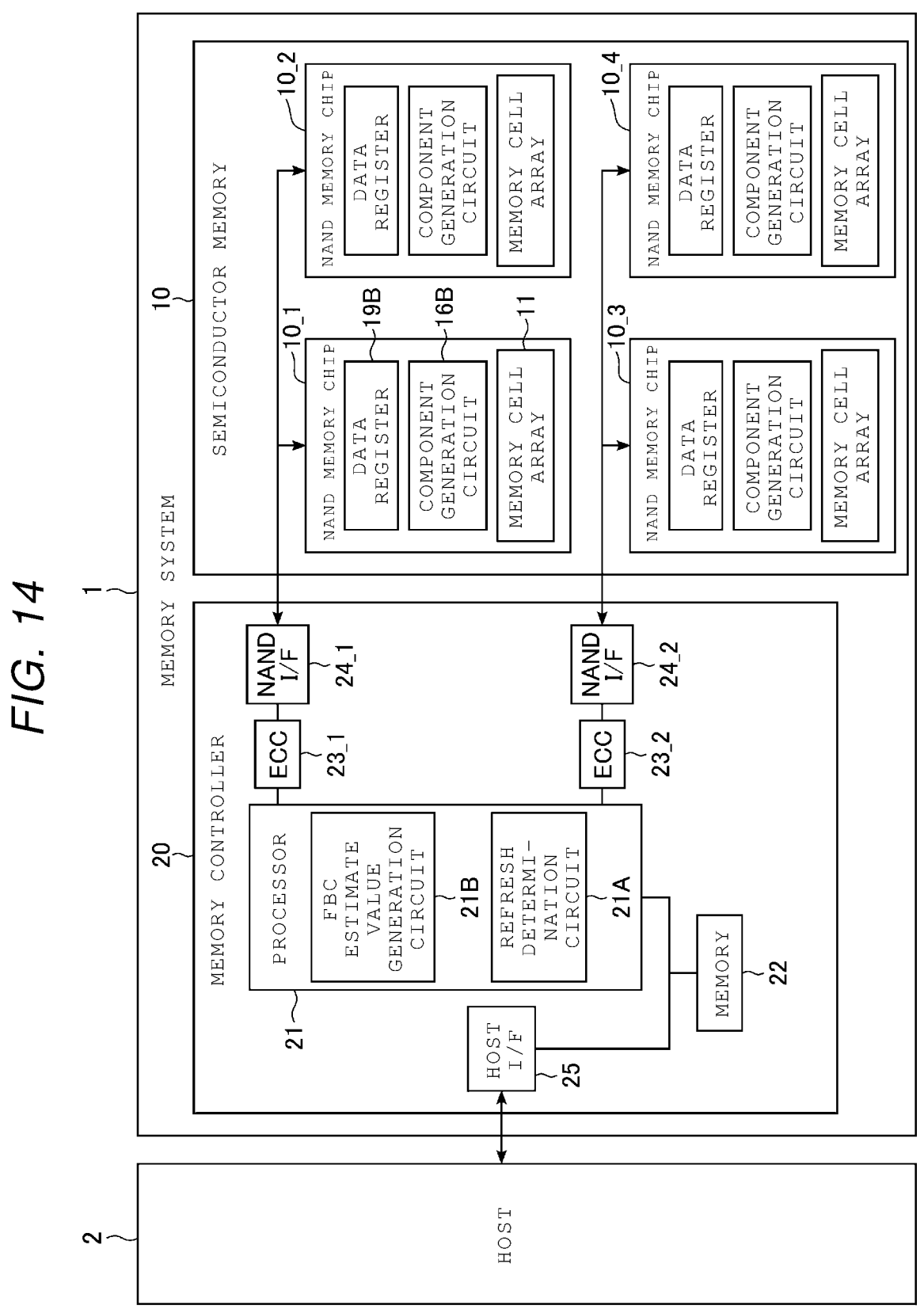
FIG. 14 is a block diagram showing a configuration of a memory system according to a second embodiment.

The configuration of a memory system of the second embodiment is described. FIG. 14 is a block diagram showing the configuration of a memory system according to the second embodiment.

The memory system 1 includes the semiconductor memory 10 and the memory controller 20.

2.1.2 Memory Controller

Next, the configuration of the memory controller 20 is described with reference to FIG. 14. The memory controller 20 includes the processor 21, the memory 22, the ECC circuits 23_1 and 23_2, the NAND interface circuits 24_1 and 24_2, and the host interface circuit 25.

The processor 21 includes the refresh determination circuit 21A and an FBC estimate value generation circuit 21B. The refresh determination circuit 21A determines whether or not to execute refresh processing based on an FBC estimate value. The FBC estimate value generation circuit 21B calculates the FBC estimate value based on the components of the FBC estimate value. The FBC estimate value generation circuit 21B is described below. Functions of the processor 21 (and the refresh determination circuit 21A and the FBC estimate value generation circuit 21B) described in the present specification may be implemented by executing software (or firmware) by the processor 21 or may be implemented by hardware (or a dedicated circuit).

The other configuration of the memory controller 20 is the same as the first embodiment described above.

2.1.3 Semiconductor Memory

Next, the configuration of the NAND memory chips 10_1 to 10_4 provided in the semiconductor memory 10 is described. The configuration of the NAND memory chip 10_1 is described below. The configuration of each of the other NAND memory chips 10_2 to 10_4 is the same as that of the NAND memory chip 10_1.

Figure 15:
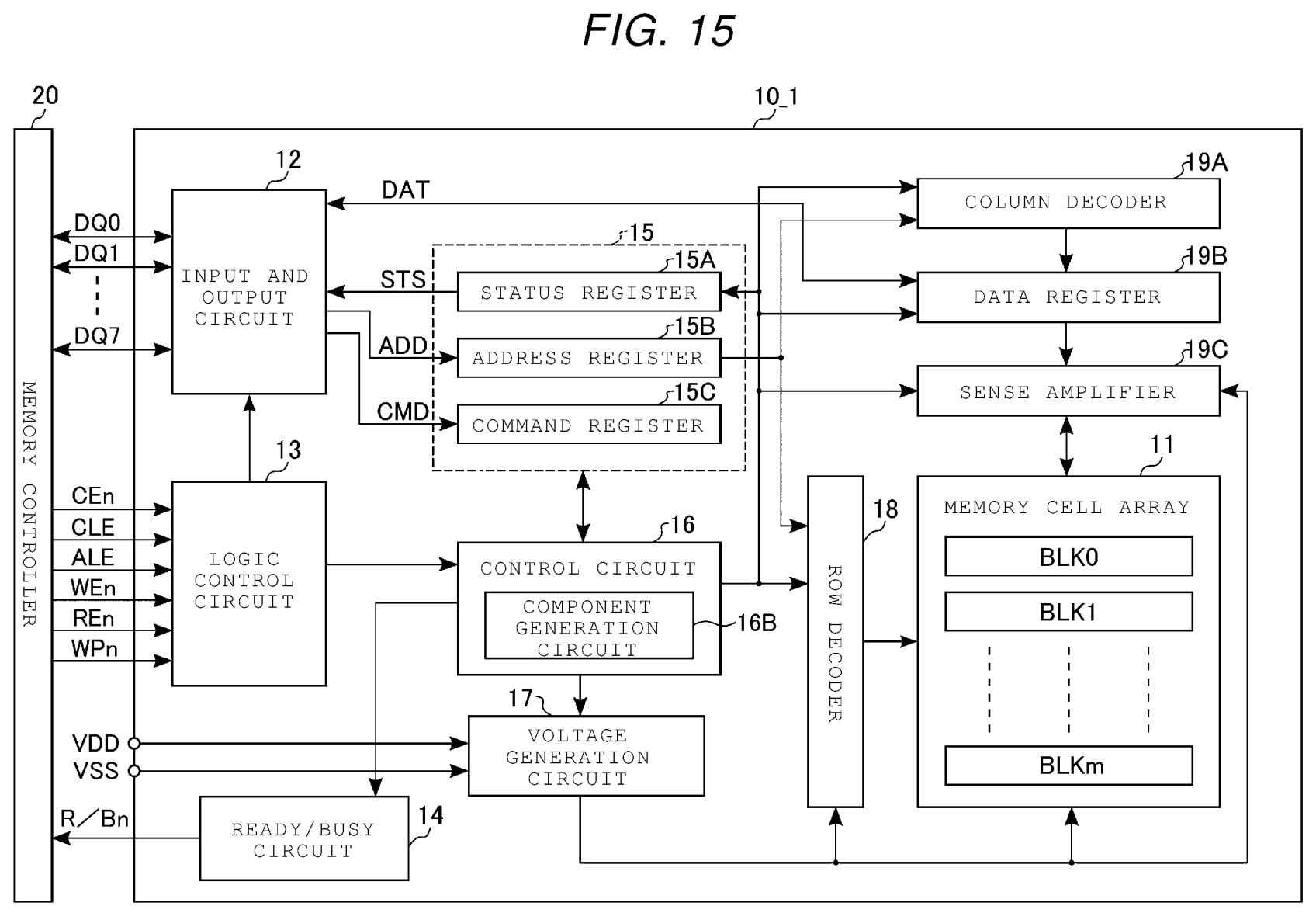

FIG. 15 is a diagram showing the configuration of the NAND memory chip 10_1 according to the second embodiment.

The NAND memory chip 10_1 includes the memory cell array 11, the input/output circuit 12, the logic control circuit 13, the ready/busy circuit 14, the register group 15, the control circuit 16, the voltage generation circuit 17, the row decoder 18, the column decoder 19A, the data register 19B, and the sense amplifier 19C.

The control circuit 16 includes a component generation circuit 16B. The component generation circuit 16B generates components for calculating an FBC estimate value. The component generation circuit 16B is described later. The functions of the control circuit (and the component generation circuit 16B) described in the present specification may be implemented by the control circuit 16 executing software (or firmware) or may be implemented by hardware (or a dedicated circuit).

The other configuration of the NAND memory chip 10_1 is the same as the first embodiment described above.

2.2 Operation

An operation in the memory system 1 of the second embodiment is described.

2.2.1 Patrol Operation

Figure 16:
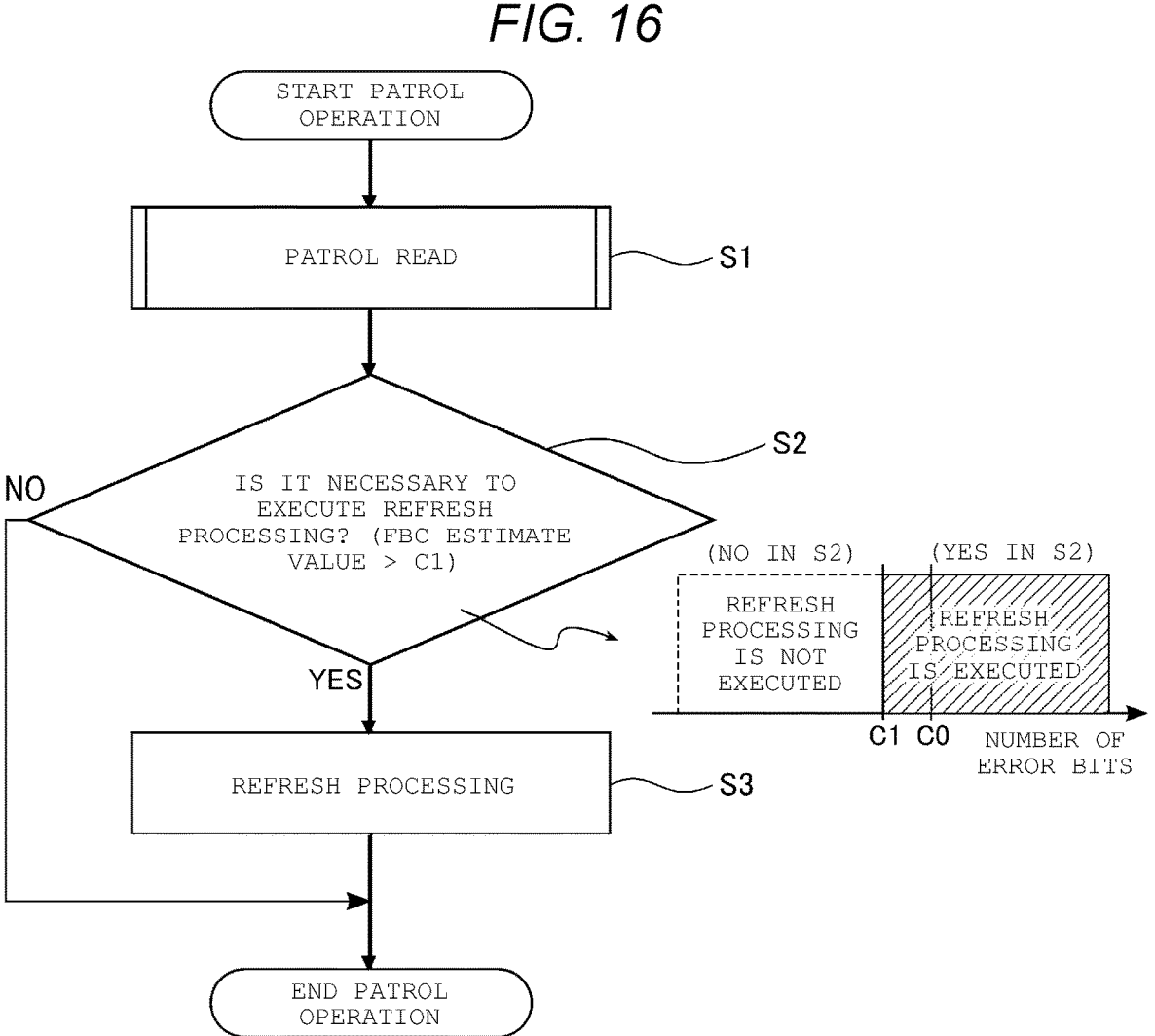
FIG. 16 is a flowchart showing a patrol operation according to the second embodiment.
Figure 18:
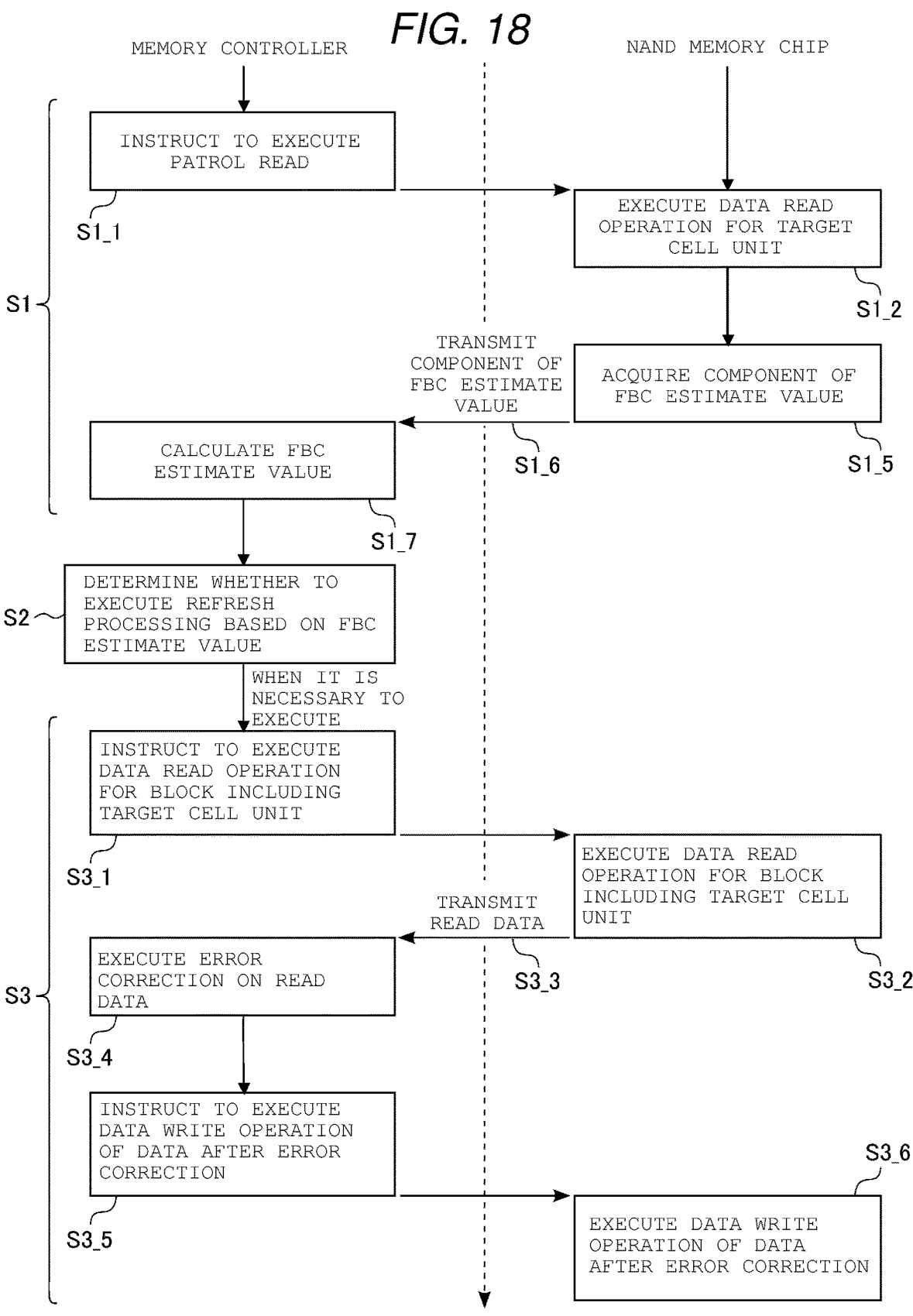
FIG. 18 is a sequence diagram showing the patrol operation according to the second embodiment.

A patrol operation in the memory system 1 of the second embodiment is described. FIG. 16 is a flowchart showing a patrol operation according to the second embodiment, and is the same as the first embodiment shown in FIG. 6. FIG. 17 is a flowchart showing the operation of a patrol read in a patrol operation. The operation by the procedure shown in these flowcharts is instructed or executed by the memory controller 20 or the control circuit 16. FIG. 18 is a diagram showing the operations of the memory controller 20 and the NAND memory chip 10_1 in the patrol operation, and transmission and reception of instructions and data.

The memory controller 20 starts a patrol operation as shown in FIG. 16. The patrol operation is started periodically (or irregularly).

When a patrol operation is started, a patrol read is executed (S1). That is, as shown in FIG. 18, the memory controller 20 instructs the NAND memory chip 10_1 to execute a patrol read (S1_1). When receiving an instruction to execute a patrol read, the NAND memory chip 10_1 starts a patrol read.

The operation of a patrol read is described with reference to FIGS. 17 and 18. The patrol read of the second embodiment is an operation in which the NAND memory chip 10_1 executes a data read operation for a target cell unit to acquire components for calculating an FBC estimate value and transmit the component to the memory controller 20. Therefore, it is also possible to interpret an instruction to execute a patrol read as an instruction to obtain the component of the FBC estimate value.

When the patrol read is started, the control circuit 16 of the NAND memory chip 10_1 executes a data read operation for a target cell unit (S1_2).

Next, the component generation circuit 16B provided in the control circuit 16 of the NAND memory chip 10_1 acquires components for calculating an FBC estimate value (S1_5). The components of the FBC estimate value include, for example, a plurality of read voltages and the number of on-cells in each read voltage. Alternatively, the components of the FBC estimate value include a read voltage of one lowest (or highest) read voltage among a plurality of read voltages, a voltage difference between the read voltage and another read voltage, and the number of on-cells in each read voltage.

Then, the control circuit 16 transmits the components of the FBC estimate value to the memory controller 20 (S1_6).

Next, the FBC estimate value generation circuit 21B provided in the processor 21 of the memory controller 20 calculates the FBC estimate value for the target page data based on the received components of the FBC estimate value (S1_7). In the calculation of the FBC estimate value, the FBC estimate value is calculated by the FBC estimate value generation circuit 21B provided in the memory controller 20 without the NAND memory chip 10_1 transferring the read target page data to the memory controller 20, that is, without correcting an error of the target page data by the ECC circuit 23_1 provided in the memory controller 20. The operation of the calculation of the FBC estimate value is described later. Thus, the patrol read ends.

Next, as shown in FIGS. 16 and 18, the refresh determination circuit 21A provided in the processor 21 of the memory controller 20 determines whether or not it is necessary to execute refresh processing based on the FBC estimate value (S2). The refresh processing illustrated in step S3 of FIGS. 16 and 18 is the same as that of the first embodiment illustrated in step S3 of FIGS. 6 and 8. Further, the reference value C1 used for determining the execution of refresh processing is the same as the first embodiment.

2.2.2 Calculation of FBC Estimate Value

Next, the calculation of an FBC estimate value in a patrol read is described. As described above, in the memory system 1 of the second embodiment, the components of an FBC estimate value are acquired in the NAND memory chip and the components are transferred to the memory controller 20. The memory controller 20 calculates the FBC estimate value based on the components of the FBC estimate value. Two methods are described below as an operation for calculating the FBC estimate value by the memory controller 20.

2.2.2.1 Calculation Operation of FBC Estimate Value (4-Point Read Method)

First, the operation of a 4-point read method in the memory system 1 of the second embodiment is described. In the 4-point read method, the FBC estimate value generation circuit 21B provided in the processor 21 obtains an approximate curve by a quadratic function based on the number of on-cells obtained from a target cell unit. Then, the FBC estimate value generation circuit 21B calculates the minimum value h in the approximate curve by a quadratic function as the FBC estimate value.

The operation of the 4-point read method in the second embodiment is the same as that of the first embodiment described with reference to FIGS. 10A to 10C, except that it is the FBC estimate value generation circuit 21B of the processor 21 of the memory controller 20 that generates the FBC estimate value and the FBC estimate value generation circuit 21B uses the components of the FBC estimate value acquired by the component generation circuit 16B provided in the control circuit 16.

2.2.2.2 Calculation Operation of FBC Estimate Value (3-Point Read Method)

Next, the operation of a 3-point read method in the memory system 1 of the second embodiment is described. In the 3-point read method, the FBC estimate value generation circuit 21B obtains two linear functions based on the number of on-cells obtained from a target cell unit. Then, the FBC estimate value generation circuit 21B calculates the intersection of the two linear functions as the FBC estimate value.

The operation of a 3-point read method in the second embodiment is the same as that of the first embodiment described with reference to FIGS. 11A to 11C, except that it is the FBC estimate value generation circuit 21B of the processor 21 of the memory controller 20 that generates the FBC estimate value and the FBC estimate value generation circuit 21B uses the components of the FBC estimate value acquired by the component generation circuit 16B provided in the control circuit 16.

2.3. Effects of Second Embodiment

According to the second embodiment, it is possible to provide a memory system capable of reducing the time required for a patrol operation.

In the configuration of the second embodiment, the NAND memory chip includes the component generation circuit 16B, and the memory controller 20 includes the FBC estimate value generation circuit 21B. The component generation circuit 16B generates components for calculating an FBC estimate value. The component generation circuit 16B executes a data read operation by using a plurality of read voltages for a target cell unit and transmits components (for example, read voltage and the number of on-cells) to the memory controller 20. The memory controller 20 calculates an FBC estimate value based on the received components. The memory controller 20 compares the FBC estimate value with the reference value C1 and determines whether or not to execute refresh processing according to the comparison result. The NAND memory chip needs to transmit only the components without transmitting the target tracking data. Thus, it is possible to reduce the amount of data transferred from the NAND memory chip to the memory controller 20. As a result, it is possible to reduce the time required from a data read operation of a target cell unit to obtain data (that is, an FBC estimate value) for determining the execution of refresh processing in a patrol operation.

3. Third Embodiment

A memory system of a third embodiment is described. In the third embodiment, a first-stage patrol read and a second-stage patrol read having different purposes are executed. In the first-stage patrol read, it is determined whether or not to execute the second-stage patrol read. In the second-stage patrol read, it is determined whether or not to execute refresh processing by using target page data. Further, in the first-stage patrol read, the NAND memory chip 10_1 calculates an FBC estimate value, similarly to the first embodiment. In the third embodiment, the points different from the first embodiment are mainly described.

3.1 Configuration

The configuration and structure of the memory controller 20 and the semiconductor memory 10 provided in the memory system 1 of the third embodiment are the same as those of the first embodiment described above.

3.2 Operation

An operation in the memory system 1 of the third embodiment is described.

3.2.1 Patrol Operation

A patrol operation in the memory system 1 of the third embodiment is described. In the patrol operation of the third embodiment, the NAND memory chip 10_1 calculates an FBC estimate value in the first-stage patrol read, and the memory controller 20 determines whether or not to execute the second-stage patrol read by using the FBC estimate value. Further, the memory controller 20 determines whether or not to execute refresh processing in the second-stage patrol read. Hereinafter, the first-stage patrol read is also referred to as a first patrol read, and the second-stage patrol read is also referred to as a second patrol read.

FIG. 19 is a flowchart showing a patrol operation according to the third embodiment. FIG. 20 is a flowchart showing the operation of a first patrol read in the patrol operation. FIG. 21 is a flowchart showing the operation of a second patrol read in the patrol operation. The operation by the procedure shown in these flowcharts is instructed or executed by the memory controller 20 or the control circuit 16. FIG. 22 is a diagram showing the operations of the memory controller 20 and the NAND memory chip 10_1 in the patrol operation, and transmission and reception of instructions and data.

The memory controller 20 starts a patrol operation as shown in FIG. 19. The patrol operation is started periodically (or irregularly).

When a patrol operation is started, a first patrol read is executed (S11). The first patrol read illustrated in steps S11_2, S11_3, and S11_4 of FIGS. 20 and 22 is the same as the patrol read of the first embodiment illustrated in steps S1_2, S1_3, and S1_4 of FIGS. 7 and 8.

Next, as shown in FIGS. 19 and 22, the processor 21 of the memory controller 20 determines whether or not it is necessary to execute the second patrol read based on the FBC estimate value (S12).

Specifically, when the FBC estimate value is larger than a reference value (or threshold value) C1a, the memory controller 20 determines that it is necessary to execute the second patrol read. When it is necessary to execute the second patrol read (YES in S12 of FIG. 19), the memory controller 20 instructs the NAND memory chip 10_1 to execute the second patrol read (S13_1 in FIG. 22). When receiving an instruction to execute the second patrol read, the NAND memory chip 10_1 executes the second patrol read (S13 in FIG. 19). On the other hand, when the FBC estimate value is equal to or smaller than the reference value C1a, the memory controller 20 determines that it is not necessary to execute the second patrol read. When it is not necessary to execute the second patrol read (NO in S12 of FIG. 19), the memory controller 20 ends the patrol operation.

Here, the reference value C1a used for determining the execution of the second patrol read will be described in detail. FIG. 19 shows the magnitude relationship between the reference value C1a and a reference value C2. The reference value C1a is a reference value to be compared with the FBC estimate value. The FBC estimate value is an estimate value of the number of error bits in target page data as described above. Therefore, the number of error bits calculated as the FBC estimate value may have an error. The reference value C2 is a reference value to be compared with the exact number of error bits in the target page data as described below. Therefore, in order to prevent a problem that a second patrol read is not executed despite the need to execute the second patrol read, the reference value C1a of the estimate value with an error is set to a value smaller than the reference value C2.

The reference value C1$a$ is not particularly related in magnitude as compared with the reference value C1 in the first embodiment. For example, the reference value C1$a$ is set to the same value as the reference value C1 or to a value higher than the reference value C1.

The operation of the second patrol read is described with reference to FIGS. 21 and 22. When a second patrol read is started, the control circuit 16 of the NAND memory chip 10_1 executes a data read operation by using the read voltages AR, BR, CR, DR, ER, FR, and GR for a target cell unit in the NAND memory chip 10_1 (S13_2). Then, the control circuit 16 transmits the target page data obtained by the data read operation to the memory controller 20 (S13_3). Then, the memory controller 20 corrects an error of the target page data with the ECC circuit 23_1 to calculate the number of error bits (S13_4). Thus, the second patrol read ends.

Next, as shown in FIGS. 19 and 22, the refresh determination circuit 21A provided in the processor 21 of the memory controller 20 determines whether or not it is necessary to execute refresh processing based on the number of error bits (S14). That is, the refresh determination circuit 21A determines whether or not to rewrite the target page data based on the number of error bits.

Specifically, when the number of error bits is larger than the reference value (or threshold value) C2, the memory controller 20 determines that it is necessary to execute refresh processing. When it is necessary to execute refresh processing (YES in S14 of FIG. 19), refresh processing is executed (S15). The refresh processing illustrated in step S15 of FIGS. 19 and 22 is the same as that of the first embodiment illustrated in step S3 of FIGS. 6 and 8.

On the other hand, when the number of error bits is equal to or smaller than the reference value C2, the memory controller 20 determines that it is not necessary to execute refresh processing. When it is not necessary to execute refresh processing (NO in S14 of FIG. 19), the memory controller 20 ends the patrol operation.

3.2.2 Calculation of FBC Estimate Value

Next, the calculation of an FBC estimate value in the first patrol read is described. In the memory system 1 of the third embodiment, the NAND memory chip 10_1 calculates the FBC estimate value in the first patrol read as described above.

Three methods described in the first embodiment, that is, the 4-point read method, the 3-point read method, and the 1-point read method are used as the operations for calculating the FBC estimate value. The operations of these methods are the same as those of the first embodiment.

3.3. Effects of Third Embodiment

According to the third embodiment, it is possible to provide a memory system capable of reducing patrol time.

In the configuration of the third embodiment, in addition to the effects of the first embodiment, a patrol operation is executed in two stages, that is, a first-stage patrol read and a second-stage patrol read, thereby reducing the time required for the patrol operation. Further, in the second-stage patrol read, the ECC circuit corrects an error of the target page data and acquires the number of error bits, thereby maintaining a highly reliable data retention characteristic.

4. Fourth Embodiment

A memory system of a fourth embodiment is described. In the fourth embodiment, a first-stage patrol read and a second-stage patrol read are executed, similarly to the third embodiment. Further, in the first-stage patrol read, the NAND memory chip 10_1 transfers the components of the FBC estimate value to the memory controller 20, similarly to the second embodiment. The memory controller 20 calculates the FBC estimate value by using the components of the FBC estimate value. In the fourth embodiment, the points different from the second and third embodiments are mainly described.

4.1 Configuration

The configuration and structure of the memory controller 20 and the semiconductor memory 10 provided in the memory system 1 of the fourth embodiment are the same as those of the second embodiment described above.

4.2 Operation

An operation in the memory system 1 of the fourth embodiment is described.

4.2.1 Patrol Operation

A patrol operation in the memory system 1 of the fourth embodiment is described. In the patrol operation of the fourth embodiment, the NAND memory chip 10_1 transfers the components of an FBC estimate value to the memory controller 20 in a first patrol read, the memory controller 20 calculates the FBC estimate value, and the memory controller 20 determines whether or not to execute a second patrol read by using the FBC estimate value. Further, the memory controller 20 determines whether or not to execute refresh processing in the second patrol read.

Figure 25:
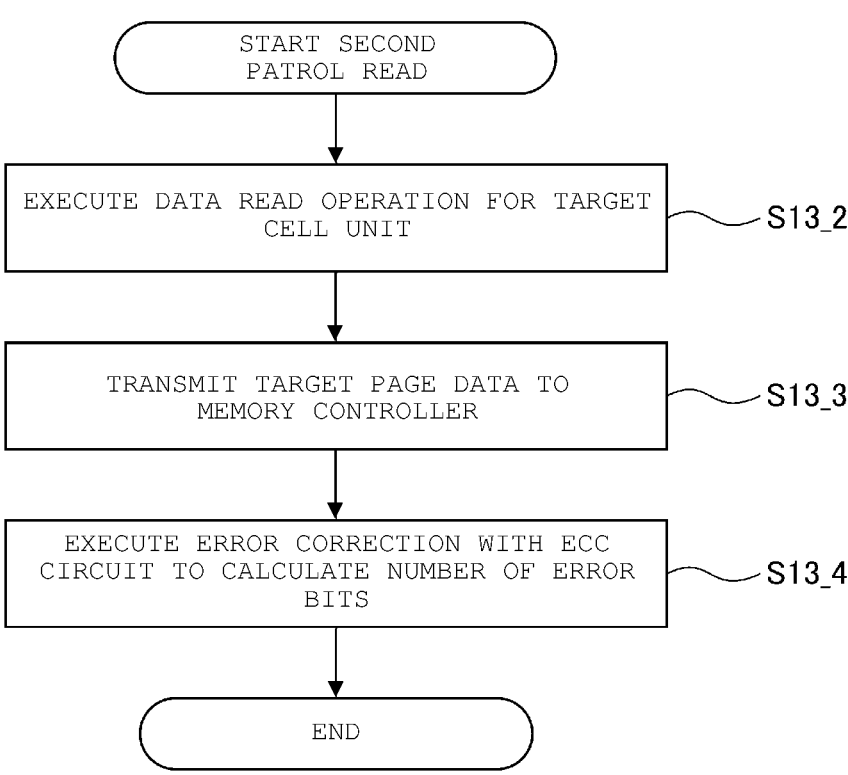
FIG. 25 is a flowchart showing an operation of a second patrol read according to the fourth embodiment.
Figure 26:
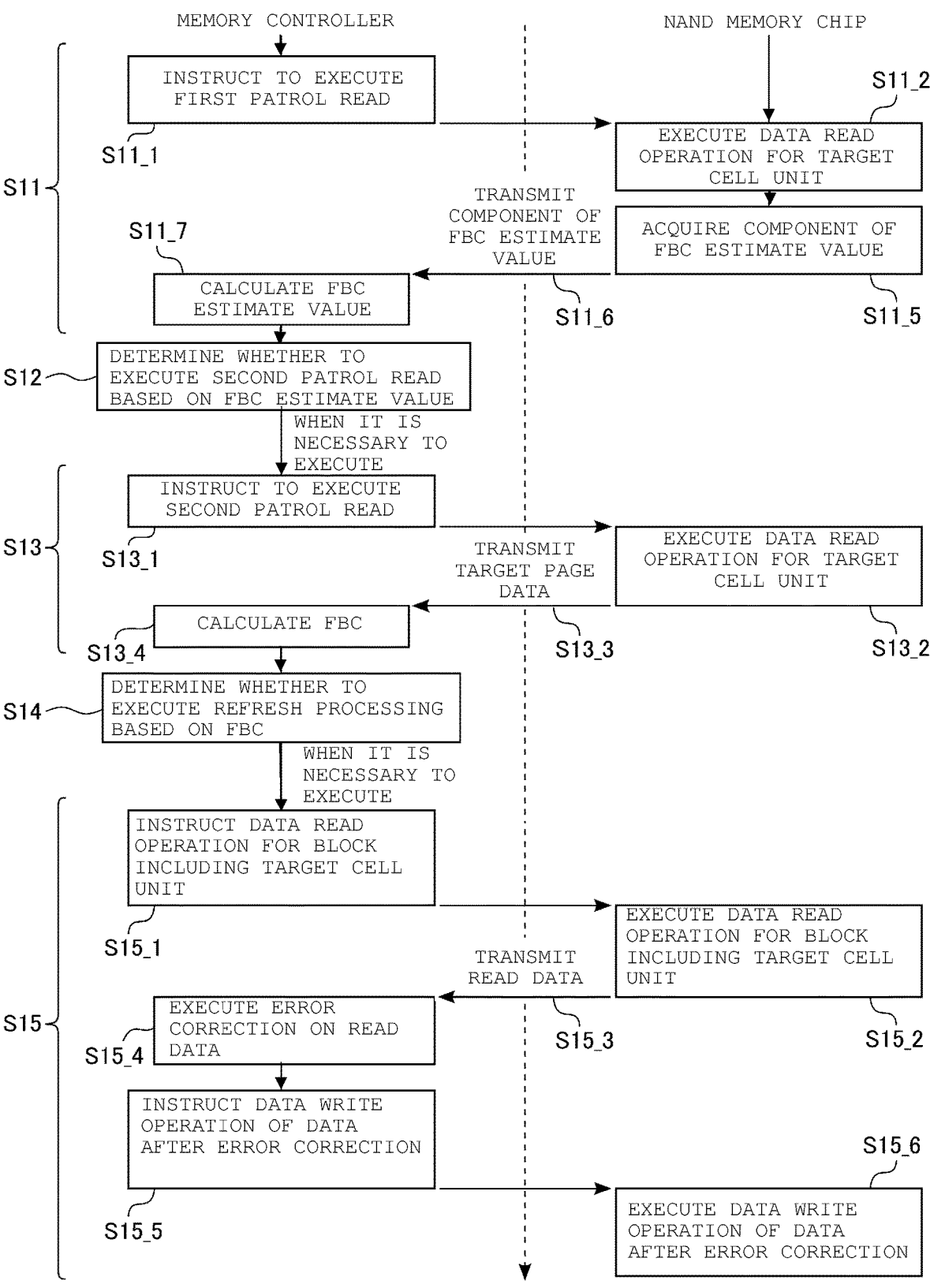
FIG. 26 is a sequence diagram showing the patrol operation according to the fourth embodiment.

FIG. 23 is a flowchart showing a patrol operation according to the fourth embodiment. FIG. 24 is a flowchart showing the operation of the first patrol read in the patrol operation. FIG. 25 is a flowchart showing the operation of the second patrol read in the patrol operation. The operation by the procedure shown in these flowcharts is instructed or executed by the memory controller 20 or the control circuit 16. FIG. 26 is a diagram showing the operations of the memory controller 20 and the NAND memory chip 10_1 in the patrol operation, and transmission and reception of instructions and data.

The memory controller 20 starts a patrol operation as shown in FIG. 23. The patrol operation is started periodically (or irregularly).

When a patrol operation is started, a first patrol read is executed (S11). The first patrol read illustrated in steps S11_2, S11_5, S11_6, and S11_7 of FIGS. 24 and 26 is the same as the patrol read of the second embodiment illustrated in steps S1_2, S1_5, S1_6, and S1_7 of FIGS. 17 and 18.

Next, as shown in FIGS. 23 and 26, the processor 21 of the memory controller 20 determines whether or not it is necessary to execute the second patrol read based on the FBC estimate value (S12). The determination processing illustrated in step S12 of FIGS. 23 and 26 is the same that of the third embodiment illustrated in step S12 of FIGS. 19 and 22.

When it is necessary to execute the second patrol read (YES in S12 of FIG. 23), the memory controller 20 instructs the NAND memory chip 10_1 to execute the second patrol read (S13_1 in FIG. 26). The second patrol read illustrated in steps S13_2, S13_3, and S13_4 of FIGS. 25 and 26 is the same as that of the third embodiment illustrated in steps S13_2, S13_3, and S3_4 of FIGS. 21 and 22. Further, the reference value C1$a$ used for determining the execution of the second patrol read is the same as the third embodiment.

Next, as shown in FIGS. 23 and 26, the refresh determination circuit 21A provided in the processor 21 of the memory controller 20 determines whether or not it is necessary to execute refresh processing based on the number of error bits (S14). The determination processing illustrated in step S14 of FIGS. 23 and 26 is the same that of the third embodiment illustrated in step S14 of FIGS. 19 and 22.

When it is necessary to execute refresh processing (YES in S14 of FIG. 23), refresh processing is executed (S15). The refresh processing illustrated in step S15 of FIGS. 23 and 26 is the same as that of the first embodiment illustrated in step S3 of FIGS. 6 and 8.

4.2.2 Calculation of FBC Estimate Value

Next, the calculation of an FBC estimate value in the first patrol read is described. As described above, in the memory system 1 of the fourth embodiment, the NAND memory chip 10_1 transmits the components of an FBC estimate value to the memory controller 20 in a first patrol read, and the memory controller 20 calculates an FBC estimate value.

Two methods described in the second embodiment, that is, the 4-point read method and the 3-point read method are used as the operations for calculating the FBC estimate value. The operations of these methods are the same as those of the second embodiment.

4.3 Effects of Fourth Embodiment

According to the fourth embodiment, it is possible to provide a memory system capable of reducing patrol time.

In the configuration of the fourth embodiment, in addition to the effects of the second embodiment, a patrol operation is executed in two stages, that is, the same effects of the third embodiment are achieved.

5. Fifth Embodiment

A memory system of a fifth embodiment is described. In the fifth embodiment, an FBC estimate value is calculated based on information managed by the memory controller 20 without reading data from the NAND memory chip. In the fifth embodiment, the points different from the first embodiment are mainly described.

5.1 Configuration 5.1.1 Memory System

Figure 27:
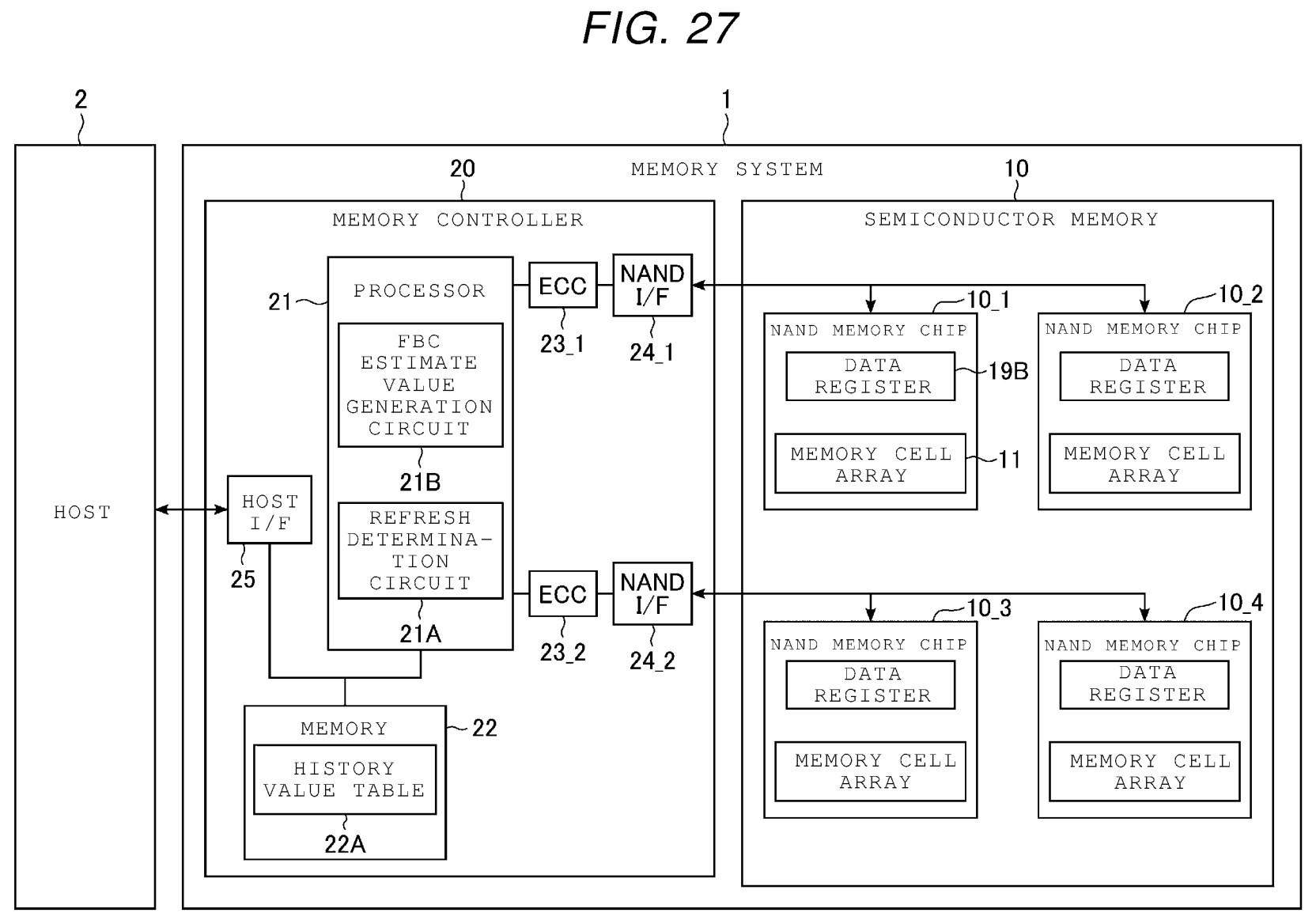

The configuration of the memory system of the fifth embodiment is described. FIG. 27 is a block diagram showing the configuration of the memory system according to the fifth embodiment.

The memory system 1 includes the semiconductor memory 10 and the memory controller 20.

5.1.2 Memory Controller

Next, the configuration of the memory controller 20 is described with reference to FIG. 27. The memory controller 20 includes the processor 21, the memory 22, the ECC circuits 23_1 and 23_2, the NAND interface circuits 24_1 and 24_2, and the host interface circuit 25.

The processor 21 includes the refresh determination circuit 21A and the FBC estimate value generation circuit 21B. The refresh determination circuit 21A determines whether or not to execute refresh processing based on an FBC estimate value. The FBC estimate value generation circuit 21B calculates the FBC estimate value based on components of the FBC estimate value.

The memory 22 stores a history value table 22A. The history value table 22A stores an updated value and an initial value of a read voltage to be used in a data read operation. Details of the history value table 22A will be described later. Here, an example is shown in which the history value table 22A stores an updated value and an initial value, but the history value table 22A may store only the updated value. In this case, for example, the updated value is a value indicating a shift amount from the initial value.

The other configuration of the memory controller 20 is the same as the first embodiment.

5.1.3 Semiconductor Memory

The configuration and structure of the semiconductor memory 10 and the memory cell array 11 provided in the memory system 1 of the fifth embodiment are the same as those of the first embodiment, except that the NAND memory chips 10_1 to 10_4 do not have the FBC estimate value generation circuit 16A.

5.2 Operation

An operation in the memory system 1 of the fifth embodiment is described.

5.2.1 Patrol Operation

A patrol operation in the memory system 1 of the fifth embodiment is described. In the patrol operation of the fifth embodiment, the memory controller 20 obtains a difference between an updated value and an initial value of a read voltage included in the history value table 22A to calculate an FBC estimate value based on the difference. Hereinafter, a method for calculating the FBC estimate value by using the updated value and the initial value of the read voltage acquired by the memory controller 20 without reading data from the NAND memory chip 10_1 is referred to as a history value inspection (or 0-point read method).

Figure 29:
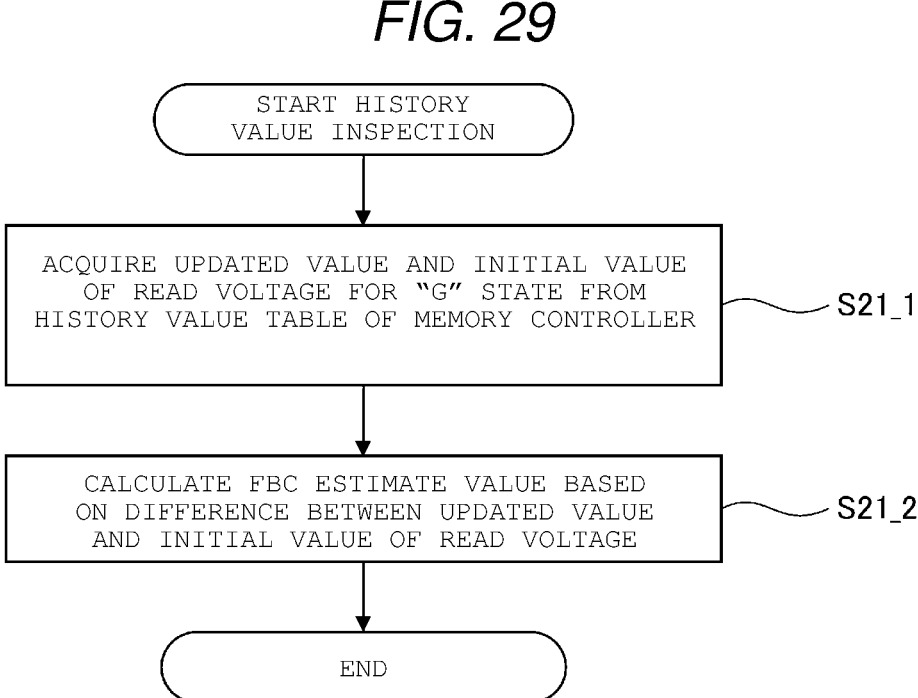
FIG. 29 is a flowchart showing an operation of a history value inspection according to the fifth embodiment.
Figure 30:
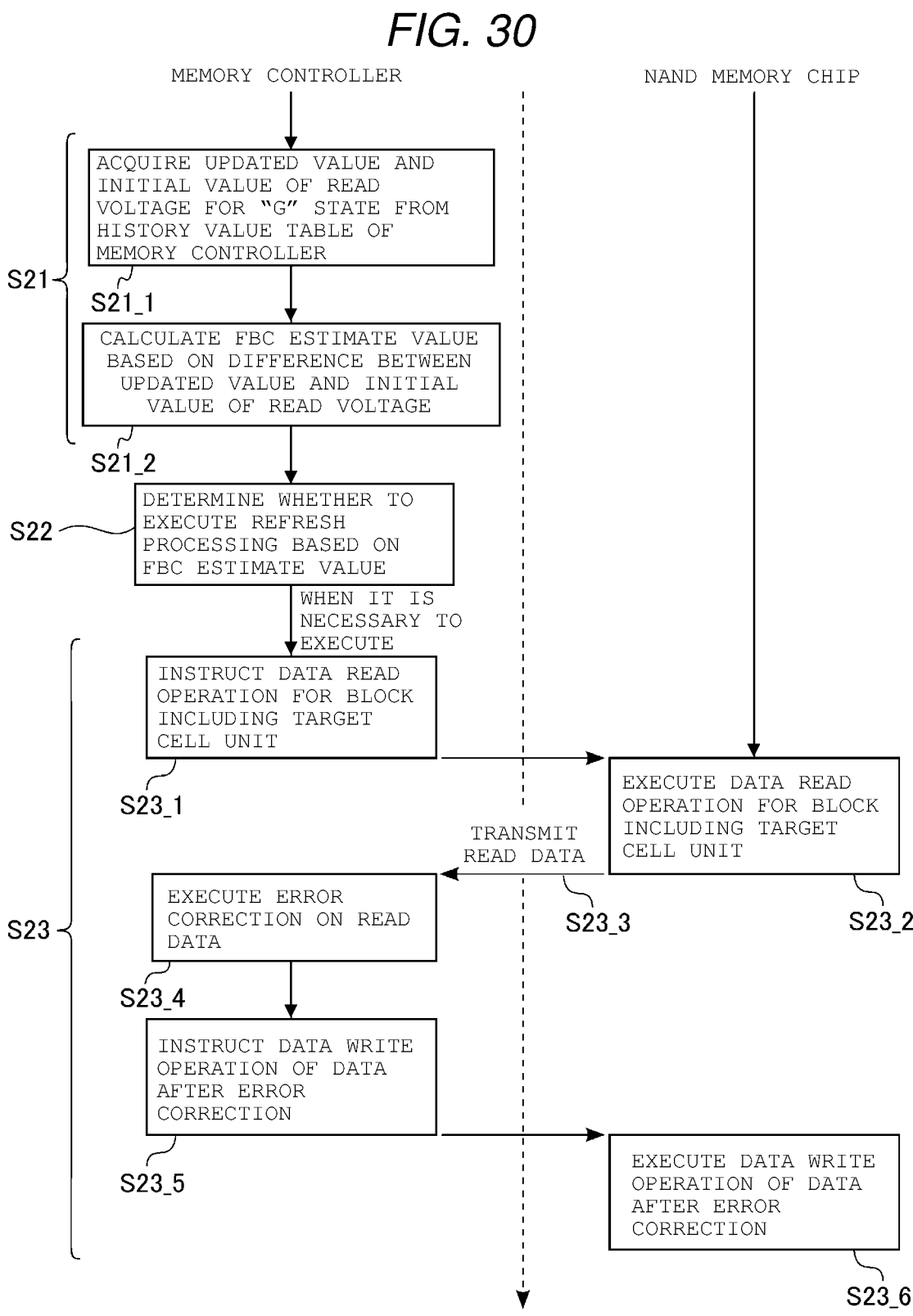
FIG. 30 is a sequence diagram showing the patrol operation according to the fifth embodiment.

FIG. 28 is a flowchart showing a patrol operation according to the fifth embodiment. FIG. 29 is a flowchart showing the operation of the history value inspection in the patrol operation. The operation by the procedure shown in these flowcharts is instructed or executed by the memory controller 20 or the control circuit 16. FIG. 30 is a diagram showing the operations of the memory controller 20 and the NAND memory chip 10_1 in the patrol operation, and transmission and reception of instructions and data.

The memory controller 20 starts a patrol operation as shown in FIG. 28. The patrol operation is started periodically (or irregularly).

When a patrol operation is started, a history value inspection is executed (S21).

The operation of the history value inspection is described with reference to FIGS. 29 and 30. The history value inspection in the fifth embodiment is an operation in which the memory controller 20 calculates an FBC estimate value in target page data based on the read voltage corresponding to a target cell unit provided in the history value table 22A. The history value table 22A includes a read voltage for which the number of error bits is expected to be minimum.

The processor 21 of the memory controller 20 executes the history value inspection (S21).

More specifically, the processor 21 acquires an updated value and an initial value of the read voltage for the "G" state, for example, from the history value table 22A stored in the memory 22 (S21_1). Details of the history value table 22A will be described later.

Next, the processor 21 calculates a difference between the updated value and the initial value of the acquired read voltage. Further, the processor 21 calculates an FBC estimate value for the target page data based on the calculated difference (S21_2). In the calculation of the FBC estimate value, the FBC estimate value is calculated by the processor 21 (specifically, the FBC estimate value generation circuit 21B) without the NAND memory chip 10_1 transferring the target page data to the memory controller 20, that is, without correcting an error of the target page data with the ECC circuit 23_1 provided in the memory controller 20. The operation of the calculation of the FBC estimate value is described later. Thus, the history value inspection ends. Here, an example is shown in which the FBC estimate value is calculated based on a difference between an updated value and an initial value. When the updated value is a value indicating a shift amount from the initial value, the FBC estimate value is calculated based on the updated value.

Next, as shown in FIGS. 28 and 30, the refresh determination circuit 21A provided in the processor 21 of the memory controller 20 determines whether or not it is necessary to execute refresh processing based on the FBC estimate value (S22). That is, the refresh determination circuit 21A determines whether or not to rewrite the target page data based on the FBC estimate value.

Specifically, when the FBC estimate value is larger than a reference value (or threshold value) C3, the memory controller 20 determines that it is necessary to execute refresh processing. When it is necessary to execute refresh processing (YES in S22 of FIG. 28), refresh processing is performed (S23). The refresh processing illustrated in step S23 of FIGS. 28 and 30 is the same as that of the first embodiment illustrated in step S3 of FIGS. 6 and 8.

On the other hand, when the FBC estimate value is equal to or smaller than the reference value C3, the memory controller 20 determines that it is not necessary to execute refresh processing. When it is not necessary to execute refresh processing (NO in S22 of FIG. 28), the memory controller 20 ends the patrol operation.

Similarly to the reference value C1 of the first embodiment illustrated in FIG. 6, the reference value C3 of an estimate value with an error is set to a value smaller than the reference value C0 to prevent a problem that refresh processing is not executed on a block that should be refreshed.

5.2.2 History Value Table

The history value table 22A stored in the memory 22 is described. As described above, in the memory system 1 of the fifth embodiment, the memory controller 20 calculates an FBC estimate value based on an updated value and an initial value acquired from the history value table 22A in the memory 22 without reading data from the NAND memory chip 10_1.

For example, when data is written into a memory cell in the NAND memory chip 10_1, there is a tendency that the threshold voltage of the memory cell converges to a neutral point in potential as time elapses after the writing. For example, the threshold voltage distribution of each state of the memory cell gradually shifts to a lower voltage side as time elapses after the writing. Thus, in the memory system 1, the memory controller 20 periodically updates the read voltage used in a data read operation according to a shift amount of the threshold voltage distribution of each state and appropriately sets the read voltage. In this case, the read voltage immediately after the writing is referred to as an initial value, and the read voltage updated in accordance with the shift amount of the threshold voltage distribution of each state is referred to as an updated value. The history value table 22A includes a physical address of the block BLKm, an updated value and an initial value corresponding to the block BLKm, time when the updated value is updated (hereafter, update time) and time when the initial value is stored (hereafter, generation time).

The history value table 22A stored in the memory 22 of the memory controller 20 is described with reference to FIG. 31. FIG. 31 is a diagram showing an example of the history value table 22A. The history value table 22A has a history value table 22Au including an updated value of a read voltage and a history value table 22Ai including an initial value.

In the history value table 22Au, for example, physical addresses BA0, BA1, ..., BAm which indicate the physical location of the block BLK0 to BLKm, the updated values of the read voltages for the "A" state to the "G" state for each physical address, and updated times TU0, TU1, ..., TUm when those updated values are updated are associated. For example, the updated value of the read voltage for the "G" state for the physical address BA0 of the block BLK0 is Xg, and the updated time of the updated value Xg is TU0.

In the history value table 22Ai, for example, the physical addresses BA0, BA1, ..., BAm, the initial values of the read voltages for the "A" state to "G" state for each physical address, and generated times TI0, TI1, ..., TIm when the initial values are stored are associated. For example, the initial value of the read voltage for the "G" state for the physical address BA0 of the block BLK0 is Ng, and the generated time of the initial value Ng is TI0.

The read voltages for the "A" state to the "G" state in the history value tables 22Au and 22Ai correspond respectively to the read voltages AR, BR, CR, DR, ER, FR, and GR used for the state determination described above.

The updated value of the read voltage stored in the history value table 22Au is periodically (or irregularly) updated to an appropriate read voltage. The history value table 22Ai is copied as the history value table 22Au when the value of the read voltage is updated from the initial value, and the history value table 22Ai is maintained as it is. Here, the updated value and the initial value are described as being stored in different tables. Alternatively, the updated value, the updated time, the initial value, and the generated time may be stored in one table together.

Figure 32:
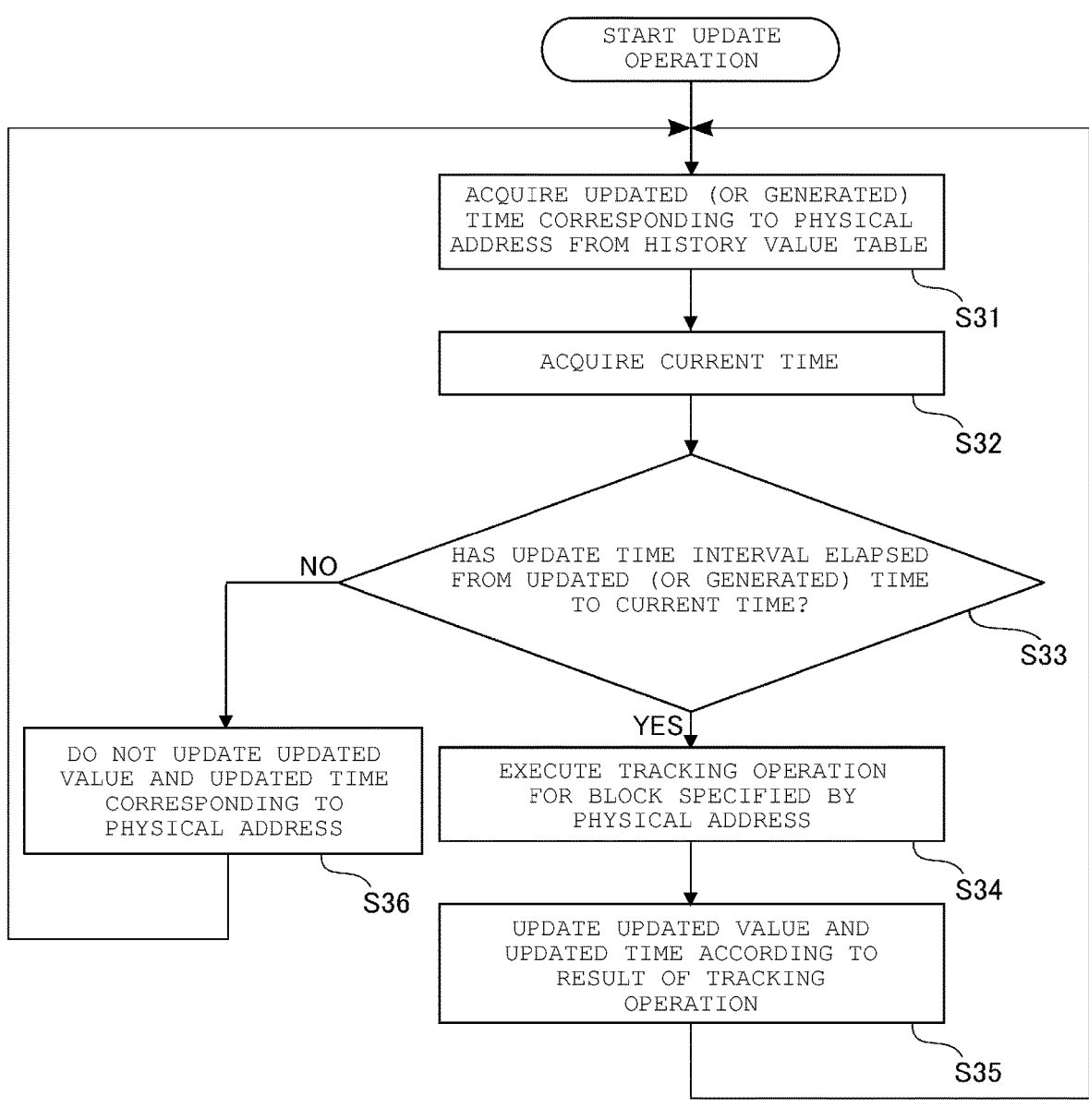
FIG. 32 is a flowchart showing an operation in which an updated value of the history value table is updated according to the fifth embodiment.

The operation of periodically updating the updated value stored in the history value table 22Au is described with reference to FIG. 32. FIG. 32 is a flowchart showing an operation to update an updated value in the history value table 22Au. The operation by the procedure shown in the flowchart is instructed or executed by the memory controller 20.

When an update operation is started, the memory controller 20 acquires the updated time corresponding to a physical address from the history value table 22Au (S31). Next, the memory controller 20 acquires the current time (S32).

Next, the memory controller 20 determines whether or not an update time interval has elapsed from the updated time in the history value table 22Au to the current time (S33). The update time interval is 24 hours, which is an example and may be any other time.

When the update time interval has elapsed from the updated time, the memory controller 20 executes the tracking operation of the read voltage for the block specified by the physical address (S34). In the tracking operation, when the threshold voltage distributions of two adjacent states overlap each other, a read voltage close to the point at which the number of error bits is minimum (that is, the intersection of the two threshold voltage distributions) is obtained. In the tracking operation, when the X-axis is set as a threshold voltage and the Y-axis is set as the number of memory cells, a valley (that is, minimum value) of the distribution, in which the numbers of memory cells in the two states are added up, is obtained, and an appropriate read voltage (or shift amount) is calculated from the obtained valley. The valley of the distribution, in which the numbers of memory cells in the two states are added up, is usually expected to be a voltage close to the voltage at the intersection of the two threshold voltage distributions. The details of the tracking operation will be described later. The memory controller 20 updates the updated value and updated time corresponding to the physical address according to the read voltage calculated by the tracking operation (S35).

When the update time interval has not elapsed from the updated time, the memory controller 20 maintains the updated value and the updated time corresponding to the physical address as they are and does not update (S36).

Thereafter, the memory controller 20 returns to step S31 and repeats the processing from step S31 to step S35 or S36 for the other physical addresses.

Next, the tracking operation of a read voltage is described with reference to FIG. 33. When the X-axis is set as a threshold voltage and the Y-axis is set as the number of memory cells, in the tracking operation, an appropriate read voltage is calculated from a location where the numbers of memory cells in adjacent two states form a valley of the distribution. The following example illustrates the case of calculating the intersection of two threshold voltage distributions corresponding to the "F" state and the "G" state, respectively.

Figures 33A, 33B:
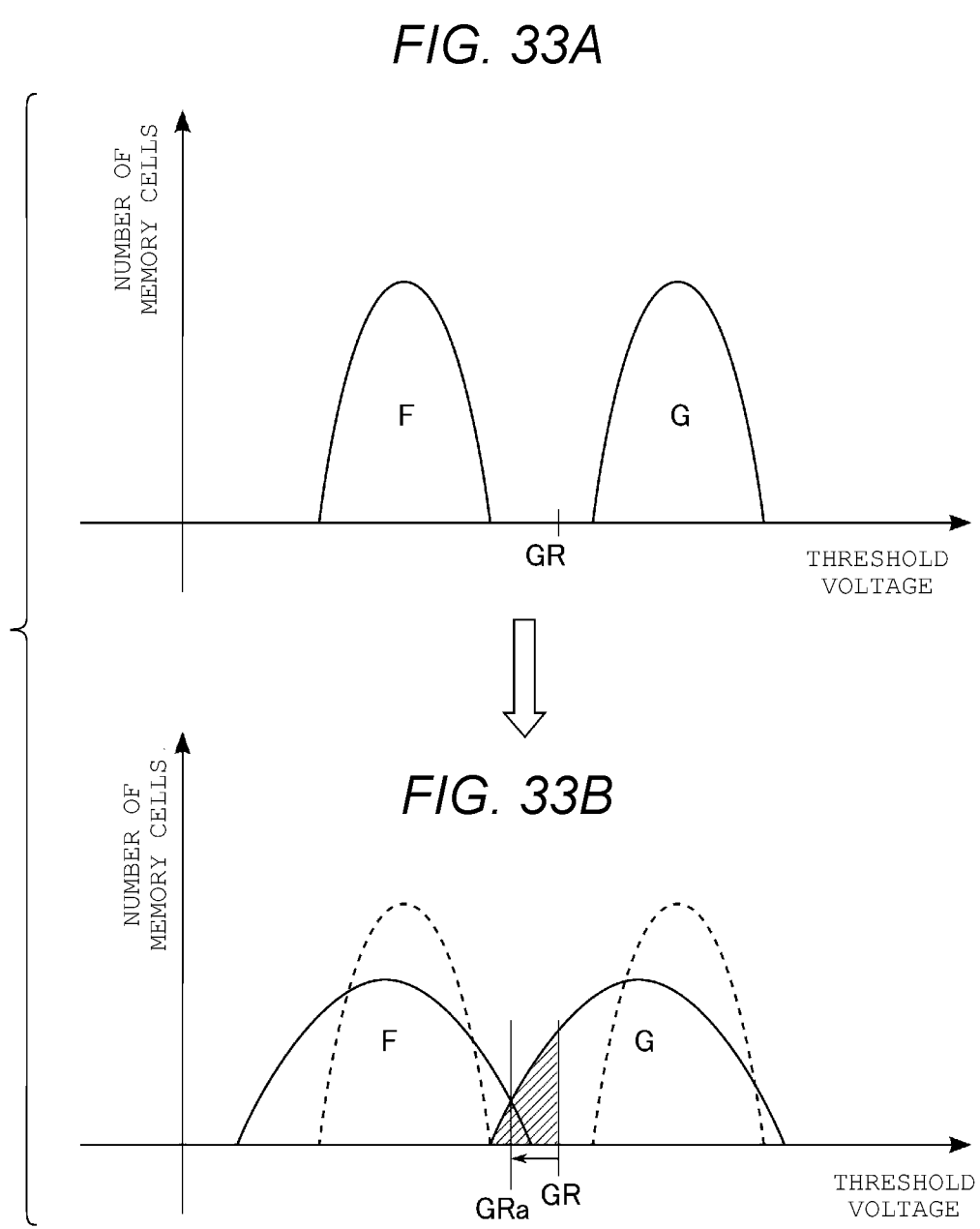
FIGS. 33A and 33B are diagrams showing threshold voltage distributions of two states in a tracking operation according to the fifth embodiment.

FIG. 33 shows the threshold voltage distributions of the "F" state and the "G" state. For example, the threshold voltage distributions immediately after a data write operation are as shown in FIG. 33A. That is, immediately after the data write operation, the threshold voltage distributions of the "F" state and the "G" state do not overlap. However, as shown in FIG. 33B, the distribution width of the threshold voltage distribution is widened by a data retention, disturbance, and the like, and the threshold voltage distributions of the "F" state and the "G" state overlap. Then, when a data read operation is performed with the read voltage GR, a memory cell corresponding to an area of the diagonal line part of FIG. 33B becomes an error bit. If the number of error bits generated exceeds the number of correctable bits of the ECC circuit 23_1, it is difficult to read the data correctly. Therefore, the memory controller 20 searches for the voltage at the valley position of a distribution where the numbers of memory cells in the two states are added up, and the voltage in the vicinity thereof is set as an appropriate read voltage GRa. The above is a tracking operation.

By the update operation of the history value table 22Au including the tracking operation described above, the updated value of the read voltage for a block is periodically updated to an appropriate read voltage. In the present embodiment, an FBC estimate value is calculated by using the updated value of the read voltage.

Next, the initial value stored in the history value table 22Ai is described. The initial value is generated when the state of a block transitions from an erased block to a write destination block or immediately after a data write operation to the write destination block ends.

Figure 34:
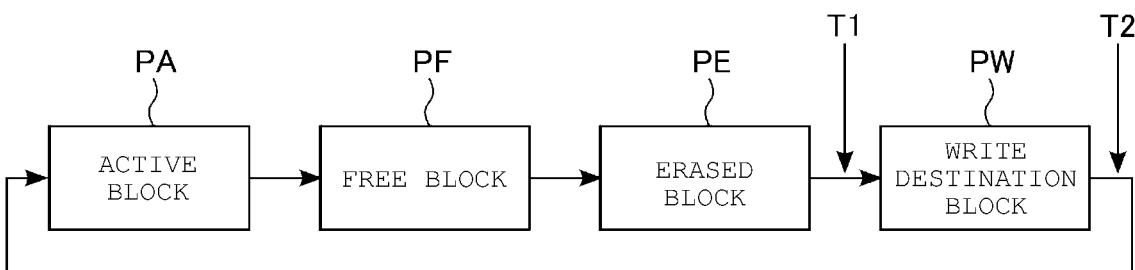
FIG. 34 is a diagram showing a transition of the state of a block according to the fifth embodiment.

First, the cycle of transition of the state of a block is described with reference to FIG. 34. FIG. 34 shows the transition of the state of a block. The state of a block transitions in the order of an active block PA, a free block PF, an erased block PE, and a write destination block PW. The memory controller 20 manages which of these block states is the block state.

The active block PA is a block for which only a data read operation is allowed out of a data write operation and a data read operation. In other words, an active block PA is a block for which a data write operation is not allowed but a data read operation is allowed. When all the data stored in an active block PA is invalidated, the active block PA transitions to a free block PF.

The free block PF is a block in which all the data stored is invalid data, and the data therein can be erased. When the data stored in the free block PF is erased, the free block PF transitions to an erased block PE.

The erased block PE is a block after a data erase operation is executed and completed on a free block PF. In other words, the erased block PE is a block for which data is erased and a data write operation or a data read operation is not allowed. When an erased block PE is set as a block for which a data write operation is allowed, the erased block PE transitions to a write destination block PW.

The write destination block PW is a block for which a data write operation and a data read operation are allowed. When data write operations are completed for all the cell units provided in the write destination block PW or when the memory controller 20 determines that no more data write operation is to be executed for the block while some cell units are in an unwritten state, the write destination block PW transitions to an active block PA.

When the state of a block transitions as described above, the initial value of a read voltage stored in the history value table 22Ai is generated at timing T1 shown in FIG. 34, that is, when the state of a block transitions from an erased block PE to a write destination block PW. Alternatively, the initial value is generated at timing T2 shown in FIG. 34, that is, immediately after a data write operation is completed for the write destination block PW. The initial value is, for example, a read voltage set in a ROM block provided in the NAND memory chip.

In the history value table 22A, updated values and initial values are associated with each block BLK. Alternatively, the updated values and the initial values may be associated with each unit smaller than the block BLK, for example, each string unit SU or each cell unit (or word line), or the updated values and the initial values may be associated with each cell unit group including a plurality of cell units.

5.2.3 FBC Estimate Value

Next, a method for calculating an FBC estimate value by using the history value inspection (or a 0-point read method), that is, an updated value and an initial value of the history value table 22A provided in the memory controller 20 is described with reference to FIG. 35. In some cases, among the "A" state to the "G" state, the shift amount of the threshold voltage distribution of the "G" state is larger than the threshold voltage distribution of the other states as time elapses. Therefore, in the present embodiment, the updated value and the initial value of a read voltage for determining the "G" state are used to calculate the FBC estimate value.

Figure 35:
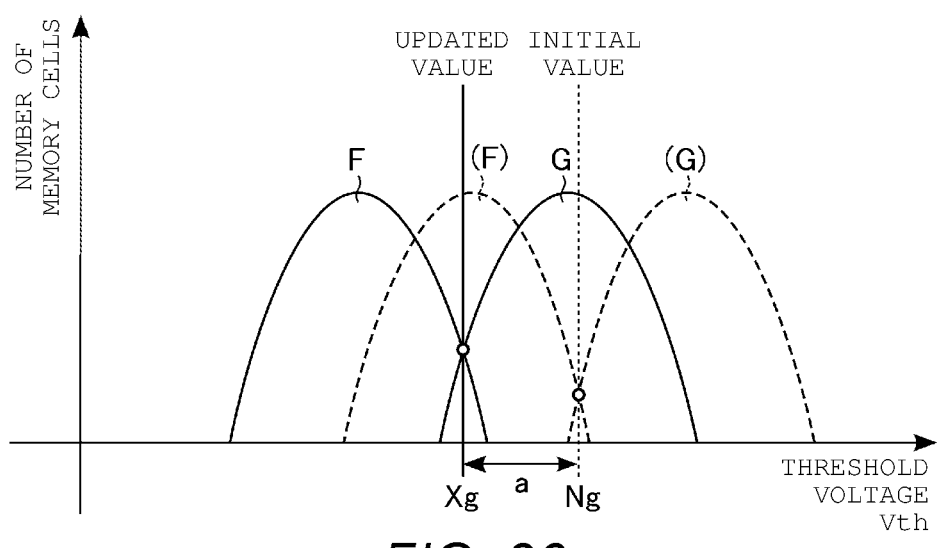
FIG. 35 is a diagram showing the threshold voltage distributions of two states according to the fifth embodiment.

FIG. 35 illustrates a threshold voltage distribution of a target cell unit provided in a block of the physical address BA0. In FIG. 35, the threshold voltage distributions of the "G" state and "F" state immediately after a data write operation are indicated by dashed lines, and the threshold voltage distributions of the "G" state and "F" state where time has elapses after the data write operation are indicated by solid lines. A threshold voltage at an intersection where the threshold voltage distributions of the "G" state and the "F" state indicated by the dashed lines overlap corresponds to the initial value Ng. A threshold voltage at the valley (that is, minimum value) of the distributions, where the number of memory cells in the "G" state and the number of memory cells in the "F" state indicated by the solid lines are added up, corresponds to the updated value Xg.

The memory controller 20 acquires the updated value Xg and the initial value Ng provided in the history value table 22A and obtains a difference between the updated value Xg and the initial value Ng (i.e., a difference value "a" shown in FIG. 35). Further, the memory controller 20 calculates an FBC estimate value based on the difference value. For example, when the difference value is large, the FBC estimate value is also increased.

Figure 36:
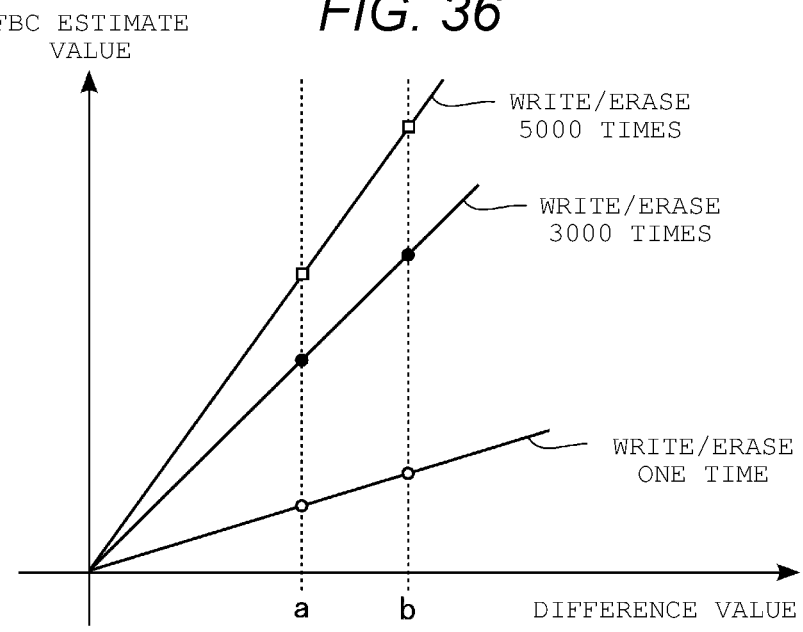
FIG. 36 is a diagram showing a relationship between (A) a difference value between an updated value and an initial value of a read voltage and (B) an FBC estimate value according to the fifth embodiment.

The rate at which the FBC estimate value is increased may be changed according to the times that a data write operation and a data erase operation are repeated for the block. FIG. 36 shows the relationship between (A) the difference value between the updated value and the initial value of a read voltage and (B) the FBC estimate value. FIG. 36 shows the cases where a data write operation and a data erase operation are repeated one, 3,000, and 5,000 times.

As shown in FIG. 36, the FBC estimate value calculated in accordance with the difference value "a" increases with the times that a data write operation and a data erase operation are repeated for a block including a target cell unit increase.

When a difference value "b" is larger than the difference value "a", the FBC estimate value calculated corresponding to the difference value "b" is larger than the FBC estimate value calculated corresponding to the difference value "a" even if the times that a data write operation and a data erase operation are repeated is the same.

5.3. Effects of Fifth Embodiment

According to the fifth embodiment, it is possible to provide a memory system capable of reducing patrol time.

In the configuration of the fifth embodiment, the FBC estimate value can be calculated by using only the information managed by the memory controller 20 without reading data from the NAND memory chip. As a result, it is possible to reduce the time required for the patrol operation further than that required in the first to fourth embodiments.

6. Sixth Embodiment

A memory system of a sixth embodiment is described. In the sixth embodiment, a history value inspection and a patrol read are executed. In the history value inspection, it is determined whether or not to execute a patrol read. In the patrol read, it is determined whether or not to execute refresh processing by using target page data. Further, in the history value inspection, an FBC estimate value is calculated based on information managed by the memory controller 20 without reading data from the NAND memory chip, similarly to the fifth embodiment. In the sixth embodiment, the points different from the third and fifth embodiments are mainly described.

6.1 Configuration

The configuration and structure of the memory controller 20 and the semiconductor memory 10 provided in the memory system 1 of the sixth embodiment are the same as those of the fifth embodiment described above.

6.2 Operation

An operation in the memory system 1 of the sixth embodiment is described.

6.2.1 Patrol Operation

A patrol operation in the memory system 1 of the sixth embodiment is described. In the patrol operation of the sixth embodiment, in a history value inspection, the memory controller 20 obtains a difference between an updated value and an initial value of a read voltage provided in the history value table 22A to calculate an FBC estimate value based on the difference. The memory controller 20 determines whether or not to execute the patrol read based on the FBC estimate value. Further, in the patrol read, the memory controller 20 determines whether or not to execute refresh processing.

Figure 40:
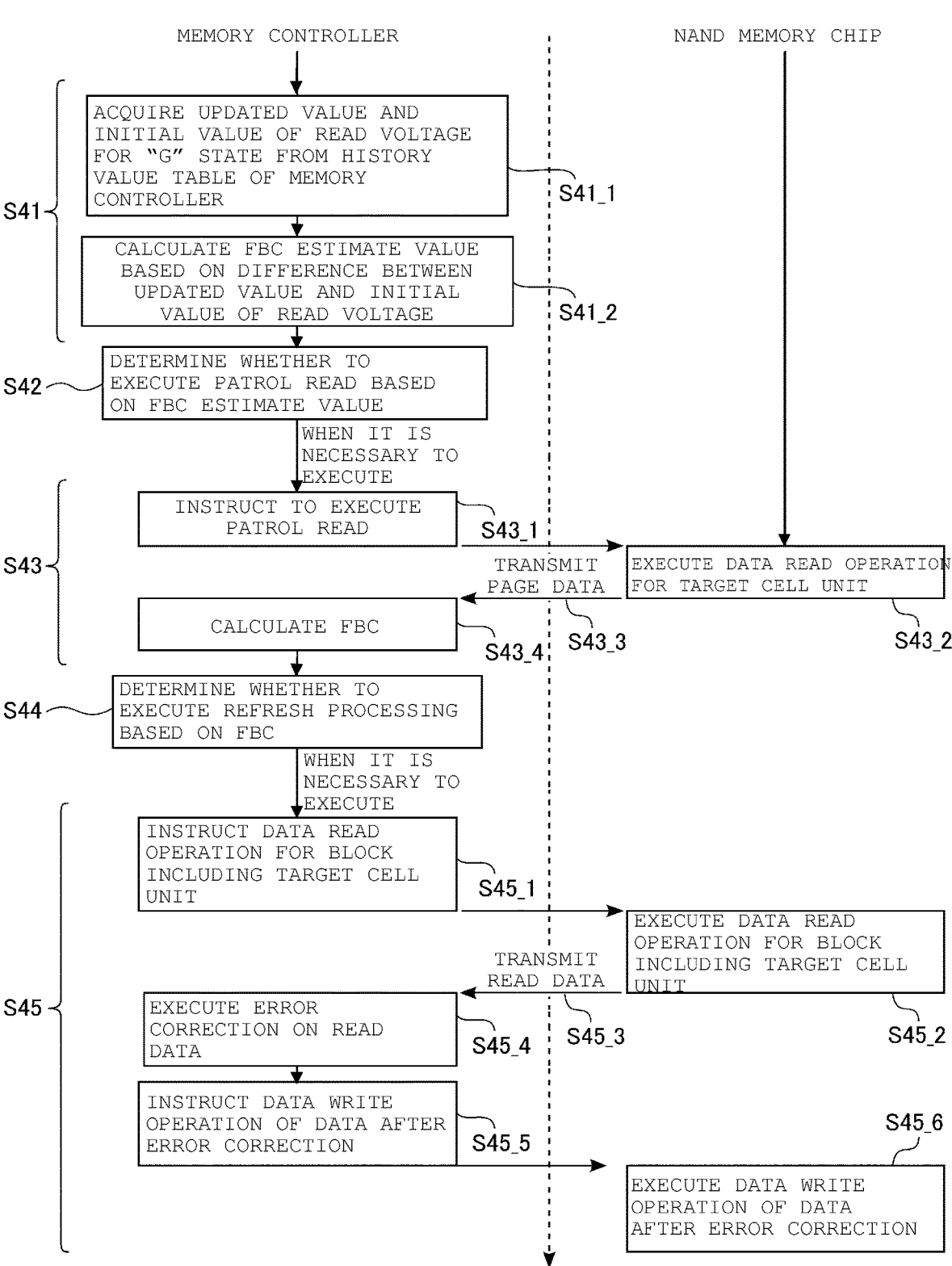
FIG. 40 is a sequence diagram showing the patrol operation according to the sixth embodiment.

FIG. 37 is a flowchart showing a patrol operation according to the sixth embodiment. FIG. 38 is a flowchart showing the operation of the history value inspection in the patrol operation. FIG. 39 is a flowchart showing the operation of a patrol read in the patrol operation. The operation by the procedure shown in these flowcharts is instructed or executed by the memory controller 20 or the control circuit 16. FIG. 40 is a diagram showing the operations of the memory controller 20 and the NAND memory chip 10_1 in the patrol operation, and transmission and reception of instructions and data.

The memory controller 20 starts a patrol operation as shown in FIG. 37. The patrol operation is started periodically (or irregularly).

When the patrol operation is started, a history value inspection is performed (S41).

The history value inspection illustrated in steps S41_1 and S41_2 of FIGS. 38 and 40 is the same as that of the fifth embodiment illustrated in steps S21_1 and S21_2 of FIGS. 29 and 30.

Next, as shown in FIGS. 37 and 40, the processor 21 of the memory controller 20 determines whether or not it is necessary to execute a patrol read based on the FBC estimate value (S42). The determination processing for the patrol read illustrated in step S42 of FIGS. 37 and 40 is the same that for the second patrol read of the third embodiment illustrated in step S12 of FIGS. 19 and 22 except that the FBC estimate value is compared with a reference value (or threshold value) C3a, instead of the reference value C1a. When it is necessary to execute a patrol read (YES in S42 of FIG. 37), the memory controller 20 instructs the NAND memory chip 10_1 to execute a patrol read (S43_1 in FIG. 40).

Similarly to the reference value C1a of the third embodiment illustrated in FIG. 19, the reference value C3a of an estimate value with an error is set to a value smaller than the reference value C2.

The patrol read illustrated in steps S43_2, S43_3, and S43_4 of FIGS. 39 and 40 is the same as the second patrol read of the third embodiment illustrated in steps S13_2, S13_3, and S13_4 of FIGS. 21 and 22.

Next, as shown in FIGS. 37 and 40, the refresh determination circuit 21A provided in the processor 21 of the memory controller 20 determines whether or not it is necessary to execute refresh processing based on the number of error bits (S44). The determination processing illustrated in step S44 of FIGS. 27 and 40 is the same that of the third embodiment illustrated in step S14 of FIGS. 19 and 22.

When it is necessary to execute refresh processing (YES in S44 of FIG. 37), refresh processing is executed (S45). The refresh processing illustrated in step S45 of FIGS. 37 and 40 is the same as that of the first embodiment illustrated in step S3 of FIGS. 6 and 8.

6.2.2 Calculation of FBC Estimate Value

As described above, in the memory system 1 of the sixth embodiment, the memory controller 20 calculates an FBC estimate value in a history value inspection. The details of the operation of the history value inspection are the same as in the fifth embodiment.

6.3. Effects of Sixth Embodiment

According to the sixth embodiment, it is possible to provide a memory system capable of reducing patrol time.

In the configuration of the sixth embodiment, an FBC estimate value can be calculated by using only the information managed by the memory controller 20 without reading data from the NAND memory chip. As a result, it is possible to reduce the time required for the patrol operation further than that required in the first to fourth embodiments.

Further, in the configuration of the sixth embodiment, a patrol operation is executed in two stages, that is, a history value inspection and a patrol read, thereby reducing the time required for the patrol operation. Further, in the patrol read, the ECC circuit corrects an error of the target page data and acquires the number of error bits, thereby maintaining a highly reliable data retention characteristic.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A memory system comprising:
a semiconductor memory that includes a cell unit having a plurality of memory cells, a column decoder, a row decoder, a voltage generation circuit, and a control circuit connected to the column decoder, the row decoder, and the voltage generation circuit and configured to control the column decoder, the row decoder, and the voltage generation circuit when executing an operation on the plurality of memory cells; and
a memory controller connected to the semiconductor memory via a plurality of data signal lines and a plurality of control signal lines and having a processor and an interface circuit connected to the semiconductor memory via the plurality of data signal lines and the plurality of control signal lines, wherein
the control circuit of the semiconductor memory is configured to:
execute a data read operation on the cell unit using at least first and second read voltages to acquire first data corresponding to the first and second read voltages, respectively, the second read voltage being higher than the first read voltage,
obtain a first number and a second number based on the first data, the first and second numbers indicating a number of the memory cells that are turned on by the data read operation using the first and second read voltages, respectively,
calculate second data having a smaller data size than the first data, using a first average value and a first value, the first average value being an arithmetic mean of the first read voltage and the second read voltage, and the first value being a difference between the first number and the second number, and transmit the second data to the interface circuit of the memory controller, and
the processor of the memory controller is configured to determine, by comparing the second data that has been transmitted by the semiconductor memory to the interface circuit, with a first threshold value, whether or not to rewrite page data written in the cell unit.

2. The memory system according to claim 1, wherein
in the data read operation executed on the cell unit, the control circuit of the semiconductor memory executes reading by further using third and fourth read voltages for the cell unit to acquire the first data further corresponding to the third and fourth read voltages, respectively, the third read voltage being higher than the second read voltage, the fourth read voltage being higher than the third read voltage, and the first data further including a third number and a fourth number, the third and fourth numbers indicating the number of memory cells that are turned on by the data read operation using the third and fourth read voltages, respectively,
the control circuit of the semiconductor memory is configured to compute first, second, and third difference points, respectively, based on the first, second, third, and fourth read voltages and the first, second, third, and fourth numbers of memory cells,
the first difference point is represented by the first average value and the first value which is a difference between the second number of memory cells and the first number of memory cells,
the second difference point is represented by a second average value which is an arithmetic mean of the second read voltage and the third read voltage, and a second value which is a difference between the third number of memory cells and the second number of memory cells,
the third difference point is represented by a third average value which is an arithmetic mean of the third read voltage and the fourth read voltage, and a third value which is a difference between the fourth number of memory cells and the third number of memory cells, and
the control circuit of the semiconductor memory is configured to calculate the second data using a minimum value of an approximate curve passing through the first difference point, the second difference point, and the third difference point.

3. The memory system according to claim 2, wherein
the approximate curve is represented by a quadratic function.

4. The memory system according to claim 1, wherein
in the data read operation executed on the cell unit, the control circuit of the semiconductor memory executes reading by further using a third read voltage for the cell unit to acquire the first data further corresponding to the third read voltage, the third read voltage being higher than the second read voltage, and the first data further including a third number indicating the number of memory cells that are turned on by the data read operation using the third read voltage,
the control circuit of the semiconductor memory is configured to acquire first and second difference points, respectively, based on the first, second, and third read voltages and the first, second, and third numbers of memory cells, the first difference point is represented by the first average value and the first value, the second difference point is represented by a second average value which is an arithmetic mean of the second read voltage and the third read voltage, and a second value which is a difference between the third number of memory cells and the second number of memory cells, and when a threshold voltage of each of the plurality of memory cells is represented on a horizontal axis and the number of memory cells is represented on a vertical axis, the control circuit of the semiconductor memory calculates an intersection of a first diagonal line connecting the second difference point and a first threshold voltage corresponding to the first average value, and a second diagonal line connecting the first difference point and a second threshold voltage corresponding to the second average value, and sets the number of memory cells corresponding to the intersection as the second data.

5. The memory system according to claim 1, wherein the memory controller executes rewriting of the page data written in the cell unit when the second data is higher than a first threshold, and does not execute the rewriting of the page data written in the cell unit when the second data is equal to or smaller than the first threshold.

6. The memory system according to claim 1, wherein each of the plurality of memory cells stores data of different values corresponding to a plurality of threshold voltages, and each of the one or more read voltages is a voltage for determining a value of data stored in a memory cell.

7. The memory system according to claim 1, wherein the semiconductor memory further includes a word line, and the plurality of memory cells provided in the cell unit are connected to the word line.

8. The memory system according to claim 1, wherein the second data is an estimate of the number of error bits in the page data obtained by the data read operation executed on the cell unit.

9. A memory system comprising:

a first memory that includes:
  a plurality of cell units including a first cell unit, and
  a control circuit for controlling the plurality of cell units, the control circuit configured to use a first read voltage as a read voltage at a first time for a plurality of memory cells in the first cell unit;

a second memory; and
  a controller configured to:
  obtain a second read voltage as a result of a tracking operation executed on the plurality of memory cells at a second time after the first time,
  calculate a voltage difference between the first read voltage and the obtained second read voltage,
  store the voltage difference in the second memory,
  read the voltage difference from the second memory at a third time,
  calculate first data based on the voltage difference read from the second memory and without reliance on results of reading data from the first memory after the second time, and
  determine whether or not to rewrite page data written in the cell unit based on the first data, wherein
the controller is further configured to determine to rewrite the page data written in the first cell unit in response to the first data being equal to or larger than a first threshold.

10. The memory system according to claim 9, wherein each of the plurality of memory cells stores data of different values corresponding to a plurality of threshold voltages, and the first operation is an operation for detecting a voltage for determining a value of data stored in a memory cell.

11. The memory system according to claim 9, wherein the first data is an estimate of the number of error bits in the page data obtained by a data read operation executed on the first cell unit.

12. The memory system according to claim 1, wherein the processor of the memory controller is configured to determine whether or not an additional data read operation is to be executed on the cell unit by comparing the second data with the first threshold value, in response to an instruction from the memory controller to execute the additional data read operation on the cell unit, the control circuit of the semiconductor memory executes the additional data read operation for the cell unit, acquires third data by the additional data read operation, and transmits the third data to the memory controller, and the processor of the memory controller is configured to determine whether or not to rewrite the page data written in the cell unit based on the third data.

13. The memory system according to claim 12, wherein the second data is an estimate of the number of error bits in the page data obtained by the first data read operation executed on the cell unit.

14. The memory system according to claim 12, wherein in the first data read operation executed on the cell unit, the control circuit of the semiconductor memory executes reading by further using third and fourth read voltages for the cell unit to acquire the first data further corresponding to the third and fourth read voltages, respectively, the third read voltage being higher than the second read voltage, the fourth read voltage being higher than the third read voltage, and the first data further including a third number and a fourth number, the third and fourth numbers indicating the number of memory cells that are turned on by the first data read operation using the third and fourth read voltages, respectively, the control circuit of the semiconductor memory computes first, second, and third difference points, respectively, based on the first, second, third, and fourth read voltages and the first, second, third, and fourth numbers of memory cells, the first difference point is represented by the first average value and the first value, the second difference point is represented by a second average value which is an arithmetic mean of the second read voltage and the third read voltage, and a second value which is a difference between the third number of memory cells and the second number of memory cells, the third difference point is represented by a third average value which is an arithmetic mean of the third read voltage and the fourth read voltage, and a third value which is a difference between the fourth number of memory cells and the third number of memory cells, and the control circuit of the semiconductor memory is configured to calculate the second data using a minimum value of an approximate curve passing through the first difference point, the second difference point, and the third difference point.

15. The memory system according to claim 12, wherein in the first data read operation executed on the cell unit, the control circuit of the semiconductor memory executes reading by further using a third read voltage for the cell unit to acquire the first data further corresponding to the third read voltage, the third read voltage being higher than the second read voltage, and the first data further including a third number indicating the number of memory cells that are turned on by the first data read operation using the third read voltage, the control circuit of the semiconductor memory is configured to acquire first and second difference points, respectively, based on the first, second, and third read voltages and the first, second, and third number of memory cells, the first difference point is represented by the first average value, and the first value, the second difference point is represented by a second average value which is an arithmetic mean of the second read voltage and the third read voltage, and a second value which is a difference between the third number of memory cells and the second number of memory cells, and when a threshold voltage of each of the plurality of memory cells is represented on a horizontal axis and the number of memory cells is represented on a vertical axis, the control circuit of the semiconductor memory calculates an intersection of a first diagonal line connecting the second difference point and a first threshold voltage corresponding to the first average value, and a second diagonal line connecting the first difference point and a second threshold voltage corresponding to the second average value, and sets the number of memory cells corresponding to the intersection as the second data.

16. The memory system according to claim 9, wherein in the tracking operation, the controller obtains a voltage corresponding to a valley position of threshold voltage distributions of the plurality of memory cells as the second read voltage.

17. A memory system comprising:

a plurality of semiconductor memory chips, each of the plurality of semiconductor memory chips including a cell unit having a plurality of memory cells and a corresponding control circuit for controlling the plurality of memory cells; and a controller connected to the plurality of semiconductor memory chips via a plurality of data signal lines and a plurality of control signal lines, wherein the corresponding control circuit for each of the plurality of semiconductor memory chips is configured to:

execute a data read operation on the cell unit included in the corresponding one of the plurality of semiconductor memory chips using one or more read voltages, acquire first data by the data read operation, generate second data having a smaller data size than the first data, based on the first data, and transmit the second data to the controller, and the controller is configured to determine, based on the second data received from one of the plurality of semiconductor memory chips, whether or not to rewrite page data written in the cell unit included in the corresponding one of the plurality of semiconductor memory chips.

18. The memory system according to claim 17, wherein each of the plurality of control circuits is included in the corresponding one of the plurality of semiconductor memory chips.

19. The memory system according to claim 17, wherein each of the plurality of semiconductor memory chips further includes a logic control circuit configured to receive a command latch enable signal from the controller, and the number of the control circuits included in the memory system is equal to the number of the logic control circuits included in the memory system.

20. The memory system according to claim 17, wherein each of the plurality of control circuits is configured to execute the data read operation by using first, second, third, and fourth read voltages for the cell unit included in the corresponding one of the plurality of semiconductor memory chips to acquire the first data corresponding to the first, second, third, and fourth read voltages, respectively, the second read voltage being higher than the first read voltage, the third read voltage being higher than the second read voltage, the fourth read voltage being higher than the third read voltage, and the first data including a first number, a second number, a third number, and a fourth number, the first, second, third, and fourth numbers indicating the number of memory cells that are turned on by the data read operation using the first, second, third, and fourth read voltages, respectively, each of the plurality of control circuits is configured to compute first, second, and third difference points, respectively, based on the first, second, third, and fourth read voltages and the first, second, third, and fourth numbers of memory cells, the first difference point is represented by a first average value which is an arithmetic mean of the first read voltage and the second read voltage, and a first value which is a difference between the second number of memory cells and the first number of memory cells, the second difference point is represented by a second average value which is an arithmetic mean of the second read voltage and the third read voltage, and a second value which is a difference between the third number of memory cells and the second number of memory cells, the third difference point is represented by a third average value which is an arithmetic mean of the third read voltage and the fourth read voltage, and a third value which is a difference between the fourth number of memory cells and the third number of memory cells, and each of the plurality of control circuits is configured to calculate the second data using a minimum value of an approximate curve passing through the first difference point, the second difference point, and the third difference point.

21. The memory system according to claim 17, wherein each of the plurality of control circuits is configured to execute the data read operation by using first, second, and third read voltages for the cell unit included in the corresponding one of the plurality of semiconductor memory chips to acquire the first data corresponding to the first, second, and third read voltages, respectively, the second read voltage being higher than the first read voltage, the third read voltage being higher than the second read voltage, and the first data including a first number, a second number, and a third number, the first, second, and third numbers indicating the number of memory cells that are turned on by the data read operation using the first, second, and third read voltages, respectively, each of the plurality of control circuits is configured to compute first and second difference points, respectively, based on the first, second, and third read voltages and the first, second, and third numbers of memory cells, the first difference point is represented by a first average value which is an arithmetic mean of the first read voltage and the second read voltage, and a first difference value which is a difference between the second number of memory cells and the first number of memory cells, the second difference point is represented by a second average value which is an arithmetic mean of the second read voltage and the third read voltage, and a second difference value which is a difference between the third number of memory cells and the second number of memory cells, and when a threshold voltage of each of the plurality of memory cells included in the corresponding one of the plurality of semiconductor memory chips is represented on a horizontal axis and the number of memory cells is represented on a vertical axis, the control circuit calculates an intersection of a first diagonal line connecting the second difference point and a first threshold voltage corresponding to the first average value, and a second diagonal line connecting the first difference point and a second threshold voltage corresponding to the second average value, and sets the number of memory cells corresponding to the intersection as the second data.

\* \* \* \* \*